(12) United States Patent
Takeuchi et al.

(10) Patent No.: US 7,141,915 B2
(45) Date of Patent: Nov. 28, 2006

(54) ACTUATOR DEVICE

(75) Inventors: Yukihisa Takeuchi, Nishikamo-gun (JP); Tsutomu Nanataki, Toyoake (JP); Koji Kimura, Nagoya (JP); Natsumi Shimogawa, Nagoya (JP); Takayoshi Akao, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 120 days.

(21) Appl. No.: 10/896,769

(22) Filed: Jul. 22, 2004

(65) Prior Publication Data

(30) Foreign Application Priority Data

Jul. 22, 2003 (JP) ............................. 2003-277887
Jun. 30, 2004 (JP) ............................. 2004-195070

(51) Int. Cl.
  *H01L 41/08* (2006.01)
(52) U.S. Cl. ................................. 310/328; 310/324
(58) Field of Classification Search ................ 310/324, 310/328, 330–332, 366
See application file for complete search history.

(56) References Cited

U.S. PATENT DOCUMENTS

| | | | |
|---|---|---|---|
| 4,742,264 A * | 5/1988 | Ogawa | ..................... 310/332 |
| 5,233,256 A | 8/1993 | Hayashi et al. | |
| 5,266,964 A | 11/1993 | Takahashi et al. | |
| 5,517,076 A | 5/1996 | Takeuchi et al. | |
| 5,545,461 A | 8/1996 | Takeuchi et al. | |
| 5,594,292 A | 1/1997 | Takeuchi et al. | |
| 5,600,197 A | 2/1997 | Takeuchi et al. | |
| 5,634,999 A | 6/1997 | Takeuchi et al. | |
| 5,709,802 A * | 1/1998 | Furuhata et al. | ................ 216/2 |
| 5,733,670 A | 3/1998 | Takeuchi et al. | |
| 5,771,321 A | 6/1998 | Stern | |
| 5,852,337 A * | 12/1998 | Takeuchi et al. | ............ 310/328 |
| 5,862,275 A | 1/1999 | Takeuchi et al. | |
| 5,867,302 A * | 2/1999 | Fleming | ..................... 359/291 |
| 5,953,469 A | 9/1999 | Zhou | |
| 6,028,978 A * | 2/2000 | Takeuchi et al. | ............ 385/147 |
| 6,174,051 B1 | 1/2001 | Sakaida | |
| 6,265,811 B1 | 7/2001 | Takeuchi et al. | |
| 6,291,932 B1 | 9/2001 | Maruyama et al. | |
| 6,347,441 B1 | 2/2002 | Yun et al. | |
| 6,381,381 B1 | 4/2002 | Takeda et al. | |
| 6,452,583 B1 | 9/2002 | Takeuchi et al. | |
| 6,470,115 B1 | 10/2002 | Yonekubo | |

(Continued)

FOREIGN PATENT DOCUMENTS

DE  4202650  8/1992

(Continued)

OTHER PUBLICATIONS

U.S. Appl. No. 10/881,328, filed Jun. 30, 2004, Nanataki et al.

(Continued)

*Primary Examiner*—Mark Budd
(74) *Attorney, Agent, or Firm*—Burr & Brown

(57) ABSTRACT

An actuator device has a drive section including a plurality of actuators arranged in a plane on a substrate, and a single first plate member to which drive forces from the actuators of the drive section are transmitted. A plurality of spacers are disposed between the first plate member and the substrate, forming m cells. Each of the actuators has a cavity, a vibrating section and a fixed section formed on the substrate. The rigidity of the first plate member is greater than the rigidity of the vibrating section of the actuator.

19 Claims, 53 Drawing Sheets

U.S. PATENT DOCUMENTS

| | | | |
|---|---|---|---|
| 6,476,540 B1 * | 11/2002 | Takeuchi et al. | 310/331 |
| 6,565,331 B1 | 5/2003 | Takeuchi et al. | |
| 6,578,245 B1 * | 6/2003 | Chatterjee et al. | 29/25.35 |
| 6,672,714 B1 | 1/2004 | Tanikawa et al. | |
| 6,690,344 B1 | 2/2004 | Takeuchi et al. | |
| 6,700,305 B1 | 3/2004 | Matsuda et al. | |
| 6,919,667 B1 * | 7/2005 | Yamaguchi et al. | 310/324 |
| 2001/0041489 A1 | 11/2001 | Takeuchi et al. | |
| 2002/0140348 A1 | 10/2002 | Takeuchi et al. | |
| 2002/0146330 A1 | 10/2002 | Takeuchi et al. | |
| 2003/0020370 A1 | 1/2003 | Takeuchi et al. | |
| 2003/0063368 A1 | 4/2003 | Takeuchi et al. | |

FOREIGN PATENT DOCUMENTS

| | | |
|---|---|---|
| EP | 1 288 697 A2 | 3/2003 |
| EP | 1 376 710 A1 | 1/2004 |
| EP | 1375916 | 1/2004 |
| JP | 4-245488 | 9/1992 |
| JP | 7-202284 | 8/1995 |
| JP | 9-65669 | 3/1997 |
| JP | 10-58674 | 3/1998 |
| JP | 10-78549 | 3/1998 |
| JP | 2913806 | 4/1999 |
| JP | 11-252333 | 9/1999 |
| JP | 11-261121 | 9/1999 |
| JP | 11-339561 | 12/1999 |
| JP | 2000-314381 | 11/2000 |
| JP | 2001-324961 | 11/2001 |
| JP | 2003-052181 | 2/2003 |
| JP | 2003-074475 | 3/2003 |
| JP | 2003-161896 | 6/2003 |
| WO | 00/52336 | 9/2000 |
| WO | 02/84118 | 10/2002 |
| WO | 02/084751 A1 | 10/2002 |

OTHER PUBLICATIONS

Written Opinon issued in International Application No. PCT/JP2004/009203 (in Japanese) mailed Nov. 2, 2004 and a Partial translation of Written Opinion issued in International Application No. PCT/JP2004/009203.

Written Opinion issued in International Application No. PCT/JP2004/009204 (in Japanese) mailed Nov. 2, 2004 and a Partial translation of Written Opinion issued in International Application No. PCT/JP2004/009204.

* cited by examiner

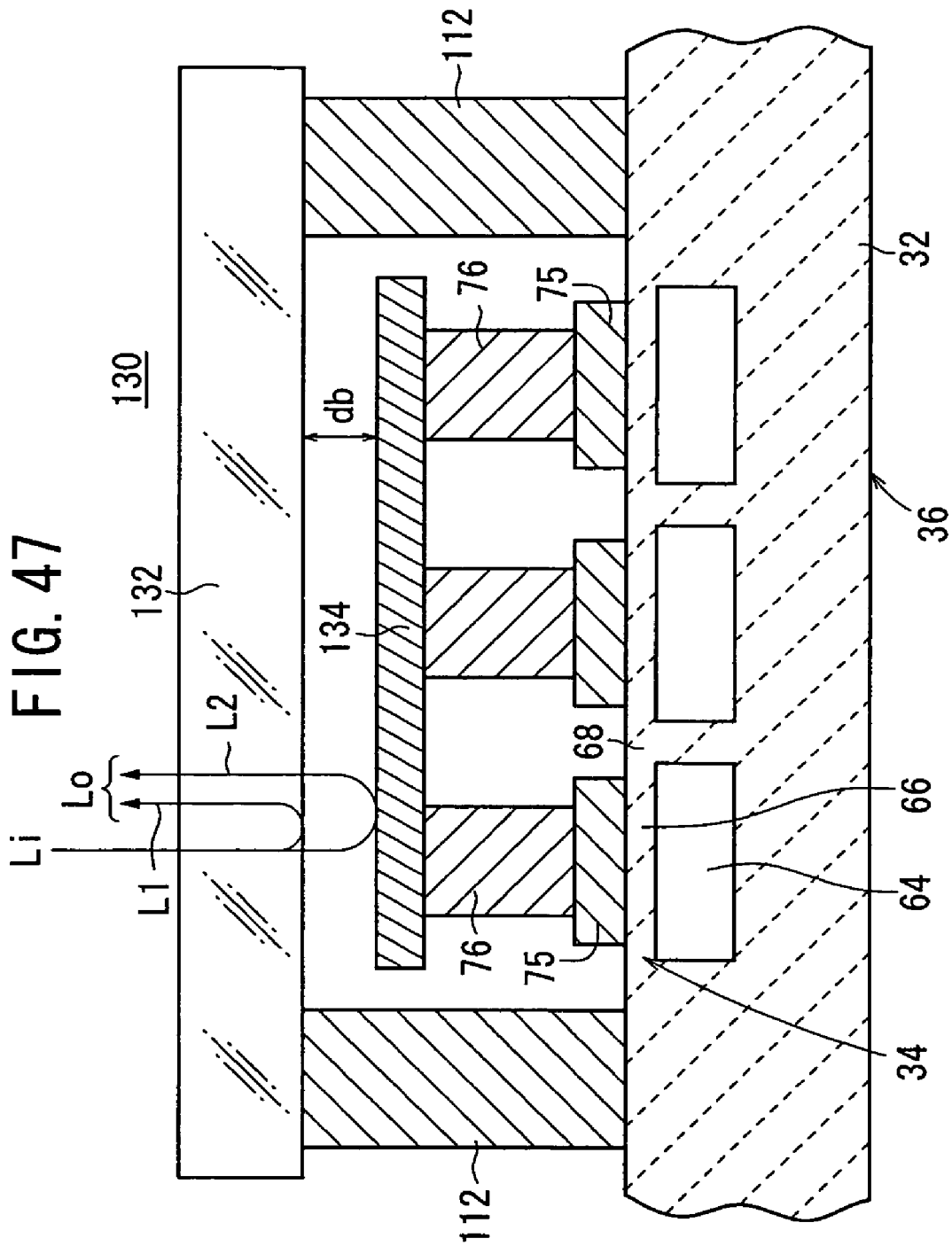

ACTUATOR DEVICE

This application claims the benefit of Japanese Application No. 2003-277887, filed Jul. 22, 2003, and Japanese Application No. 2004-195070, filed Jun. 30, 2004, the entireties of which are incorporated herein by reference.

BACKGROUND OF THE INVENTION

1. Field of the Invention

The present invention relates to an actuator device which is applicable to a display device and which is also applicable to various applications including an optical modulator, a variable capacitor, etc.

2. Description of the Related Art

It is known in the art that an actuator device having a plurality of actuators can be applied to a display device, and can also be applied to various applications including an optical modulator, a variable capacitor, etc. (see Japanese Laid-Open Patent Publication No. 11-339561, for example). With regard to the display device, for example, the applicant of the present application has proposed a novel display device in order to achieve the following advantages:

(1) A clearance (gap) between an optical waveguide plate and a picture element assembly can easily be formed, and can be formed uniformly over all pixels.

(2) The size of the gap can easily be controlled.

(3) The optical waveguide plate can be prevented from sticking to the picture element assembly, and the response speed can effectively be increased.

(4) The contact surface of the picture element assembly (the surface thereof contacting the optical waveguide plate) can smoothly be formed in order to introduce light efficiently into the picture element assembly when the picture element assembly contacts the optical waveguide plate.

(5) The response speed of pixels can be maintained.

(6) A uniform level of luminance can be obtained over all pixels.

(7) The luminance of pixels can be increased.

As shown in FIGS. 52 and 53, a display device 200 has an optical waveguide plate 204 into which light 202 is introduced, an actuator substrate 208 facing one surface of the optical waveguide plate 204 and having as many actuators 206 as the number of pixels, picture element assemblies 210 formed on the actuators 206 of the actuator substrate 208, and spacers 212 disposed between the optical waveguide plate 204 and the actuator substrate 208 in regions other than the picture element assemblies 210 (see, for example, Japanese Laid-Open Patent Publication No. 2003-161896). Light shield layers 218 are interposed between the optical waveguide plate 204 and the spacers 212.

Applications using piezoelectric actuators are disclosed in Japanese Laid-Open Patent Publication No. 11-252333, Japanese Laid-Open Patent Publication No. 2003-52181, Japanese Laid-Open Patent Publication No. 2000-314381, Japanese Laid-Open Patent Publication No. 2003-74475, and WO 02/084751 A1.

In the display device 200, one pixel may be made up of six actuators positioned in two rows and three columns. If one actuator 206 is defective in such a configuration, then a spot corresponding to that actuator 206 is displayed as a black or white dot regardless of an image displayed by the display device 200, tending to cause a disadvantage to increase the image quality.

Specifically, even if one actuator is defective in the conventional actuator device, then since the defective actuator adversely affects the quality of the actuator device, it tends to pose a limitation to increase the yield. Another problem is that the area of a region that is displaced by an actuator, i.e., an effective area, cannot be increased.

SUMMARY OF THE INVENTION

The present invention has been made in view of the above drawbacks. It is an object of the present invention to provide an actuator device which, even when it has a defective actuator, can compensate for the displacement of the defective actuator with a normal actuator, has an increased yield, and has an increased effective area.

Another object of the present invention is to provide an actuator device which, if applied as a display device, offers the following advantages:

(1) Even when the actuator device has a defective actuator, the displacement thereof can be compensated for by a normal actuator, thus eliminating a defective pixel.

(2) The aperture ratio of a pixel can be increased.

(3) One pixel can be turned on and off by the displacement of a plurality of actuators, and a region of maximum displacement in one actuator can be utilized for increased luminance and contrast.

(4) The freedom of a pixel shape can be increased.

An actuator device according to the present invention has a plurality of actuators arranged in a plane, and a plate member to which drive forces from the actuators are transmitted, each of the actuators having a vibrating section and a fixed section.

Drive forces from the actuators arranged in the plane are transmitted the plate member. Since each of the actuators is displaced vertically, the plate member is displaced in a direction substantially perpendicular to its plane.

Even when some of the actuators become defective, their displacement can be compensated for by the normal actuators. Therefore, the yield of the actuator devices is increased. Furthermore, the area of a portion that is displaced by the actuator, i.e., an effective area, can be increased. Particularly, three or more actuators should preferably be joined by the plate member. The probability of a failure is reduced, and the plate member can be controlled in displacement more stably. If the actuators are displaced in a z-axis direction and the plate member has its plane lying in a xy-plane direction, then three or more actuators may be arrayed in the x-axis direction, or two or more actuators may be arrayed in each of the x- and y-axis directions.

The rigidity of the plate member should preferably be greater than the rigidity of the vibrating section. With this arrangement, even when one actuator fails due to cracking or wire breakage, the plate member is displaced when another actuator is displaced, producing forces to displace the vibrating section of the faulty actuator. Consequently, even in the event of a failure of one actuator, the displacement of the entire plate member is not affected thereby, making it possible to compensate for the faulty region.

Since the actuators have the vibrating sections, any faulty actuator can easily be displaced under external forces. Such defect compensation cannot be obtained by a laminated actuator, for example, which does not have the vibrating sections.

The plate member may have concavities and convexities. In this case, the geometrical moment of inertia of the plate member is increased to increase the flexural rigidity of the plate member. Because the rigidity can be increased with a small amount of material, the concavities and the convexities are effective in reducing the weight of the actuator device. Inasmuch as the inertial mass is reduced, the response speed of the actuators is increased. The concavities and the convexities may be provided as grooves, or may be arranged in a matrix or a staggered pattern. The concavities and the convexities may have an X shape, a circular shape, a grid shape, a striped shape, a comb-toothed shape, or the like as viewed in plan, or may have a dimple shape, a saw-toothed shape, a peak shape, a wedge shape, a rectangular shape, or the like, as viewed in cross section. The concavities and the convexities may be formed on both surfaces of the plate member or on one surface of the plate member. The plate member itself may be of a wavy shape.

The actuators and the plate member may be connected to each other by displacement transmitters.

The flexural rigidity of the plate member should preferably be 10 times the flexural rigidity of the vibrating sections or greater. This reduces the amount of flexing of the plate member. In this case, there is obtained a structure which is less susceptible to manufacturing irregularities with respect to the distance between the actuators and the size of the displacement transmitter (if the actuators and the plate member are connected to each other by the displacement transmitter).

The drive forces of the actuators may be produced by a generation source which comprises a piezoelectric element, an electrostatic force, a magnetic force, an electromagnetic force, a spring, a wire, or the like.

If a piezoelectric element is used as the generation source, then it may have a unimorph structure, a bimorph structure, a monomorph structure, a structure in which a piezoelectric actuator is formed on the vibrating section, or a structure in which a piezoelectric actuator is formed on the vibrating section and the fixed section.

If an electrostatic force is used as the generation source, then an electrode may be disposed on a surface of the vibrating section which faces the fixed section and an electrode may be disposed on a surface of the fixed section which faces the vibrating section, and a voltage may be applied between the electrodes to generate an electrostatic force which displaces the vibrating section. Electrodes may be formed on the surface of the vibrating section, or an insulator may be interposed between the different electrodes to prevent them from contacting each other and being short-circuited, or the surfaces of the electrodes may be covered with an insulator.

In the process of displacing the actuators, it is preferable for the distance between the vibrating sections and the plate member to remain substantially unchanged. For example, if the displacement transmitter is interposed between the vibrating sections and the plate member, then it is preferable that the thickness (height) of the displacement transmitter be not essentially changed by the displacement of the actuators (not subject to compressive deformation, tensile deformation, and buckling deformation). In this case, compressive deformation and tensile deformation can be reduced by adding a filler to the displacement transmitter.

In the above arrangement, the actuators should preferably have portions connected to the displacement transmitter and having a width smaller than the width of the vibrating section. The displacement of the vibrating section and forces produced thereby can reliably be transmitted to the plate member by the displacement transmitter. In this case, it is preferable that the displacement transmitter does not overlap the fixed section so as not to obstruct the displacement of the displacement transmitter, and it is preferable that the displacement transmitter be not too small with respect to the vibrating section so that the vibrating section and the first plate member are reliably fixed to each other. Furthermore, it is preferable for the displacement transmitter to connect the plate member and the vibrating section at a position including a portion of the vibrating section where the displacement is the greatest. As the displacement and generated forces differ depending on the location of the vibrating section, even if the joint between the vibrating section and the displacement transmitter does not include a portion of the vibrating section which causes the largest displacement, optimum values can be obtained from generated forces and a required amount of displacement. Specifically, the width of the displacement transmitter should be in the range from 5% to 99%, or preferably in the range from 30% to 90%, of the width of the vibrating section. In terms of areas, the cross-sectional area of the displacement transmitter should be in the range from 0.5% to 99%, or preferably in the range from 10% to 90%, of the cross-sectional area of the vibrating section. The ratio of the height to width of the displacement transmitter, i.e., the aspect ratio of the displacement transmitter, should be smaller than 1, or preferably smaller than 0.2

If the rigidity of the vibrating section is greater than the rigidity of the plate member, then the plate member tends to flex without displacing the vibrating section of a faulty actuator, and the plate member includes a portion which is displaced and a portion which is not displaced. Therefore, such a rigidity setting is not preferable.

The vibrating sections may be of a convex shape which is convex toward the plate member or concave toward the plate member. The vibrating sections of such a shape are more effective to increase the response of the actuators than if the vibrating sections are not of a convex shape (e.g., they are flat), and allow adjacent actuators to compensate for a displacement even if an actuator fails.

The reasons for the above advantages are as follows: In the presence of the plate member, the vibrating sections need to displace a large mass, and undergoes a larger load than if it were not for the plate member. Since the vibrating sections are of a convex shape, their drive forces become stronger to keep response at a higher level. The rigidity is increased to sufficiently bear the mass of the plate member that is applied to the vibrating sections.

In the event of a failure of an actuator, the first plate member driven by the adjacent actuators displaces the vibrating section. At this time, it is desirable that reactive forces from the vibrating section be small. The convex shape is considered to have such characteristics that it increases drive forces but prevents reactive forces from increasing when displaced by the plate member.

The convex shape of the vibrating section may be formed in the longitudinal direction of a beam. Alternatively, the convex shape of the vibrating section may be formed in a direction parallel to the joint between the vibrating section and the fixed section. Particularly, the vibrating section should preferably be of a wing shape (W shape) in the longitudinal direction of the beam. If the vibrating section has a wing shape, the width of the convex shape, i.e., the distance between valleys, should preferably be ⅓ of the beam length or greater. If the vibrating section is convex toward the plate member, then the vertex of the convex shape should preferably project toward the plate member beyond the height of the fixed section.

If the vibrating section is of the convex shape, then the vibrating sections should preferably be of an arch shape or a wavy shape. The structure in which the vibrating sections are of a convex shape is particularly preferably used in an arrangement wherein the vibrating sections have both ends connected to the fixed section and an arrangement wherein the peripheral region of the vibrating sections is connected to the fixed section. If cavities are present below the vibrating sections, then the cavities may be filled with a liquid. In such a case, the peripheral region of the vibrating sections needs to be connected to the fixed section to prevent the liquid from leaking.

In the event of a failure of an actuator, the plate member is displaced by a normal actuator, and the vibrating section of the faulty actuator is depressed by the displacement transmitter. If the vibrating section whose peripheral region is connected to the fixed section is of a flat cross-sectional shape, then forces tending to obstruct the displacement are liable to increase under the tension of the vibrating section which is kept taut. This is because the vibrating section is extended in its longitudinal direction for producing the above displacement. If the vibrating section is of an arch or wavy shape, then since the vibrating section itself has a larger length than the minimum distance between its joints to the fixed section, forces tending to obstruct the displacement are relatively weak when the vibrating section undergoes forces from the displacement transmitter.

If the vibrating section is of an arch shape, then when the actuator is displaced under drive forces in a direction away from the plate member, the vibrating section should preferably have an arch shape that is convex toward the plate member. When the actuator is displaced under drive forces in a direction toward the plate member, the vibrating section should preferably have an arch shape that is concave toward the plate member. If the actuator in which the vibrating section is convex toward the plate member is displaced toward the plate member, then the length of the vibrating section is increased and forces tending to obstruct the displacement thereof are increased. When the actuator in which the vibrating section is convex toward the plate member undergoes forces applied in a direction away from the plate member through the displacement transmitter, the actuator is displaced as the vibrating section flexes.

With the vibrating section fixed at its both ends or peripheral region to the fixed section, since the rigidity of the vibrating section is not too high, the actuator device is highly effective to perform compensation for a failure. The degree of freedom for design is also increased. The vibrating section may also be fixed at one end to the fixed section.

If the vibrating section is of an arch shape or a wavy shape, the height (or depth) of the convexity (or concavity) thereof toward the plate member should preferably be greater than the height (or depth) corresponding to the thickness of the vibrating section.

For keeping the responsiveness of the actuator, the rigidity of the vibrating section needs to be not too small and should naturally be selected in view of the thickness, width, beam length, shape, material, etc. of the vibrating section. The convexity or concavity of the convex shape does not have to be formed in the central region of the vibrating section.

Another actuator device according to the present invention has a plurality of cells arranged in a plane, each of the cells having a plurality of actuators arranged in a plane and a plate member to which drive forces from the actuators are transmitted, each of the actuators having a vibrating section and a fixed section. The cells may have the same size (the cells serve as unit cells) or may have different sizes. In this case, the rigidity of the plate member should preferably be greater than the rigidity of the vibrating section, as with the invention described above.

In the present invention, the plate members of the cells may be connected to each other. In this case, the plate members should preferably be connected to each other by joints, the rigidity of all or some of the joints being smaller than the rigidity of the plate member. The rigidity of all or some of the joints may be made smaller than the rigidity of the plate member by using a material of less rigidity for the joints than the plate member, or making the joints thinner than the plate member or making the width of the joints smaller than the width of the plate member if the joints and the plate member are made of the same material.

The above actuator device may further have gap forming members for forming gaps between the fixed sections and the plate members in the actuators, the joints interconnecting the plate members and the fixed sections being joined to each other by the gap forming members. With this arrangement, the distance between the plate member in the cells and the fixed sections can be established accurately and reliably.

The gap forming members that are present between the joints and the plate member offer the following advantages:

If the fixed section has different heights depending on the location, e.g., if the substrate has undulations (which are often unavoidable in the manufacturing process) when a plurality of actuators are to be formed on one substrate, the distance between the plate member disposed above the substrate and the fixed section varies depending on the location, possibly resulting in direct contact between the actuators and the plate member. In this case, the plate member is partly strained, tending to fail to operate the plate member as desired with the actuators.

The gap forming members that are present on the fixed section do not give rise to the above problem even if the substrate has undulations because the distance between the plate member and the fixed section is maintained by the gap forming members.

The actuators that are connected to the plate member have their displacement characteristics affected thereby. As the distance between the plate member and the fixed section is determined by the gap forming members, the degree of a change in the displacement characteristics is kept constant irrespective of the location, and the gap forming members are highly effective to prevent the displacement characteristics from varying. For example, since the thickness of the displacement transmitters is uniformized, the effect thereof on the displacement characteristics of the actuators is uniformized.

In the absence of the gap forming members, when the actuators and the plate member are partly displaced considerably closely to each other, the displacement transmitters for connecting the actuators and the plate member tend to spread more greatly than the size of the actuators, possibly impairing operation of the actuators. This drawback can be avoided by adding the gap forming members.

If the height of the gap forming members is greater than necessary, then shortcomings such as characteristic changes are liable to occur due to expansion or shrinkage of the gap forming members themselves or an increase in the load on the actuators. The gap forming members can sufficiently be made effective by setting the gap forming members to an appropriate height.

The actuator device may further have a second plate member, the second plate member having a plate surface facing a plate surface of the plate member (hereinafter referred to as first plate member). If it is assumed that the first plate member and the second plate member are disposed closely facing each other, then the gap forming members should preferably be disposed and connected such that the interval between the second plate member and the first plate member becomes a predetermined distance. In this case, the gap forming members should preferably be disposed and connected between the second plate member and the fixed section. If the joints of the first plate member and the fixed section are connected by the gap forming members, then the joints of the first plate member and the second plate member should preferably be connected by other gap forming members.

The gap forming members should preferably be arranged such that they are associated with the respective cells. This is because the gap forming members can firmly be fixed, and the gap distance can accurately and reliably be established. If the effective areas of the cells are reduced due to the gap forming members associated with the respective cells, then for the purpose of increasing the effective area efficiency, a plurality of successive cells may be grouped into one large cell, and gap forming members may be associated with each large cell. Gap forming members may be provided on only the outer circumference of the actuator device.

The gap forming members may be formed in a grid pattern so as to surround cells. Alternatively, the gap forming members may be formed in a striped pattern along confronting sides of cells. The gap forming members of a columnar shape and may be formed on the four corners of the four sides of the cells.

If the actuator device according to the present invention is constructed as a display device, i.e., if the second plate member comprises an optical waveguide plate into which light from a light source is introduced, and picture element assemblies are disposed on a surface of the plate member which faces the optical waveguide plate, wherein the actuator device serves as a display device for controlling light leaking from the optical waveguide plate with the picture element assemblies as they are brought into and out of contact with the optical waveguide plate, then the actuator device offers the following advantages:

(1) Even when the actuator device has a defective actuator, the displacement thereof can be compensated for by a normal actuator, thus eliminating a defective pixel.

(2) The aperture ratio of a pixel can be increased.

(3) One pixel can be turned on and off by the displacement of a plurality of actuators, and a region of maximum displacement in one actuator can be utilized for increased luminance and contrast.

(4) The freedom of a pixel shape can be increased.

If a fixed electrode of a variable capacitor is disposed on the second plate member and a movable electrode of the variable capacitor is disposed on the plate member, then the variable capacitor may have its capacitance variable as the movable electrode is movable toward and/or away from the fixed electrode when the actuators are operated. The second plate member itself may serve as the fixed electrode of the variable capacitor or the plate member itself may serve as the movable electrode of the variable capacitor.

If the second plate member comprises a transparent plate, and the plate member has a light reflecting surface in a region facing the second plate member, then the actuator device can serve as an interference optical modulator. Specifically, when input light is applied through the second plate member (transparent plate) to the plate member, light (first reflected light) reflected by the boundary between the reverse side of the transparent plate (which faces the plate member) and light (second reflected light) reflected by a light reflecting surface are emitted as output light. The first reflected light and the second reflected light interfere with each other, and the spectral distribution of the output light is adjusted by the displacement of the plate member and the second plate member. The actuator device thus functions as an interference optical modulator. The portion of the plate member which faces the second plate member may be turned into the light reflecting surface by constructing the surface of the plate member which faces the second plate member as a mirror surface, forming a light reflecting film on the region of the plate member which faces the second plate member, or forming a light reflecting film on that region with a base layer interposed therebetween. In order to prevent unwanted reflections, a layer such as a anti-reflection film or the like may be provided on both surfaces or one surface of the transparent plate.

As described above, with the actuator device according to the present invention, even when some of the actuators become defective, their displacement can be compensated for by the normal actuators. Therefore, the yield of the actuator devices is increased.

The actuator device according to the present invention as applied to a display device offers the following advantages:

(1) Even when the actuator device has a defective actuator, the displacement thereof can be compensated for by a normal actuator, thus eliminating a defective pixel.

(2) The aperture ratio of a pixel can be increased.

(3) One pixel can be turned on and off by the displacement of a plurality of actuators, and a region of maximum displacement in one actuator can be utilized for increased luminance and contrast.

(4) The freedom of a pixel shape can be increased.

The above and other objects, features, and advantages of the present invention will become more apparent from the following description of preferred embodiments in conjunction with the accompanying drawings.

BRIEF DESCRIPTION OF THE DRAWINGS

FIG. 47 is a view showing an interference optical modulator according to a specific example;

DESCRIPTION OF THE PREFERRED EMBODIMENTS

Embodiments of actuator devices according to the present invention will be described below with reference to FIGS. 1 through 51.

Figure 1:
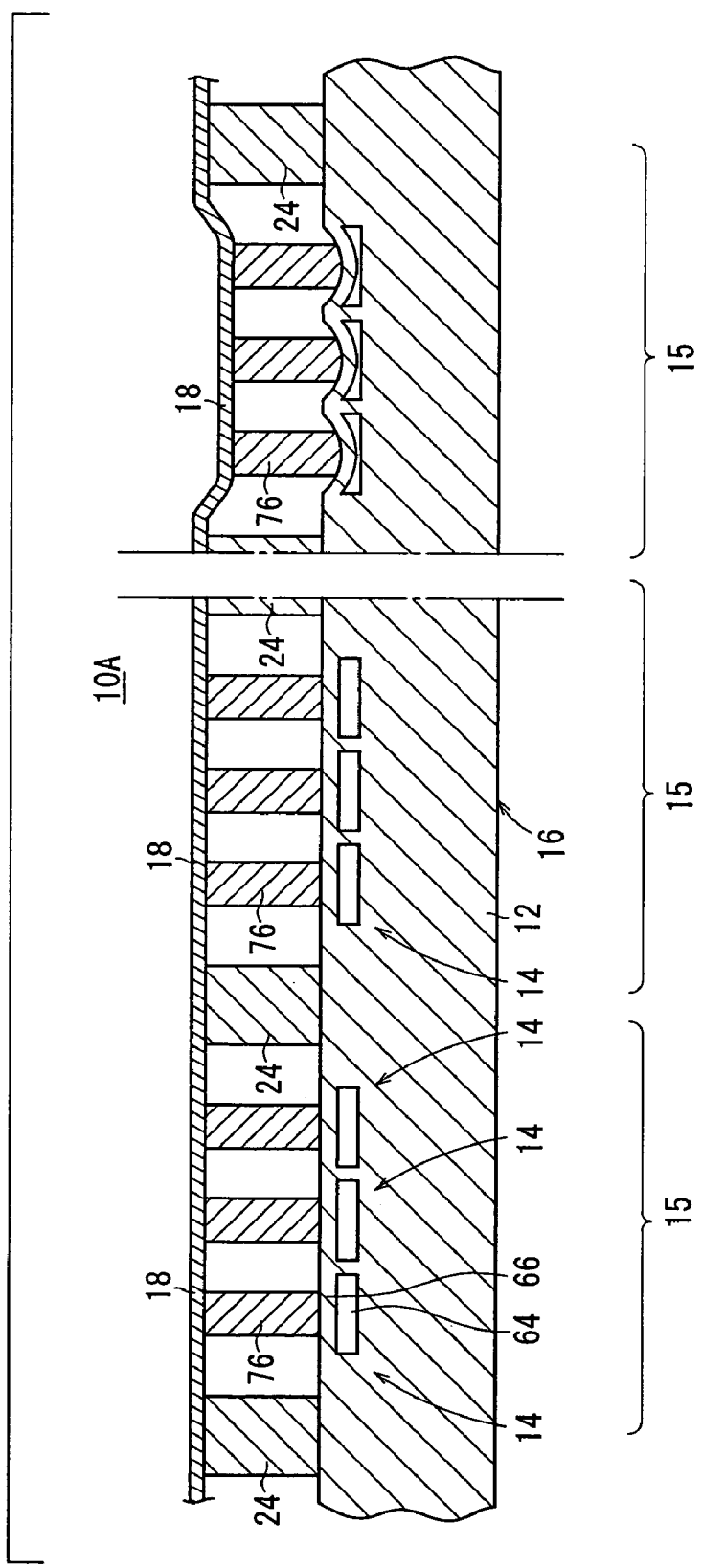
FIG. 1 is a view showing an actuator device according to a first embodiment.

As shown in FIG. 1, an actuator device 10A according to a first embodiment has a drive section 16 including a plurality of actuators 14 arranged in a plane on a substrate 12, and a first plate member 18 to which drive forces from the actuators 14 of the drive section 16 are transmitted.

A plurality of spacers 24 are disposed between the first plate member 18 and the substrate 12, forming m cells 15. N actuators 14 are assigned to each of the cells 15. Each of the cells 15 may have the same size (the cells serve as unit cells) or may have different sizes.

Each of the actuators 14 comprises a cavity 64, a vibrating section 66, and a fixed section 68 formed in the substrate 12. Of the substrate 32, a portion where the cavity 64 is defined is thin, and the other portion is thick. The thin portion is of a structure easily vibratable under external stresses and functions as the vibrating section 66. The portion other than the cavity 64 is thick and functions as the fixed section 68 supporting the vibrating section 66. A displacement transmitter 76 for transmitting displacement of the actuator 14 to the first plate member 18 is interposed between the actuator 14 and the first plate member 18.

One structural example of the actuator 14 will be described below with reference to FIG. 2. The actuator 14 has, in addition to the vibrating section 66 and the fixed section 68, an actuator body 75 comprising a piezoelectric/electrostrictive layer 72 directly formed on the vibrating section 66, and a pair of electrodes 74a, 74b formed on upper and lower surfaces of the piezoelectric/electrostrictive layer 72.

Figure 2:
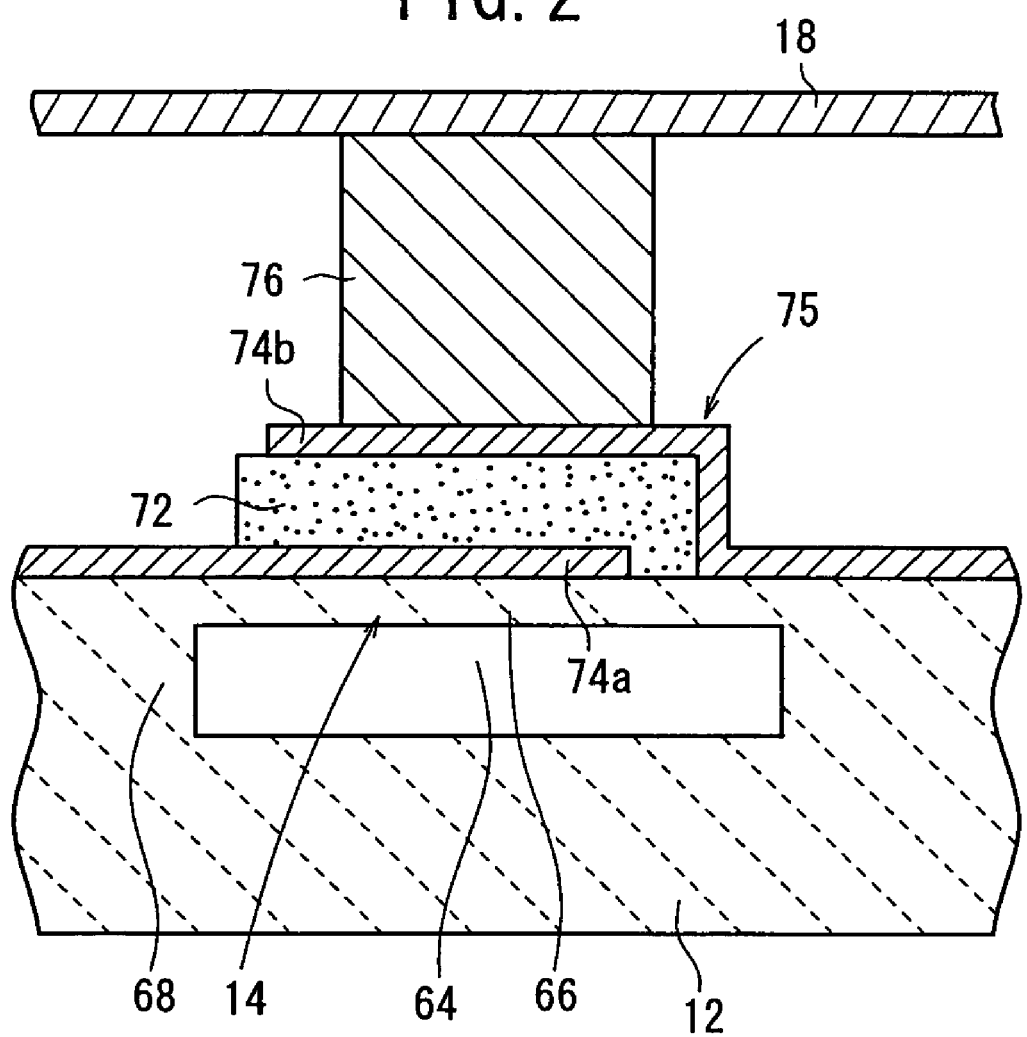
FIG. 2 is a cross-sectional view showing a structural example of an actuator.

The electrodes 74a, 74b may be formed on the upper and lower sides of the piezoelectric/electrostrictive layer 72, as shown in FIG. 2, or on only one side thereof, or on only the upper side of the piezoelectric/electrostrictive layer 72.

If the electrodes 74a, 74b are formed on only the upper side of the piezoelectric/electrostrictive layer 72, then the electrodes 74a, 74b may be of a planar shape having a number of comb teeth complementarily facing each other, or may be of a swirling or branched shape as disclosed in Japanese Laid-Open Patent Publication No. 10-78549 and Japanese Laid-Open Patent Publication No. 2001-324961.

In FIGS. 1, 3 through 34, the actuator body 75 of the actuator 14 is omitted from illustration for the sake of brevity.

In the actuator device 10A according to the first embodiment, drive forces from the actuators 14 arranged in a plane are transmitted to the first plate member 18. Since each of the actuators 14 is displaced vertically, the first plate member 18 is displaced in a direction substantially perpendicular to its plane.

The drive forces of the actuators 14 may be produced by a generation source which comprises a piezoelectric element, an electrostatic force, a magnetic force, an electromagnetic force, a spring, a wire, or the like.

If a piezoelectric element is used as the generation source, then it may have a unimorph structure, a bimorph structure, a monomorph structure, a structure in which a piezoelectric actuator is formed on the vibrating section 66, or a structure in which a piezoelectric actuator is formed on the vibrating section 66 and the fixed section 68.

Figure 9:
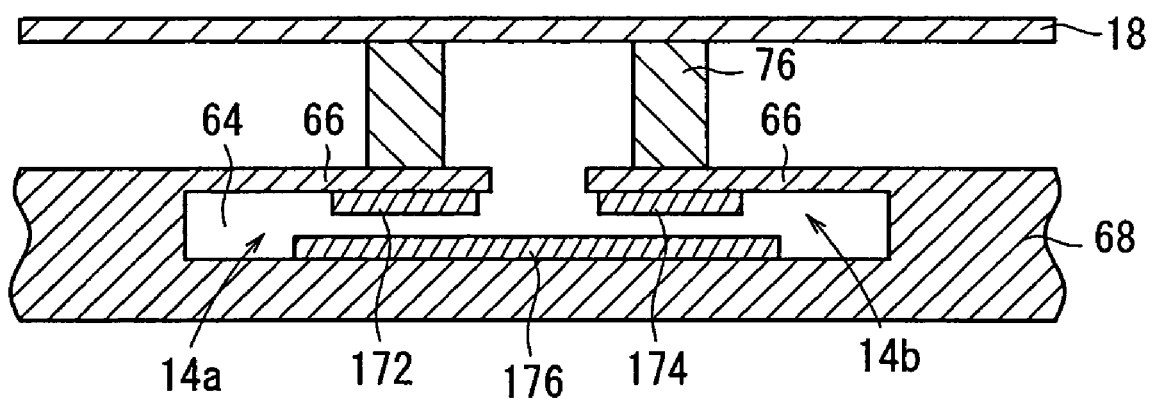
FIG. 9 is a view showing a structure which employs electrostatic forces.

If an electrostatic force is used as the generation source, then an electrode may be disposed on a surface of the vibrating section 66 which faces the fixed section 68 and an electrode may be disposed on a surface of the fixed section 68 which faces the vibrating section 66, and a voltage may be applied between the electrodes to generate an electrostatic force which displaces the vibrating section 66 (see FIG. 9). Electrodes may be formed on the surface of the vibrating section 66, or an insulator may be interposed between the different electrodes to prevent them from contacting each other and being short-circuited, or the surfaces of the electrodes may be covered with an insulator.

Figure 3:
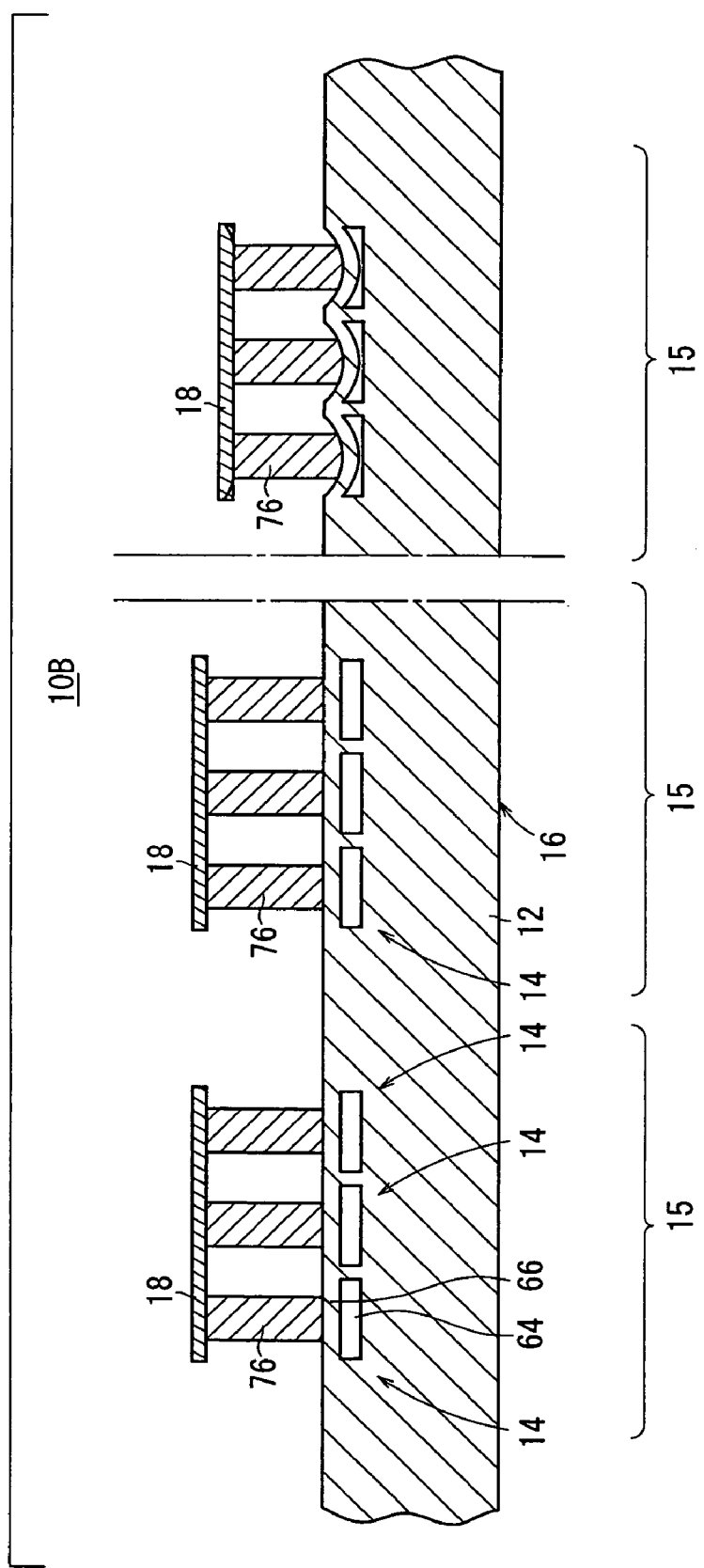
FIG. 3 is a view showing an actuator device according to a second embodiment.

As shown in FIG. 3, an actuator device 10B according to a second embodiment is of substantially the same structure as the actuator device 10A according to the first embodiment, but differs therefrom in that it has separate first plate members 18 in alignment with the respective m cells 15.

Preferred forms of the actuator devices 10A, 10B according to the first and second embodiments will be described below with reference to FIGS. 4 through 24.

The first plate member 18 should preferably have a rigidity greater than the rigidity of the vibrating sections 66 of the actuators 14.

Figure 4:
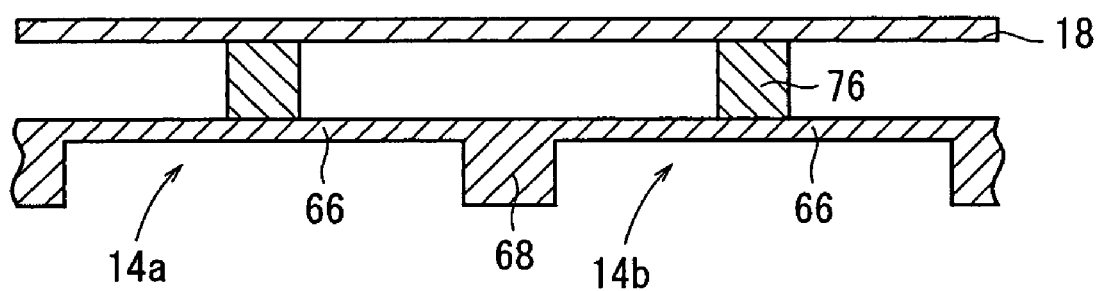
FIG. 4 is a view showing a preferred form of the actuator devices according to the first and second embodiments.

This feature will be described below with reference to FIGS. 4 through 6. FIG. 4 shows a structure in which a single first plate member 18 is connected to two actuators (a first actuator 14a and a second actuator 14b) by respective displacement transmitters 76. As shown in FIG. 6, holes 170 may be defined in corresponding portions of the fixed section 68 between the displacement transmitters 76 of adjacent cells 15.

Figure 5:
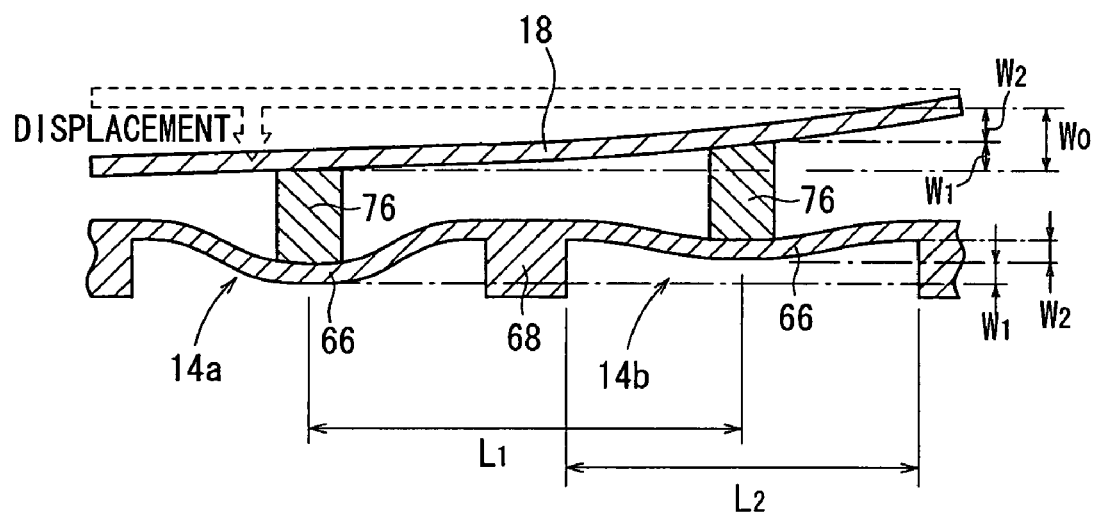
FIG. 5 is a view illustrative of the manner in which a displacement is compensated for when a second actuator of first and second actuators fails.
Figure 6:
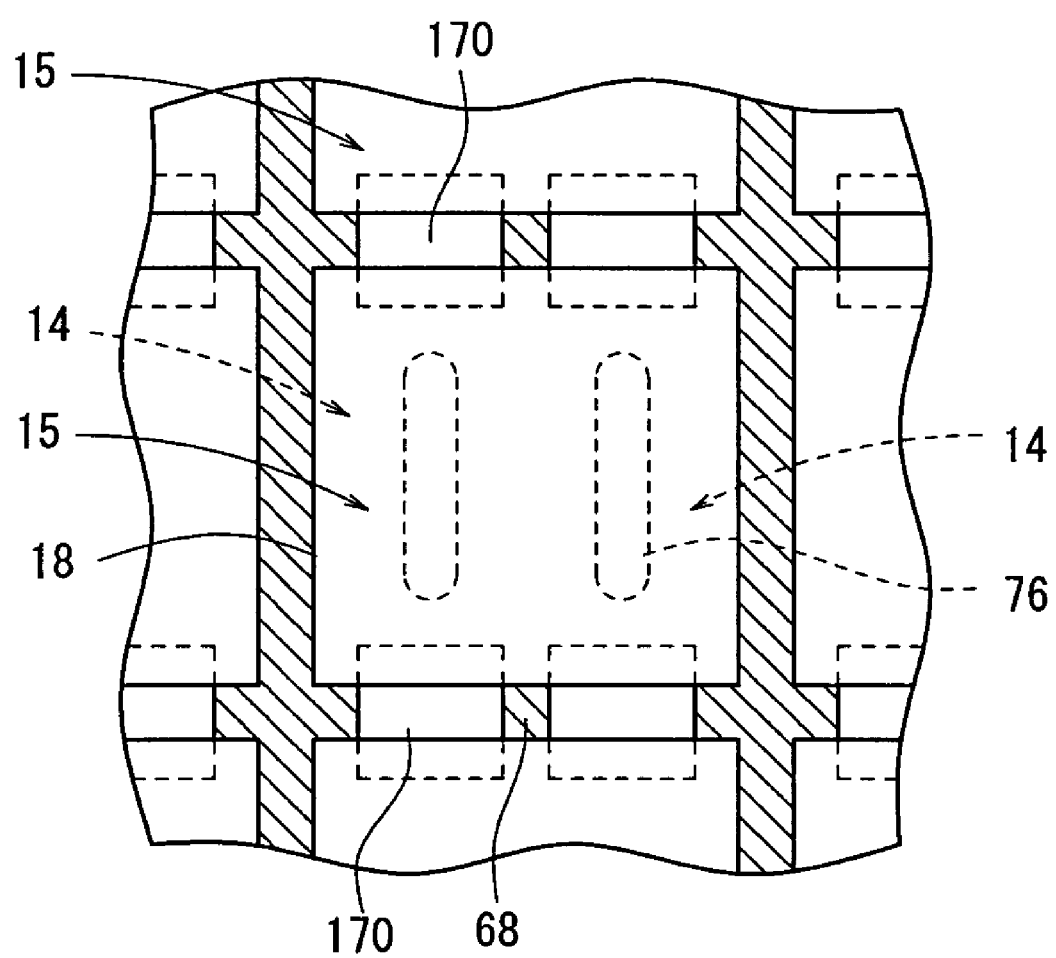
FIG. 6 is a plan view showing an example of a structure for reducing the flexural rigidity of a vibrating section.

FIG. 5 shows a state in which the second actuator 14b fails and the first actuator 14a is displaced to displace the first plate member 18 downwardly. Specifically, when the first actuator 14a is displaced downwardly by a distance $w_0$, the first plate member 18 tends to lower the second actuator 14b downwardly, but the second actuator 14b moves back a distance $w_1$ due to a reactive force from the vibrating section 66 of the second actuator 14b. As a result, the first plate member 18 flexes the distance $w_1$, and the vibrating section 66 of the second actuator 14b flexes a distance $w_2 = w_0 - w_1$.

For simplified calculations, it is assumed that the centers of the vibrating sections 66 of the actuators 14a, 14b an the centers of the displacement transmitters 76 are aligned with each other, and concentrated loads are applied to the centers of the vibrating sections 66, and that displacements of the displacement transmitters 76 that are caused by such concentrated loads can be neglected.

As shown in FIG. 5, if it is assumed that the distance between the displacement transmitters 76 is represented by $L_1$, the width of the vibrating section 66 of the second actuator 14b by $L_2$, the flexural rigidity of the first plate member 18 by $E_1 I_1$, and the flexural rigidity of the vibrating sections 66 by $E_2 I_2$, then since the force (P) at the center of the vibrating section 66 of the second actuator 14b is in equilibrium, the following equations are satisfied:

$$w_1 = PL_1^3/(3E_1 I_1) \qquad (1) \text{ cantilevered}$$

$$w_2 = PL_2^3/(48 E_2 I_2) \qquad (2) \text{ supported at both ends}$$

The ratio of $w_1$, $w_2$ is given as:

$$w_1/w_2 = 16 \times (L_1/L_2)^3 \times (E_2 I_2 / E_1 I_1) \qquad (3)$$

As the ratio $w_1/w_2$ is smaller, the displacement of the faulty second actuator 14b can be better compensated for. That is, as the flexural rigidity $E_1 I_1$ of the first plate member 18 is greater than the flexural rigidity $E_2 I_2$ of the vibrating sections 66 of the first and second actuators 14a, 14b, the ratio $w_1/w_2$ is smaller, resulting in a greater ability to compensate for the displacement of the second actuator 14b.

Figure 7:
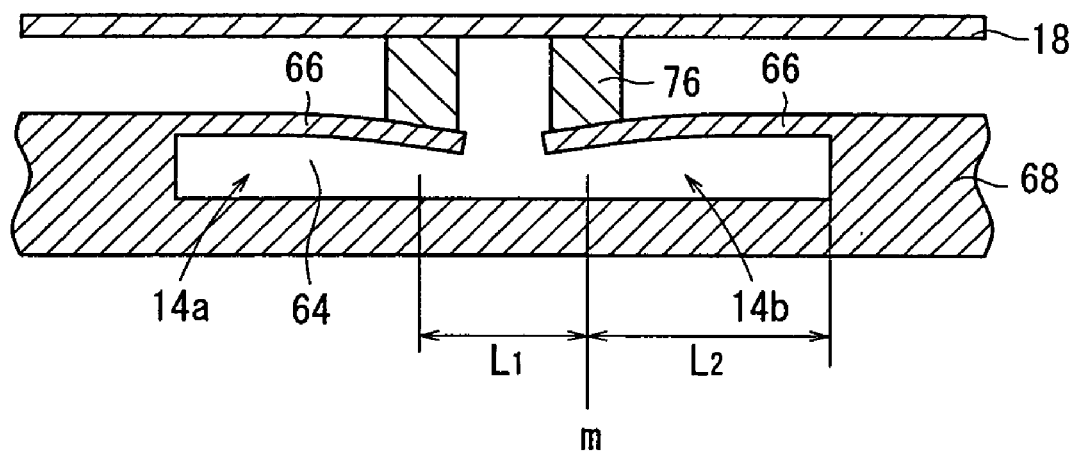
FIG. 7 is a plan view showing another example of a structure for reducing the flexural rigidity of a vibrating section.
Figure 8:
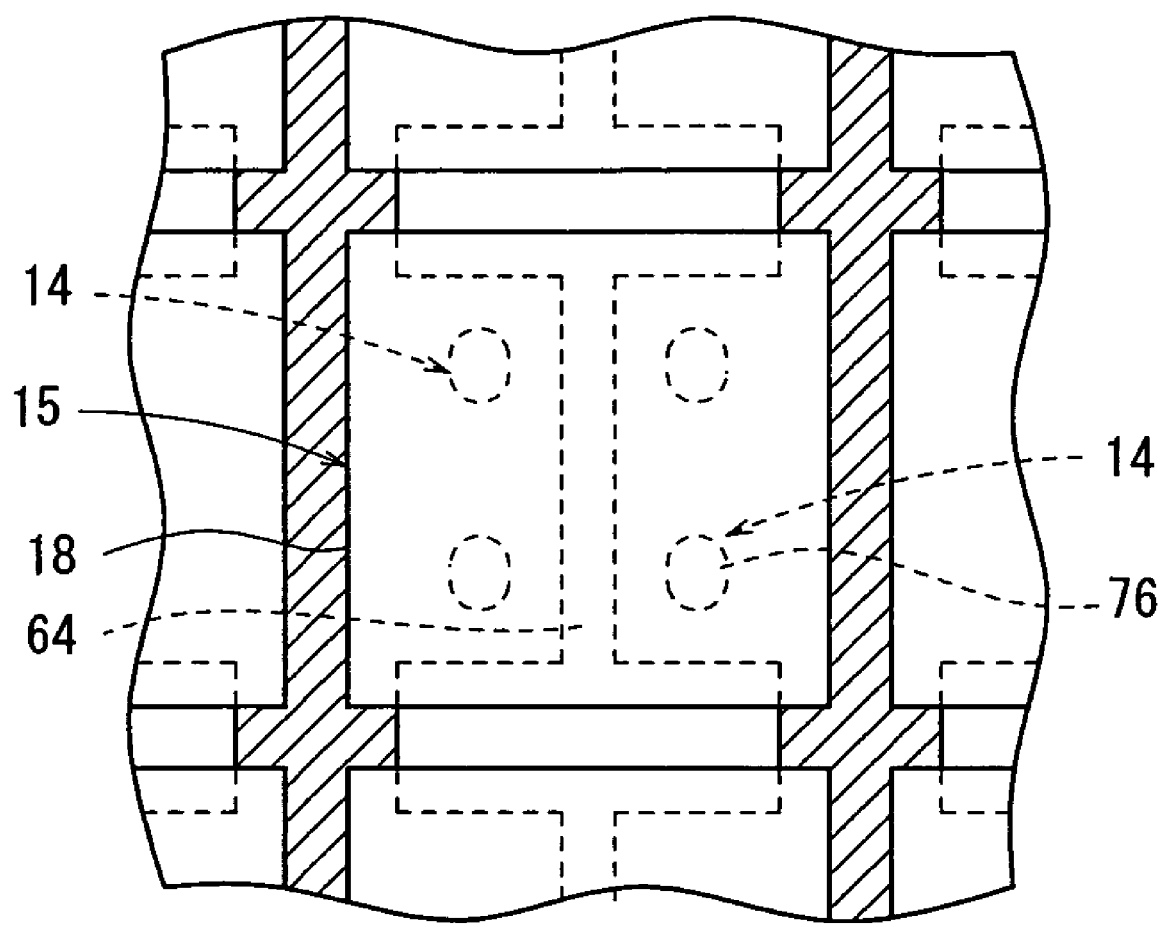
FIG. 8 is a plan view of the structure shown in FIG. 7.

As shown in FIGS. 7 and 8, the vibrating sections 66 may extend in a cantilevered fashion from the fixed section 68 into the cavity 64. In view of the concentrated load at the center (m) of the displacement transmitter 76 of the second actuator 14b, $$w_1 = PL_1^3/(3E_1 I_1) \qquad (4) \text{ cantilevered}$$

$$w_2 = PL_2^3/(3E_2 I_2) \qquad (5) \text{ cantilevered}$$

The ratio of $w_1$, $w_2$ is given as:

$$w_1/w_2 = (L_1/L_2)^3 \times (E_2 I_2 / E_1 I_1) \qquad (6)$$

Since the structure shown in FIGS. 7 and 8 is capable of reducing $L_1/L_2$, it is advantageous in that it can reduce the ratio $w_1/w_2$.

If the structure shown in FIGS. 7 and 8 is employed, then as shown in FIG. 9, for example, an electrode 172 is formed on the lower surface of the vibrating section 66 of the first actuator 14a, an electrode 174 is formed on the lower surface of the vibrating section 66 of the second actuator 14b, and an electrode 176 facing the electrode 172 and the electrode 174 is formed on the bottom of the cavity 64, so that the first and second actuators 14a, 14b can be displaced under electrostatic forces. Specifically, in the event of a failure of the second actuator 14b, a voltage is applied between the electrode 172 and the electrode 176 to displace the first actuator 14a downwardly, causing the first plate member 18 and the second actuator 14b to be displaced downwardly.

Figure 10:
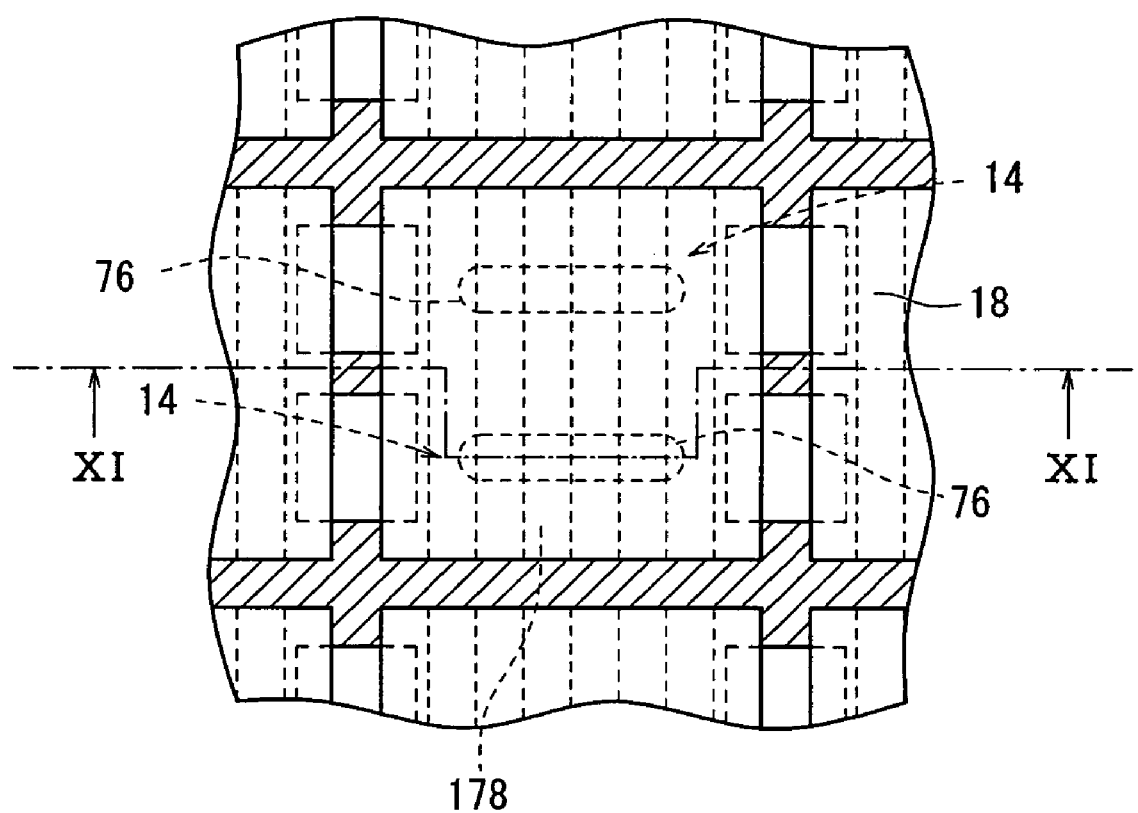
FIG. 10 is a plan view of an example of a structure for increasing the flexural rigidity of a first plate member.
Figure 11:
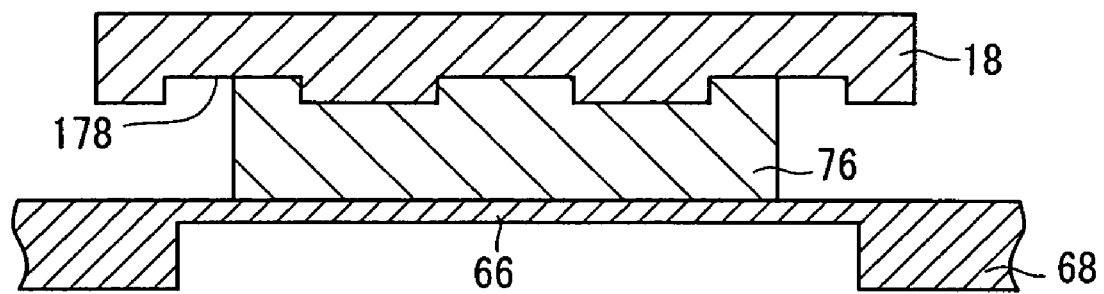
FIG. 11 is a cross-sectional view taken along line XI—XI of FIG. 10.

As shown in FIGS. 10 and 11, the flexural rigidity of the first plate member 18 may be increased by providing a plurality of grooves 178 in the lower surface of the first plate member 18. The grooves 178 are formed (extend) in a direction in which the actuators 14 are arrayed. The grooves 178 have a depth which is 10% or more, preferably 30% or more, of the thickness of the first plate member 18. With this structure, the geometrical moment of inertia of the first plate member 18 is increased to increase the flexural rigidity of the first plate member 18.

Figure 12:
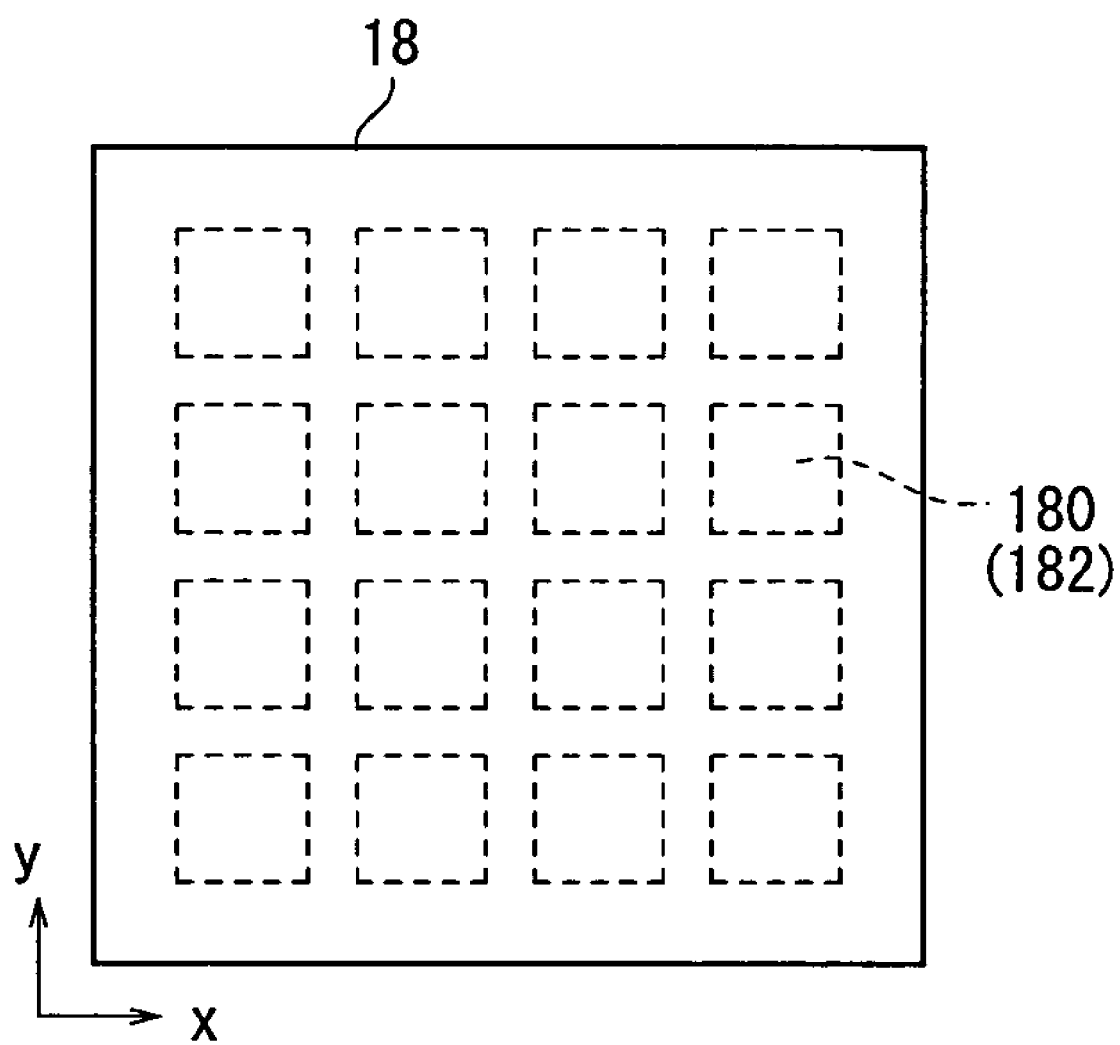
FIG. 12 is a plan view of another example of a structure for increasing the flexural rigidity of a first plate member.

As shown in FIG. 12, the flexural rigidity of the first plate member 18 may also be increased by providing a matrix or a staggered pattern of concavities 180 or convexities 182. If the actuators 14 are displaced in a z-axis direction and the first plate member 18 has its plane lying in a xy-plane direction, then the above arrangement is suitable for increasing the flexural rigidity of the first plate member 18 in the case where two or more actuators 14 are arrayed in each of x- and y-axis directions. The structure shown in FIG. 12 is effective in increasing geometrical moments of inertia in the x- and y-axis directions, thus increasing the flexural rigidity in all directions. The depth of the concavities 180 and the height of the convexities 182 are 10% or more, or preferably 30% or more, of the thickness of the first plate member 18. The concavities 180 and the convexities 182 may have an X shape, a circular shape, a grid shape, a striped shape, a comb-toothed shape, or the like as viewed in plan, or may have a dimple shape, a saw-toothed shape, a peak shape, a wedge shape, a rectangular shape, or the like, as viewed in cross section. The concavities 180 and the convexities 182 may be formed on both surfaces of the first plate member 18 or on one surface of the first plate member 18. The first plate member 18 itself may be of a wavy shape.

The flexural rigidity of the first plate member 18 may be made greater than the flexural rigidity of the vibrating sections 66 in terms of material and thickness. For example, if the vibrating sections 66 are made of zirconium oxide, then the Young's modulus thereof is 245.2 GPa, and if the first plate member 18 is made of stainless steel (e.g., SUS304), then the Young's modulus thereof is 193.0 GPa. If the cross section has a rectangular shape, then the geometrical moment of inertia is proportional to the cube of the thickness. Therefore, if the thickness of the vibrating sections 66 is 10 µm, for example, and the thickness of the first plate member 18 is 50 µm, for example, then the ratio of the flexural rigidities of the first plate member 18 and the vibrating sections 66 is $193.0 \times 50^3/245.2 \times 10^3 = 98.3$. Therefore, the flexural rigidity of the first plate member 18 is greater than the flexural rigidity of the vibrating sections 66.

According to another preferred form, the width of a portion of the actuator 14 which is joined to the displacement transmitter 76 is smaller than the width of the vibrating section 66. Specific structural examples of this form are shown in FIG. 13 or 14, for example.

Figure 13:
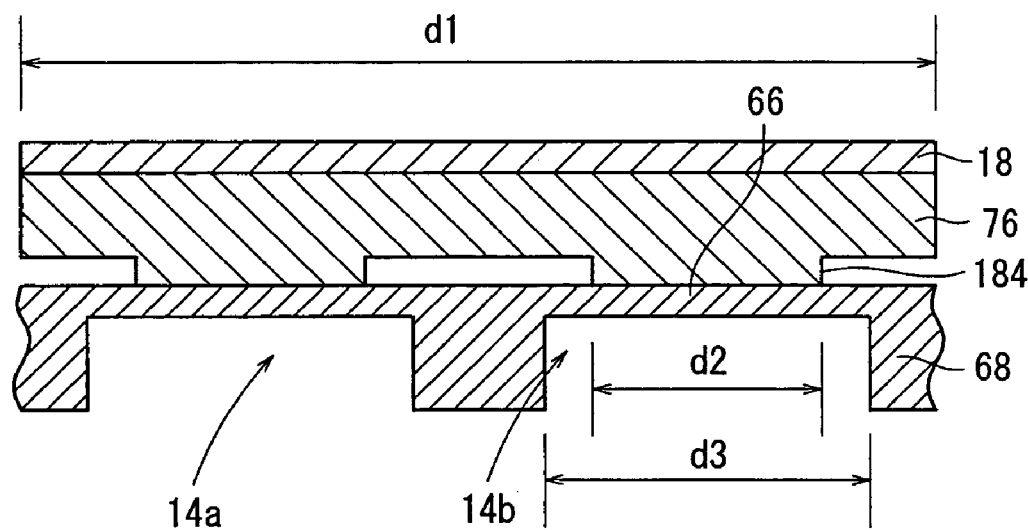
FIG. 13 is a cross-sectional view showing an example of a structure in which the width of a portion of an actuator which is connected to a displacement transmitter is smaller than the width of a vibrating section.

In FIG. 13, the displacement transmitter 76 is formed continuously over at least two actuators 14a, 14b, and has a substantially flat upper surface and a lower surface having convexities 184 aligned respectively with the actuators 14a, 14b. In a cross section along the center of at least two actuators 14a, 14b, a contact width d1 of the displacement transmitter 76 with respect to the first plate member 18, a contact width d2 of the displacement transmitter 76 with respect to the actuator (the vibrating section 66), and a width d3 of the vibrating section 66 satisfy d1>d3>d2. If the vibrating section 66 is regarded as a beam, then the width referred to above represents a value corresponding to the length of the beam.

Figure 14:
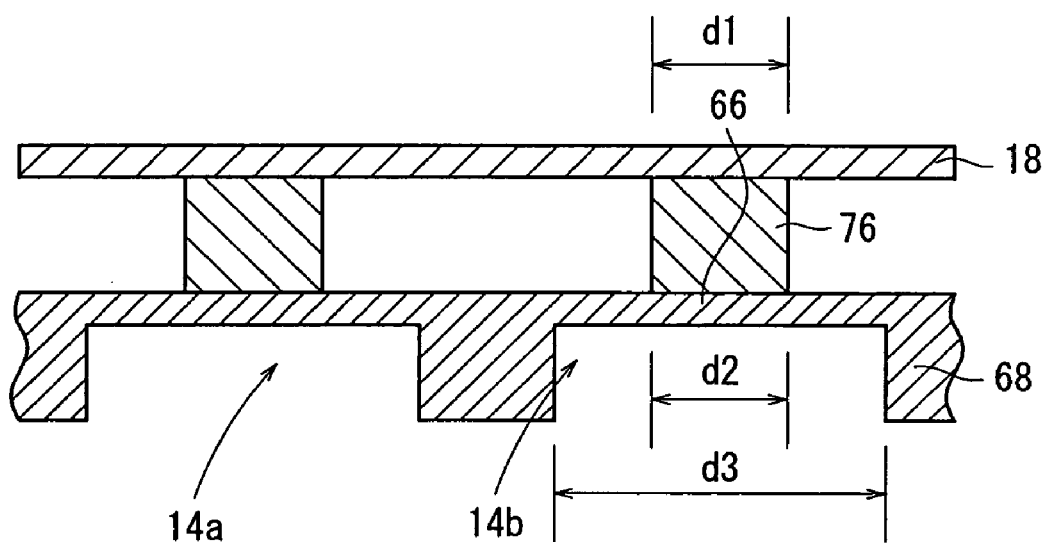
FIG. 14 is a cross-sectional view showing another example of a structure in which the width of a portion of an actuator which is connected to a displacement transmitter is smaller than the width of a vibrating section, and the width of a portion of a first plate member which is connected to the displacement transmitter is smaller than the width of the vibrating section.

In FIG. 14, the displacement transmitters 76 are formed separately from each other in alignment with the respective actuators 14a, 14b. In a cross section along the center of at least two actuators 14a, 14b, a contact width d1 of the displacement transmitter 76 with respect to the first plate member 18, a contact width d2 of the displacement transmitter 76 with respect to the actuator (the vibrating section 66), and a width d3 of the vibrating section 66 satisfy d3>d2=d1.

According to a next preferred form, the width of a portion of the first plate member 18 which is joined to the displacement transmitter 76 is smaller than the width of the vibrating section 66. Specific structural examples of this form are shown in FIG. 14 or 15, for example.

Figure 15:
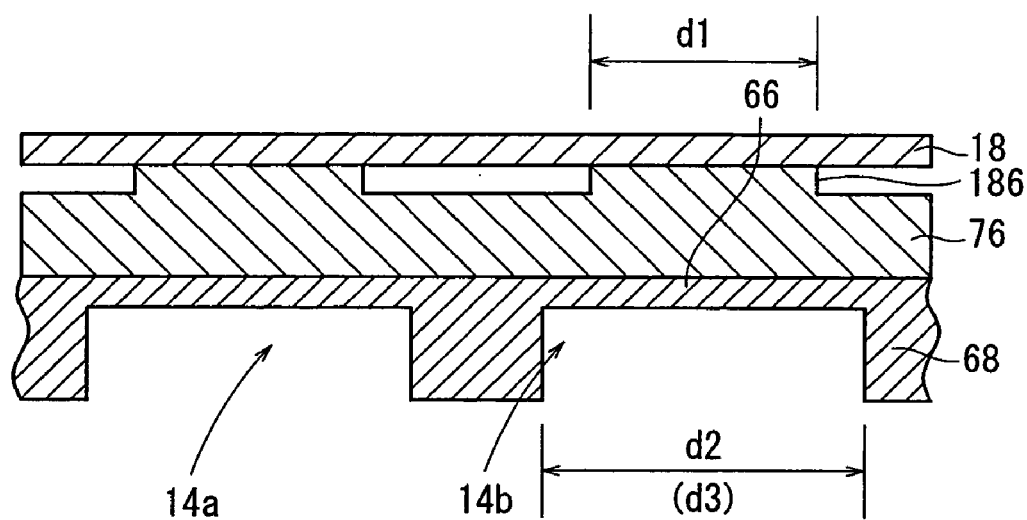
FIG. 15 is a cross-sectional view showing another example of a structure in which the width of a portion of a first plate member which is connected to a displacement transmitter is smaller than the width of a vibrating section.

In FIG. 15, the displacement transmitter 76 is formed continuously over at least two actuators 14a, 14b, and has a substantially flat lower surface and an upper surface having convexities 186 aligned respectively with the actuators 14a, 14b. In a cross section along the center of at least two actuators 14a, 14b, a contact width d1 of the displacement transmitter 76 with respect to the first plate member 18, a contact width d2 of the displacement transmitter 76 with respect to the actuator (the vibrating section 66), and a width d3 of the vibrating section 66 satisfy d1<d3=d2. The structure shown in FIG. 10 has been described above, and will not be described below.

Figure 16:
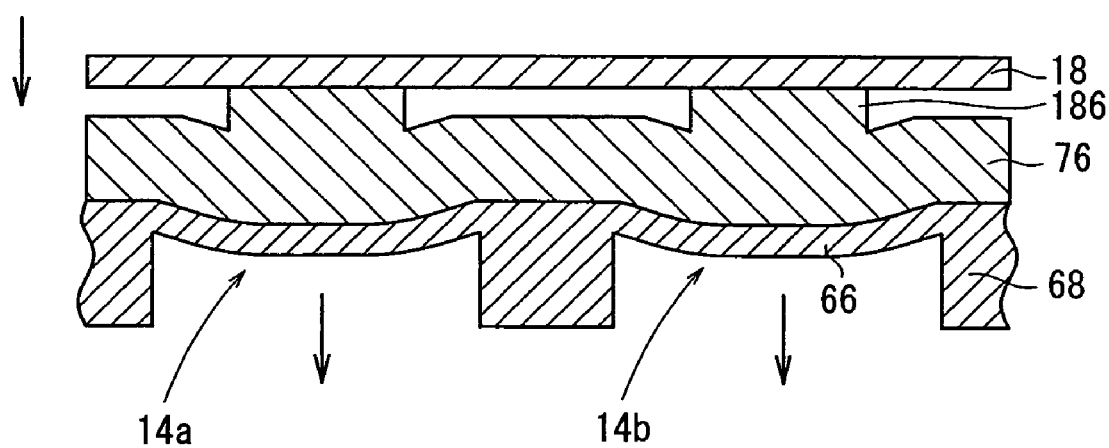
FIG. 16 is a view illustrative of operation of the structural example shown in FIG. 15.
Figure 17:
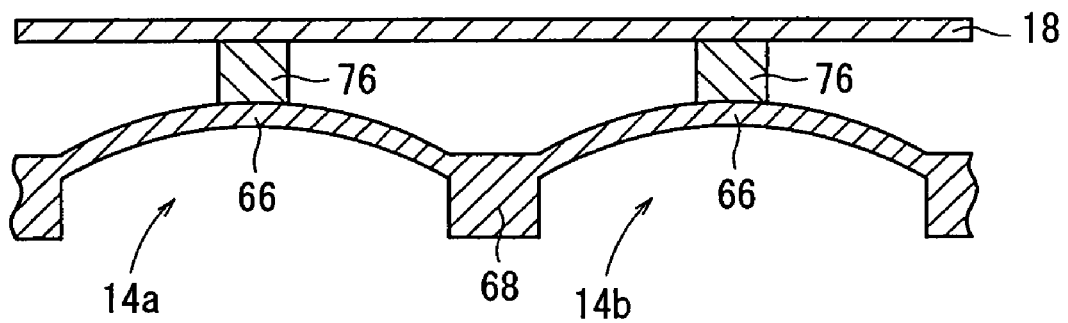
FIG. 17 is a cross-sectional view showing an example in which a vibrating section is of an arch shape.

With the structure shown in FIG. 15, as shown in FIG. 16, when the first actuator 14a is displaced downwardly, the second actuator 14b which suffers a failure can also be displaced.

With the actuator devices 10A, 10B according to the first and second embodiments, even when some of the actuators 14 become defective, their displacement can be compensated for by the normal actuators 14. Therefore, the yield of the actuator devices is increased. Furthermore, the area of a portion that is displaced by the actuator 14, i.e., an effective area, can be increased.

Particularly, since the rigidity of the first plate member 18 is greater than the rigidity of the vibrating sections 66 of the actuators 14, even when one actuator 14 fails due to cracking or wire breakage, the first plate member 18 is displaced when another actuator 14 is displaced, producing forces to displace the vibrating section 66 of the faulty actuator 14. Consequently, even in the event of a failure of one actuator 14, the displacement of the entire first plate member 18 is not affected thereby, making it possible to compensate for the faulty region. Since the actuators 14 have the vibrating sections 66, any faulty actuator can easily be displaced under external forces. Such defect compensation cannot be obtained by a laminated actuator, for example, which does not have the vibrating sections 66.

The flexural rigidity of the first plate member 18 should be 10 times the flexural rigidity of the vibrating sections 66 or greater. This reduces the amount of flexing of the first plate member 18. In this case, there is obtained a structure which is less susceptible to manufacturing irregularities with respect to the distance between the actuators 14 and the size of the displacement transmitter 76.

Since the first plate member 18 has the grooves 178, the concavities 180, and the convexities 182, the geometrical moment of inertia of the first plate member 18 can be increased, and the flexural rigidity of the first plate member 18 can be increased. Because the rigidity can be increased with a small amount of material, they are effective in reducing the weight of the actuator device. Inasmuch as the inertial mass is reduced, the response speed of the actuators is increased.

In the process of displacing the actuators 14, it is preferable for the distance between the vibrating sections 66 and the first plate member 18 to remain substantially unchanged. For example, if the displacement transmitter 76 is interposed between the vibrating sections 66 and the first plate member 18, then it is preferable that the thickness (height) of the displacement transmitter 76 be not essentially changed by the displacement of the actuators 14 (not subject to compressive deformation, tensile deformation, and buckling deformation). In this case, compressive deformation and tensile deformation can be reduced by adding a filler to the displacement transmitter 76.

Furthermore, as the width of a portion of the actuator 14 which is joined to the displacement transmitter 76 is smaller than the width of the vibrating section 66, the displacement of the vibrating section 66 and forces produced thereby can reliably be transmitted to the first plate member 18 by the displacement transmitter 76. With the forms shown in FIGS. 13 through 15, in particular, the actuator device may be arranged not to obstruct the displacement of the displacement transmitter 76, and with the forms shown in FIGS. 13 and 14, the actuator device may be arranged such that the displacement transmitter 76 does not overlap the fixed section 68. In these cases, the displacement transmitter 76 should preferably be not too small with respect to the vibrating section 66 so that the vibrating section 66 and the first plate member 18 are reliably fixed to each other. As the displacement and generated forces differ depending on the location of the vibrating section 66, even if the joint between the vibrating section 66 and the displacement transmitter 76 does not include a portion of the vibrating section 66 which causes the largest displacement, optimum values can be obtained from generated forces and a required amount of displacement. Specifically, the width of the displacement transmitter 76 should be in the range from 5% to 99%, or preferably in the range from 30% to 90%, of the width of the vibrating section 66. In terms of areas, the cross-sectional area of the displacement transmitter 76 should be in the range from 0.5% to 99%, or preferably in the range from 10% to 90%, of the cross-sectional area of the vibrating section 66. The ratio of the height to width of the displacement transmitter 76, i.e., the aspect ratio of the displacement transmitter 76, should be smaller than 1, or preferably smaller than 0.2

If the rigidity of the vibrating section 66 is greater than the rigidity of the first plate member 18, then the first plate member 18 tends to flex without displacing the vibrating section 66 of a faulty actuator 14, and the first plate member 18 includes a portion which is displaced and a portion which is not displaced. Therefore, such a rigidity setting is not preferable.

Figure 18:
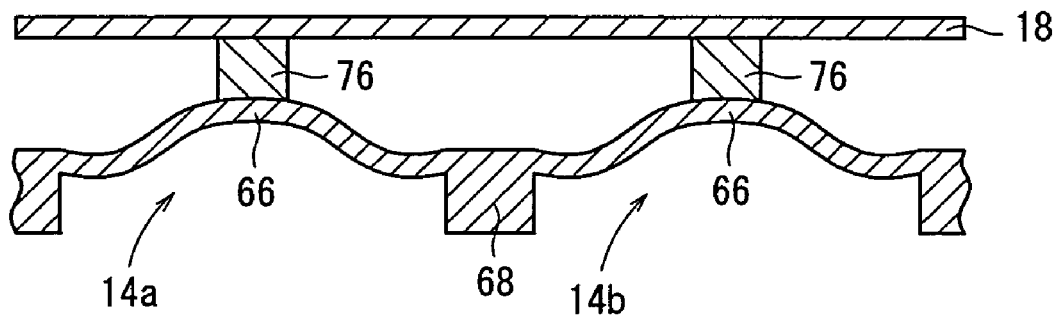
FIG. 18 is a cross-sectional view showing an example in which a vibrating section is of a wavy shape.
Figure 19:
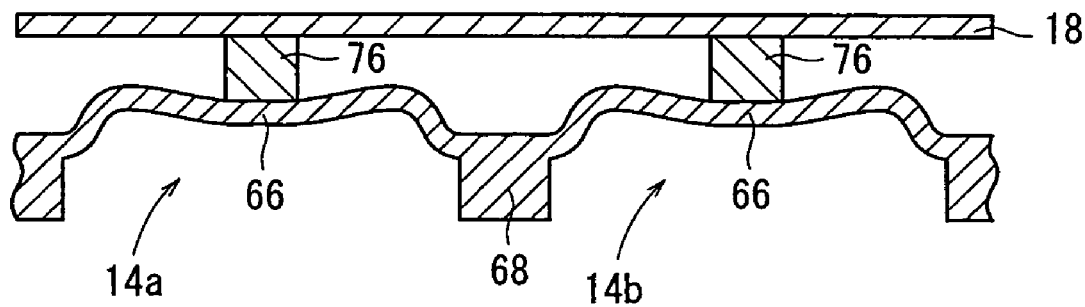
FIG. 19 is a view illustrative of the manner in which a displacement is compensated for when a second actuator of first and second actuators fails.

In the form shown in FIG. 4, the vibrating sections 66 are flat. However, as shown in FIG. 17A, the vibrating sections 66 may be of an arch shape, or as shown in FIG. 18, the vibrating sections 66 may be of a wavy shape. In the examples shown in FIGS. 17A and 18, the vibrating sections 66 are convex toward the first plate member 18. The vibrating sections 66 that are convex toward the first plate member 18 are more effective to increase the response of the actuators 14 than if the vibrating sections 66 are not of a convex shape (e.g., they are flat), and allow adjacent actuators 14 to compensate for displacement even if an actuator 14 fails.

The reasons for the above advantages are as follows: In the presence of the first plate member 18, the vibrating sections 66 need to displace a large mass, and undergoes a larger load than if it were not for the first plate member 18. Since the vibrating sections 66 are of a convex shape, their drive forces become stronger to keep response at a higher level. The rigidity is increased to sufficiently bear the mass of the first plate member 18 that is applied to the vibrating sections 66.

In the event of a failure of an actuator 14, the first plate member 18 driven by the adjacent actuators 14 displaces the vibrating section 66. At this time, it is desirable that reactive forces from the vibrating section 66 be small. The convex shape is considered to have such characteristics that it increases drive forces but prevents reactive forces from increasing when displaced by the first plate member 18.

The structure in which the vibrating sections 66 are of a convex shape is particularly preferably used in an arrangement wherein the vibrating sections 66 have both ends connected to the fixed section 68 and an arrangement wherein the peripheral region of the vibrating sections is connected to the fixed section 68. If cavities are present below the vibrating sections 66, then the cavities may be filled with a liquid. In such a case, the peripheral region of the vibrating sections 66 needs to be connected to the fixed section 68 to prevent the liquid from leaking.

In the event of a failure of an actuator 14, the first plate member 18 is displaced by a normal actuator 14, and the vibrating section 66 of the faulty actuator 14 is depressed by the displacement transmitter 76. If the vibrating section 66 whose peripheral region is connected to the fixed section 68 is of a flat cross-sectional shape, then forces tending to obstruct the displacement are liable to increase under the tension of the vibrating section 66 which is kept taut. This is because the vibrating section 66 is extended in its longitudinal direction for producing the above displacement. If the vibrating section 66 is of an arch or wavy shape, then since the vibrating section 66 itself has a larger length than the minimum distance between its joints to the fixed section 68, forces tending to obstruct the displacement are relatively weak when the vibrating section 66 undergoes forces from the displacement transmitter 76.

If the vibrating section 66 is of an arch shape, then when the actuator 14 is displaced under drive forces in a direction away from the first plate member 18, the vibrating section 66 should preferably have an arch shape that is convex toward the first plate member 18. When the actuator 14 is displaced under drive forces in a direction toward the first plate member 18, the vibrating section 66 should preferably have an arch shape that is concave toward the first plate member 18.

If the actuator 14 in which the vibrating section 66 is convex toward the first plate member 18 is displaced toward the first plate member 18, then the length of the vibrating section 66 is increased and forces tending to obstruct the displacement thereof are increased. When the actuator 14 in which the vibrating section 66 is convex toward the first plate member 18 undergoes forces applied in a direction away from the first plate member 18 through the displacement transmitter 76, the actuator 14 is displaced as the vibrating section 66 flexes.

With the vibrating section 66 fixed at its both ends or peripheral region to the fixed section 68, since the rigidity of the vibrating section 66 is not too high, the actuator device is highly effective to perform compensation for a failure. The degree of freedom for design is also increased. The vibrating section 66 may also be fixed at one end to the fixed section 68.

If the vibrating section 66 is of an arch shape or a wavy shape, the height (or depth) of the convexity (or concavity) thereof toward the first plate member 18 should preferably be greater than the height (or depth) corresponding to the thickness of the vibrating section 66.

For keeping the responsiveness of the actuator 14, the rigidity of the vibrating section 66 needs to be not too small and should naturally be selected in view of the thickness, width, beam length, shape, material, etc. of the vibrating section 66. The convexity or concavity of the convex shape does not have to be formed in the central region of the vibrating section 66.

Figure 20:
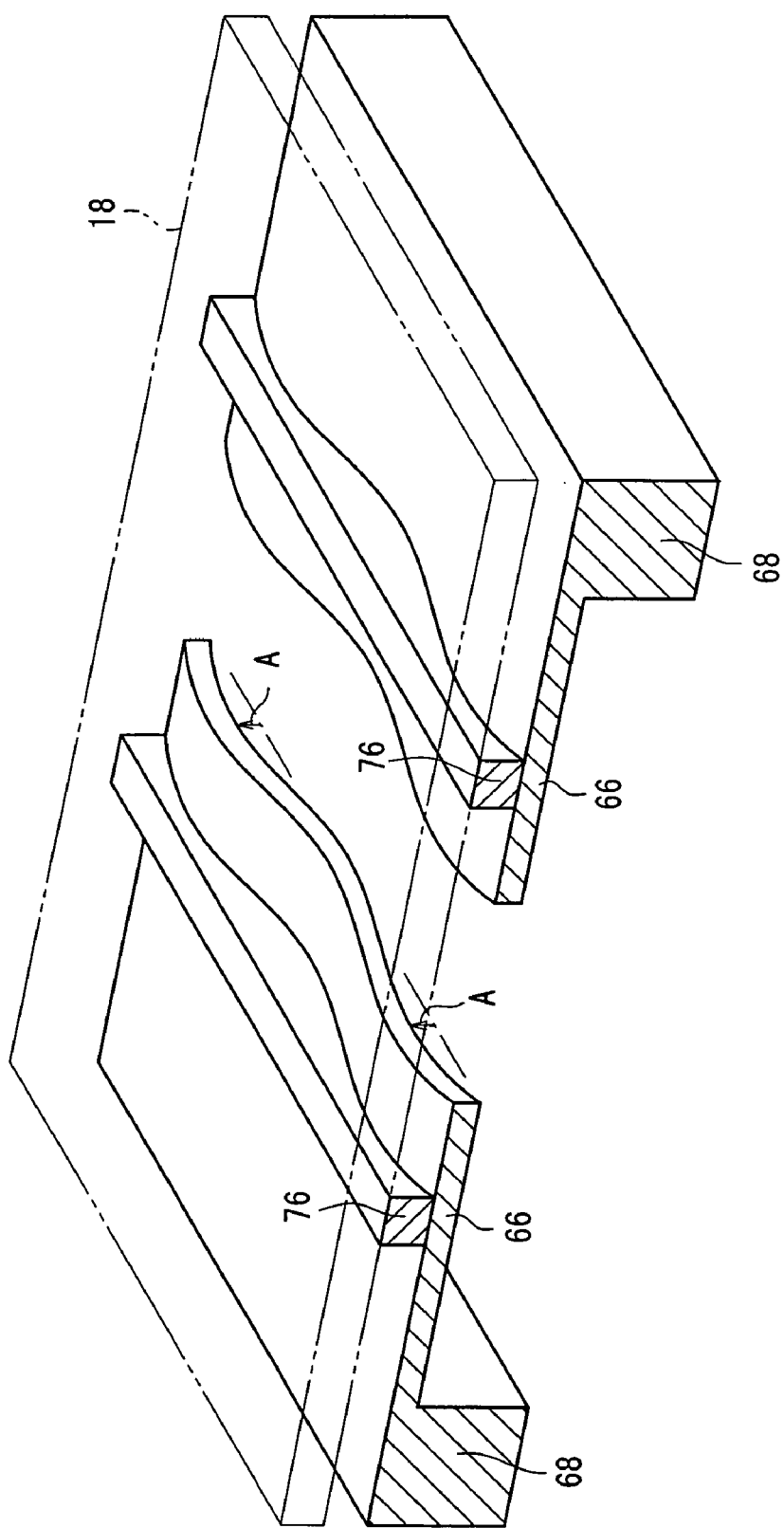
FIG. 20 is a perspective view showing a structural example in which a portion of a vibrating section has a wavy shape in the structure shown in FIG. 7.

As shown in FIGS. 17A and 18, the convex shape of the vibrating section 66 may be formed in the longitudinal direction of the beam. Alternatively, as shown in FIG. 20, the convex shape of the vibrating section 66 may be formed in a direction parallel to the joint between the vibrating section 66 and the fixed section 68. Particularly, the vibrating section 66 should preferably be of a wing shape (W shape) in the longitudinal direction of the beam. In FIG. 20, the arrows A indicate that the vibrating section 66 is deformed in a convex shape. If the vibrating section 66 has a wing shape, the width of the convex shape, i.e., the distance between valleys, should preferably be ⅓ of the beam length or greater. If the vibrating section 66 is convex toward the first plate member 18, then the vertex of the convex shape should preferably project toward the first plate member 18 beyond the height of the fixed section 68.

Figure 21:
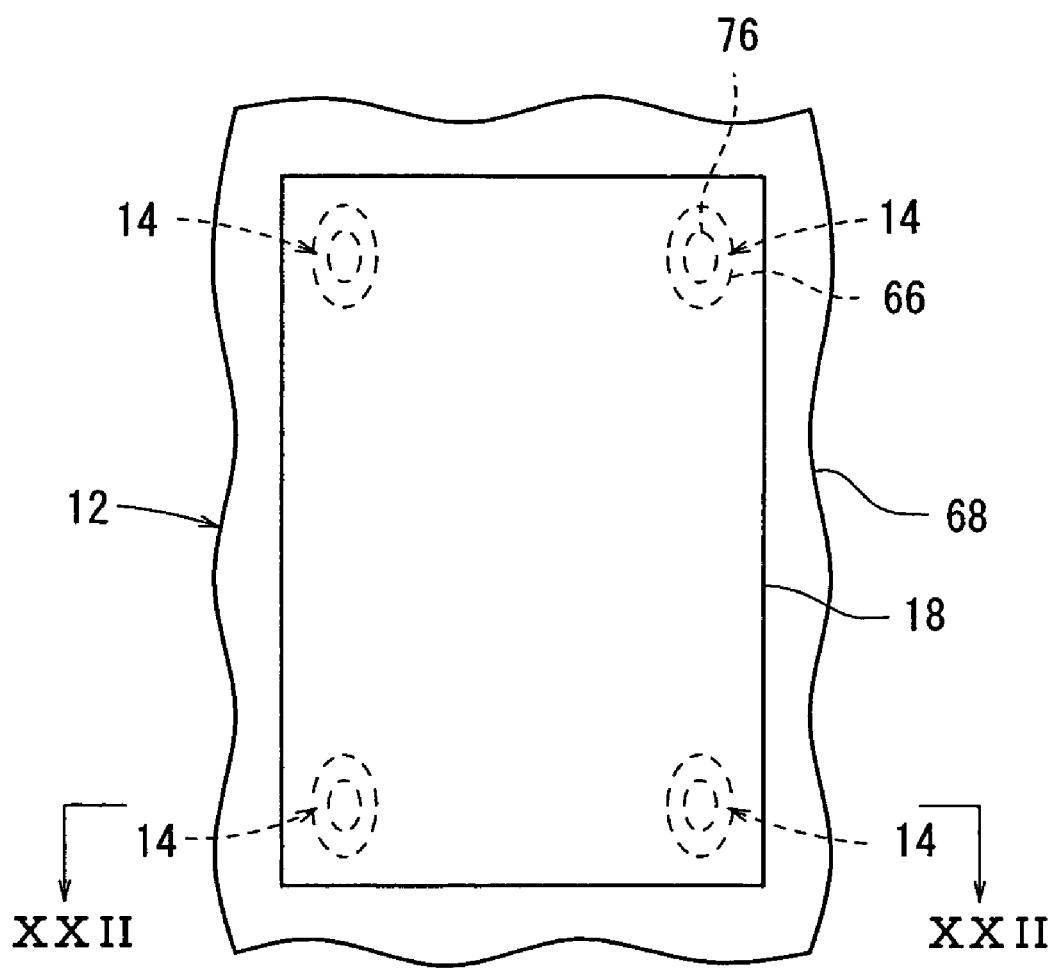
FIG. 21 is a plan view showing an example in which actuators are disposed at respective four corners of a first plate member.
Figure 22:
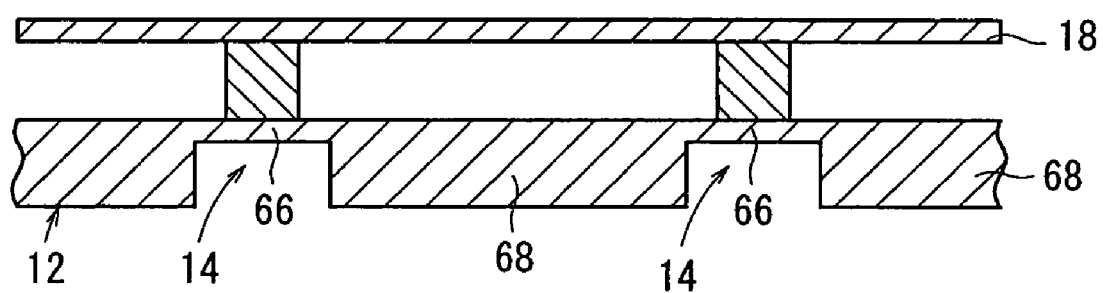
FIG. 22 is a cross-sectional view taken along line XXII—XXII of FIG. 21.

As shown in FIGS. 21 and 22, one first plate member 18 may be provided in combination with four actuators 14 arranged in a matrix. In this case, the actuators 14 should preferably be disposed at the respective four corners of the first plate member 18. With this arrangement, it is possible to control the displacement of the first plate member 18 having a large area with a small number of actuators 14 having a small area, and the area of a portion that is displaced by the actuators 14, i.e., an effective area (an aperture ratio if the actuator device is applied to a display apparatus, or the like), can be increased. This leads to low electric power consumption and an increase in the rigidity of the substrate 12, and stabilization of the planar shape.

Figure 23:
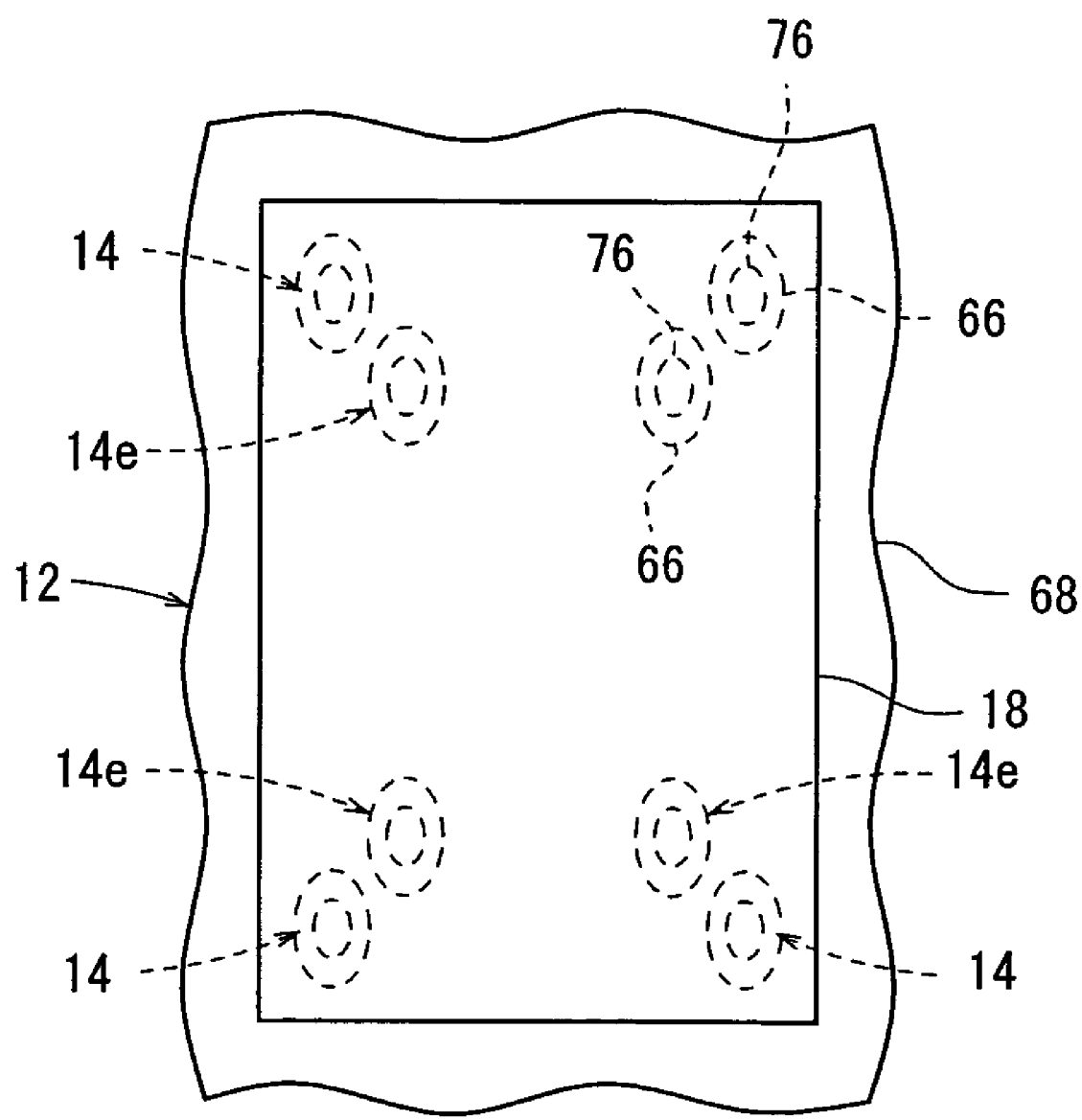
FIG. 23 is a plan view showing an example in which defect-compensating actuators are disposed in the structure shown in FIG. 21.

As shown in FIG. 23, actuators 14 may be disposed at the respective four corners of the first plate member 18, and defect-compensating actuators 14e may be disposed on the diagonal lines of the first plate member 18 adjacent to the respective actuators 14 for greatly increased reliability.

Figure 24:
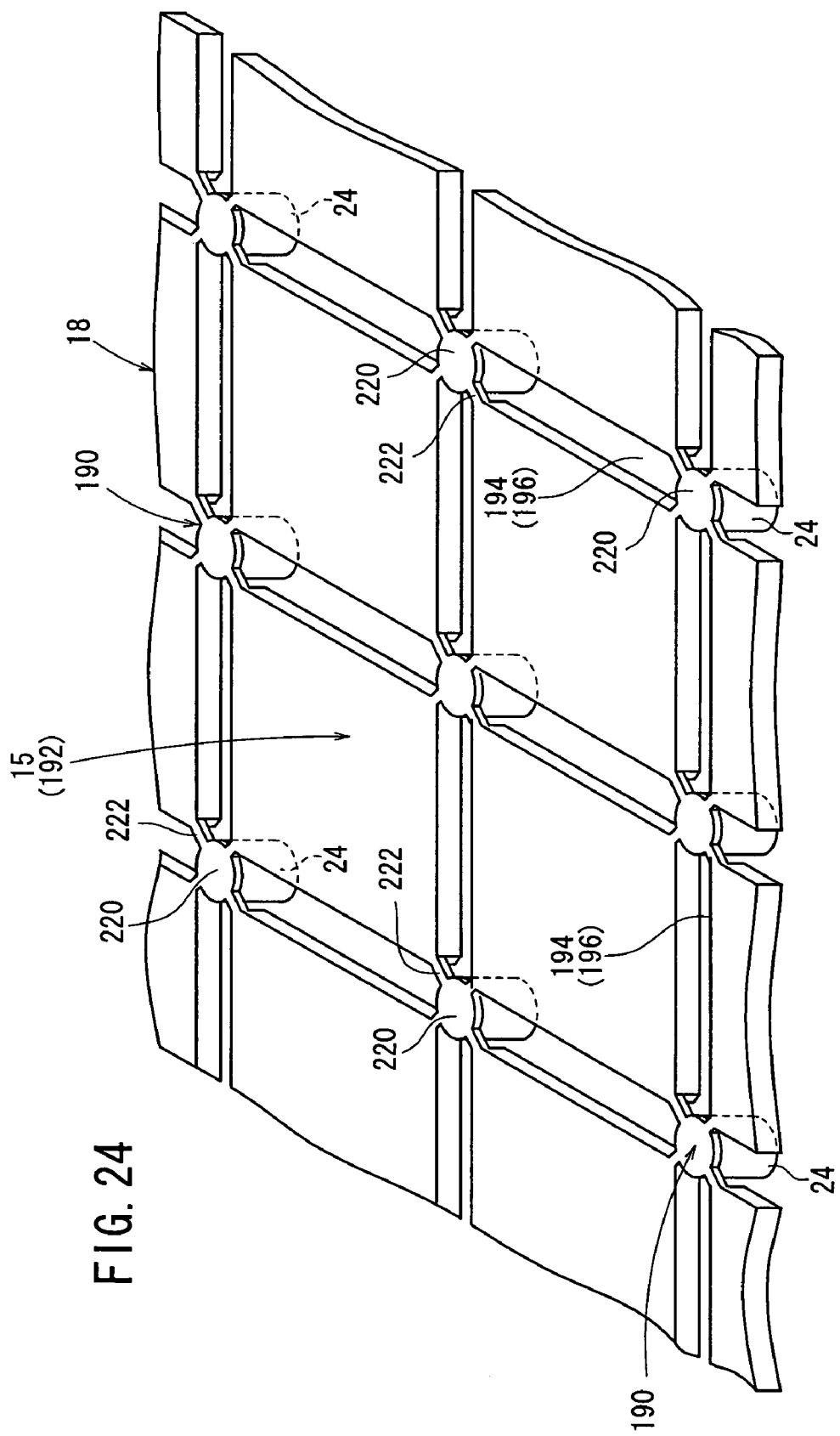
FIG. 24 is a perspective view showing, with parts omitted from illustration, an example of joints interconnecting cells of a first plate member.
Figure 25:
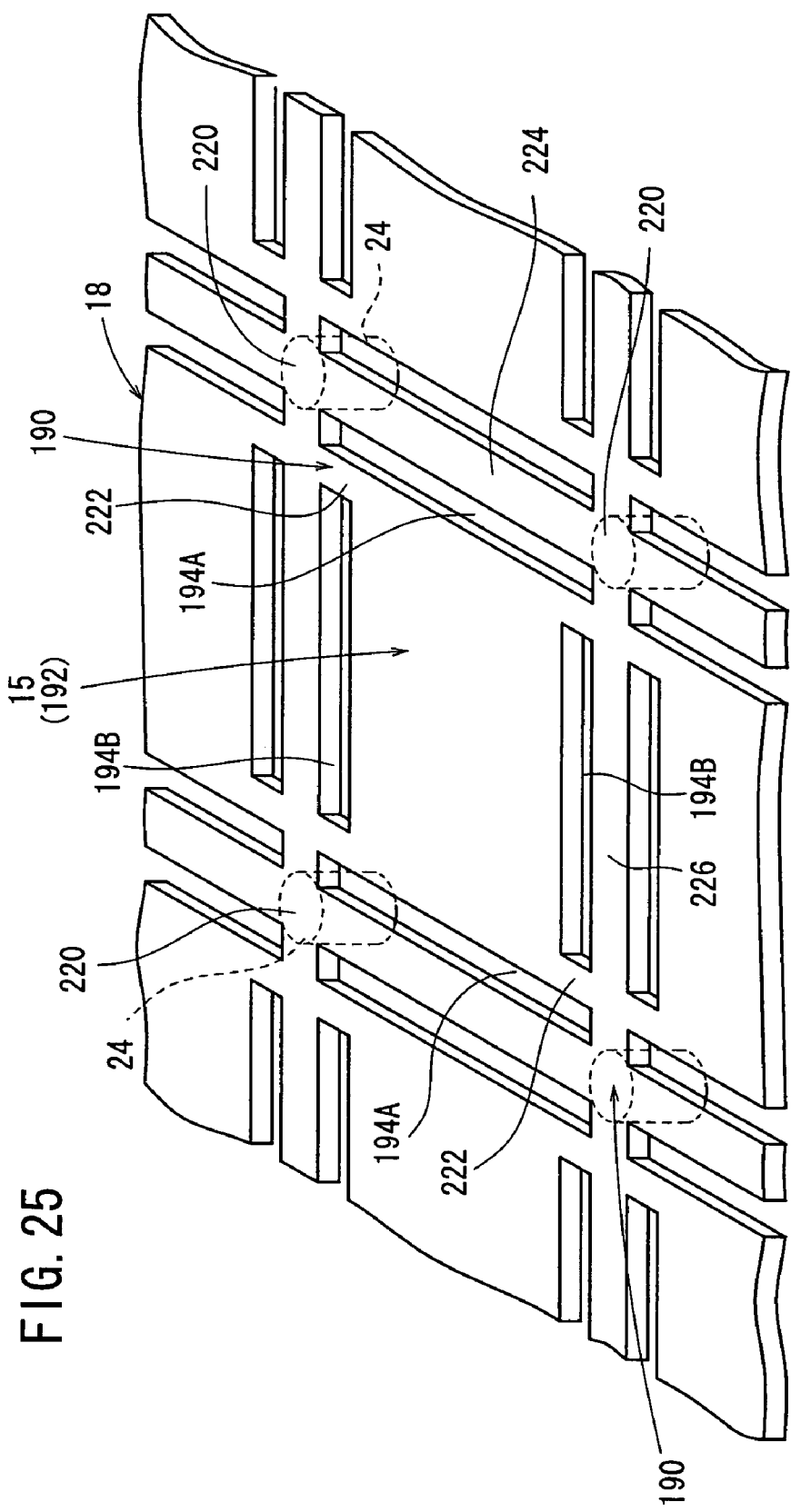
FIG. 25 is a perspective view showing, with parts omitted from illustration, another example of joints interconnecting cells of a first plate member.

The actuator devices 10A, 10B according to the first and second embodiments have a plurality of cells 15 arranged in a plane. Particularly, the first plate member of the actuator device 10A according to the first embodiment has interconnected portions corresponding to the respective cells 15, as shown in FIGS. 24 and 25. The rigidity of all or some of joints 190 interconnecting the cells 15 is smaller than the rigidity of portions 192 (hereinafter referred to as cell portions) of the first plate member 18 which correspond to the respective cells 15.

Figure 26A:
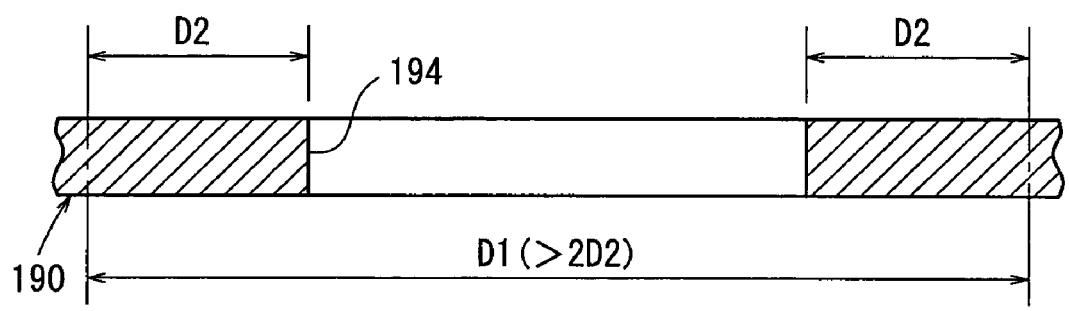
FIG. 26A is a view showing a joint with a slit defined therein.
Figure 26B:
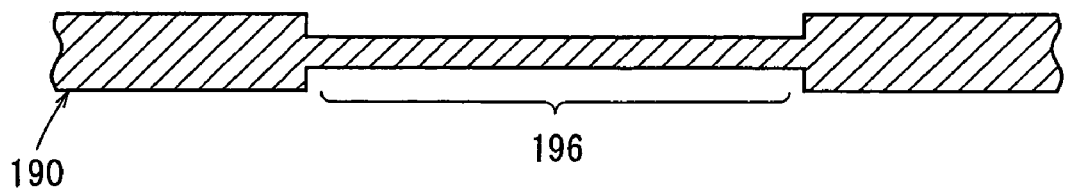
FIG. 26B is a view showing a joint with a thinned portion.

The rigidity of all or some of the joints 190 of the first plate member 18 may be made smaller than the rigidity of the cell portions 192 by forming slits 194 or the like in the joints 190 to make the width (2×D2) of the joints 190 smaller than the width D1 of the cell portions 192, as shown in FIG. 26A, or by making portions 196 of the joints 190 thinner than the cell portions 192, as shown in FIG. 26B.

In the embodiment shown in FIG. 24, slits 194 are formed in portions of the first plate member 18 which correspond to the spacers 24 (spacer portions 220), and the cell portions 192 and the spacer portions 220 are joined by narrow arms 222.

In the embodiment shown in FIG. 25, a plurality of vertical rule portions 224 and a plurality of horizontal rule portions 226 which extend respectively vertically and horizontally along the array of spacers 24 are joined by the spacer portions 220, and the horizontal rule portions 226 and the cell portions 192 are joined by narrow arms 222. Thus, slits 194A along the vertical rule portions 224 and slits 194B along the horizontal rule portions 226 are formed in the first plate member 18.

Figure 27:
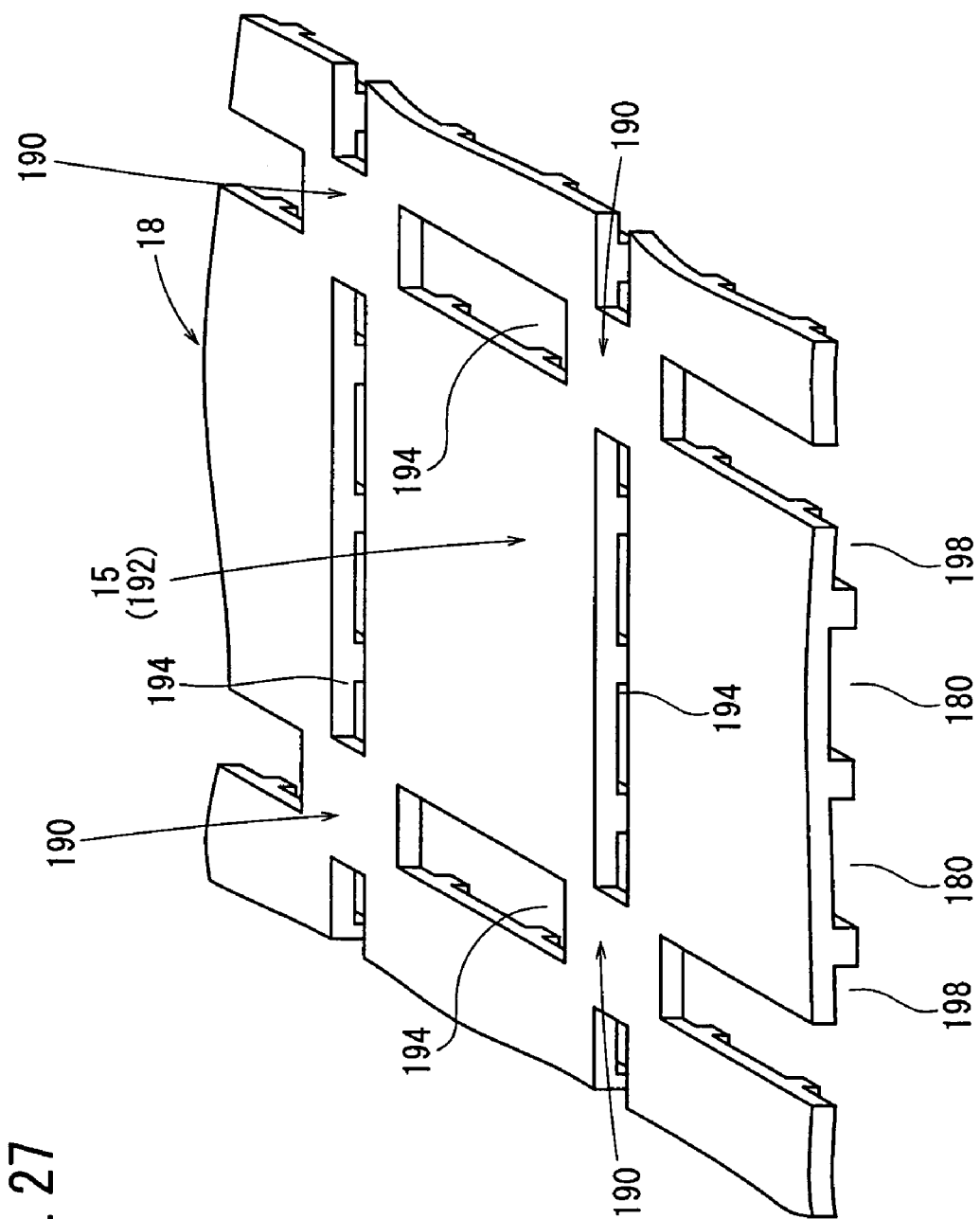
FIG. 27 is a perspective view showing, with parts omitted from illustration, a first plate member having a plurality of recesses defined in a lower surface thereof, and joints with slits defined therein.

According to a specific process, as shown in FIG. 27, one surface (e.g., lower surface) of the first plate member 18 is half-etched to a depth which is half the thickness of the first plate member 18, thereby forming a plurality of recesses 180 in the cell portions 192. At this time, the joints 190 between the cell portions 192 and portions where slits are to be formed are also half-etched to form recesses 198. Then, portions where slits are to be formed on the opposite surface (e.g., upper surface) are etched to form holes in the portions where slits are to be formed, thereby forming slits 194.

Of the first plate member 18, each of the cell portions 192 has its geometrical moment of inertia increased by the recesses 180, and hence has increased flexural rigidity. The joints 190 have their thickness reduced to about half by the recesses 198, and also have their width reduced by the slits 194. Therefore, the flexural rigidity of the joints 190 is smaller than the cell portions 192.

In the actuator device 10A according to the first embodiment, as shown in FIG. 24, for example, as the joints 190 of the first plate member 18 and the fixed sections 68 (see FIG. 1) are joined by the spacers 24, the distance between the cell portions 192 of the first plate member 18 and the fixed sections 68 can be established accurately and reliably.

In particular, the spacers 24 that are present between the substrate 12 and the joints 190 of the first plate member 18 offer the following advantages:

If the substrate 12 has different heights depending on the location, e.g., if the substrate 12 has undulations (which are often unavoidable in the manufacturing process) when a plurality of actuators 14 are to be formed on one substrate 12, the distance between the substrate 12 and the first plate member 18 disposed above the substrate 12 varies depending on the location, possibly resulting in direct contact between the actuators 14 and the first plate member 18. In this case, the first plate member 18 is partly strained, tending to fail to operate the first plate member 18 as desired with the actuators 14.

The spacers 24 that are present between the substrate 12 and the joints 190 of the first plate member 18 do not give rise to the above problem even if the substrate 12 has undulations because the distance between the first plate member 18 and the substrate 12 is maintained by the spacers 24.

The actuators 14 that are connected to the first plate member 18 have their displacement characteristics affected thereby. As the distance between the first plate member 18 and the substrate 12 is determined by the spacers 24, the degree of a change in the displacement characteristics of the actuators 14 is kept constant irrespective of the location, and the spacers 24 are highly effective to prevent the displacement characteristics from varying. For example, since the thickness of the connectors (e.g., the displacement transmitters 76) which connect the actuators 14 and the first plate member 18 is uniformized, the effect thereof on the displacement characteristics of the actuators 14 is uniformized.

In the absence of the spacers 24, when the actuators 14 and the first plate member 18 are partly displaced considerably closely to each other, the displacement transmitters 76 tend to spread more greatly than the size of the actuators 14, possibly impairing operation of the actuators 14. This drawback can be avoided by adding the spacers 24.

If the height of the spacers 24 is greater than necessary, then shortcomings such as characteristic changes are liable to occur due to expansion or shrinkage of the spacers 24 themselves and an increase in the load on the actuators 14. The spacers 24 can sufficiently be made effective by setting the spacers 24 to an appropriate height.

Figure 28:
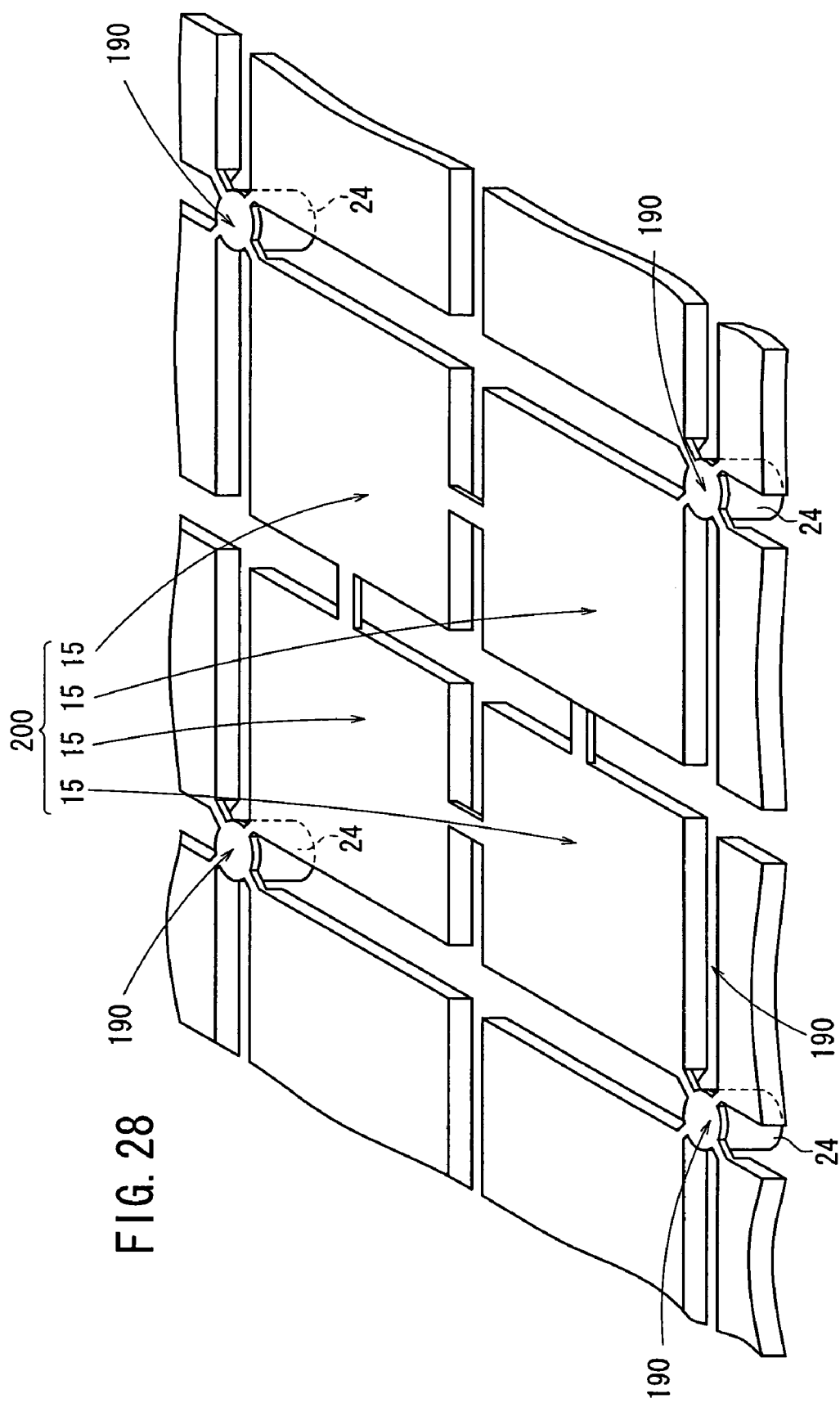
FIG. 28 is a perspective view showing, with parts omitted from illustration, an example of a structure in which four successive cells are grouped into a large cell with spacers associated with the large cell.

The spacers 24 should be arranged such that they are associated with the respective cells 15, as shown in FIG. 24. This is because the spacers 24 can firmly be fixed, and the distance between the cell portions 192 and the fixed sections 68 can accurately and reliably be established. If the effective areas of the cell portions 192 are reduced due to the spacers 24 associated with the respective cells 15, then for the purpose of increasing the effective area efficiency, as shown in FIG. 28, four successive cells 15 are grouped into one large cell 200, and spacers 24 may be associated with each large cell 200. Spacers 24 may be provided on only the outer circumference of the actuator device 10A.

Figure 29:
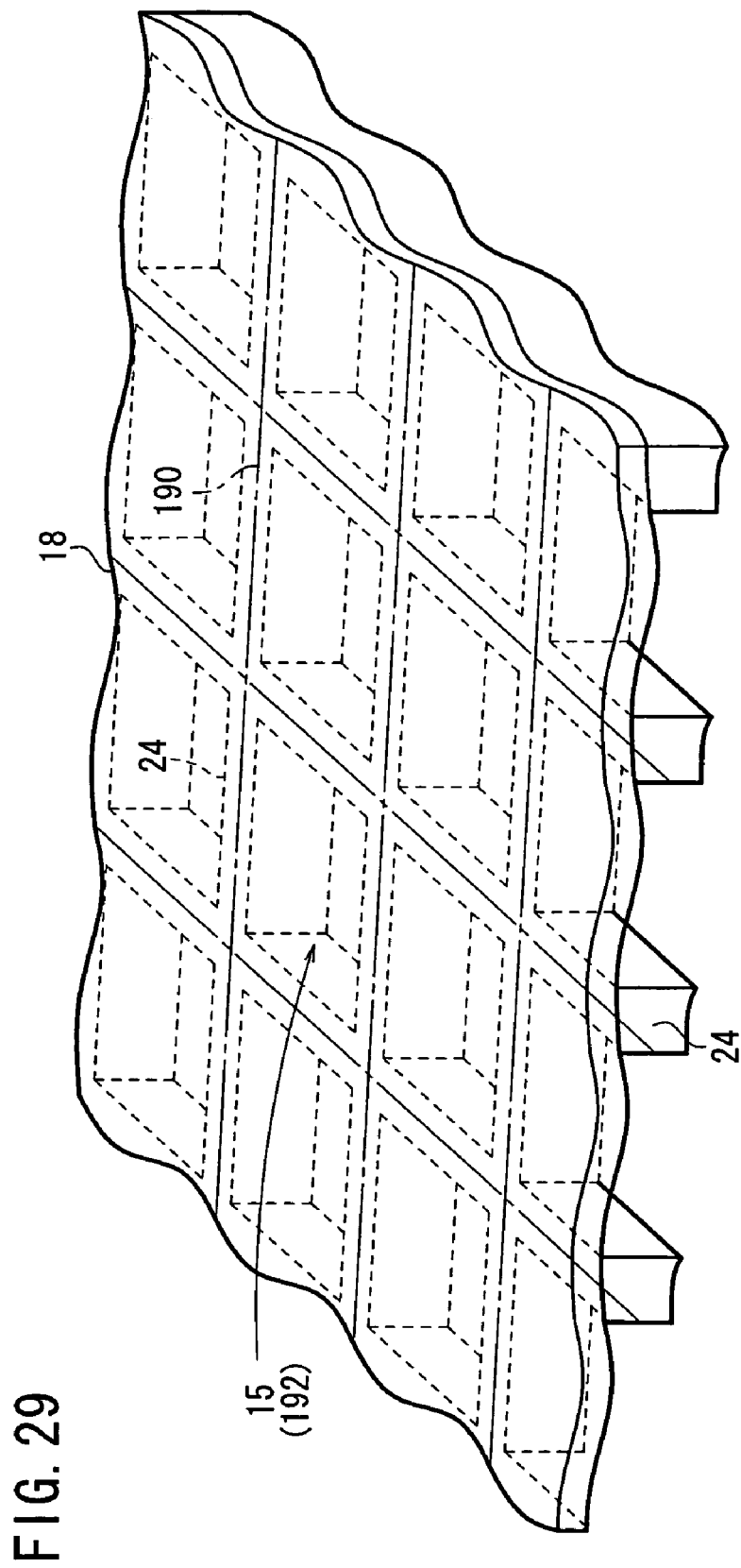
FIG. 29 is a perspective view showing, with parts omitted from illustration, an example (grid shape) of a structure of spacers.
Figure 30:
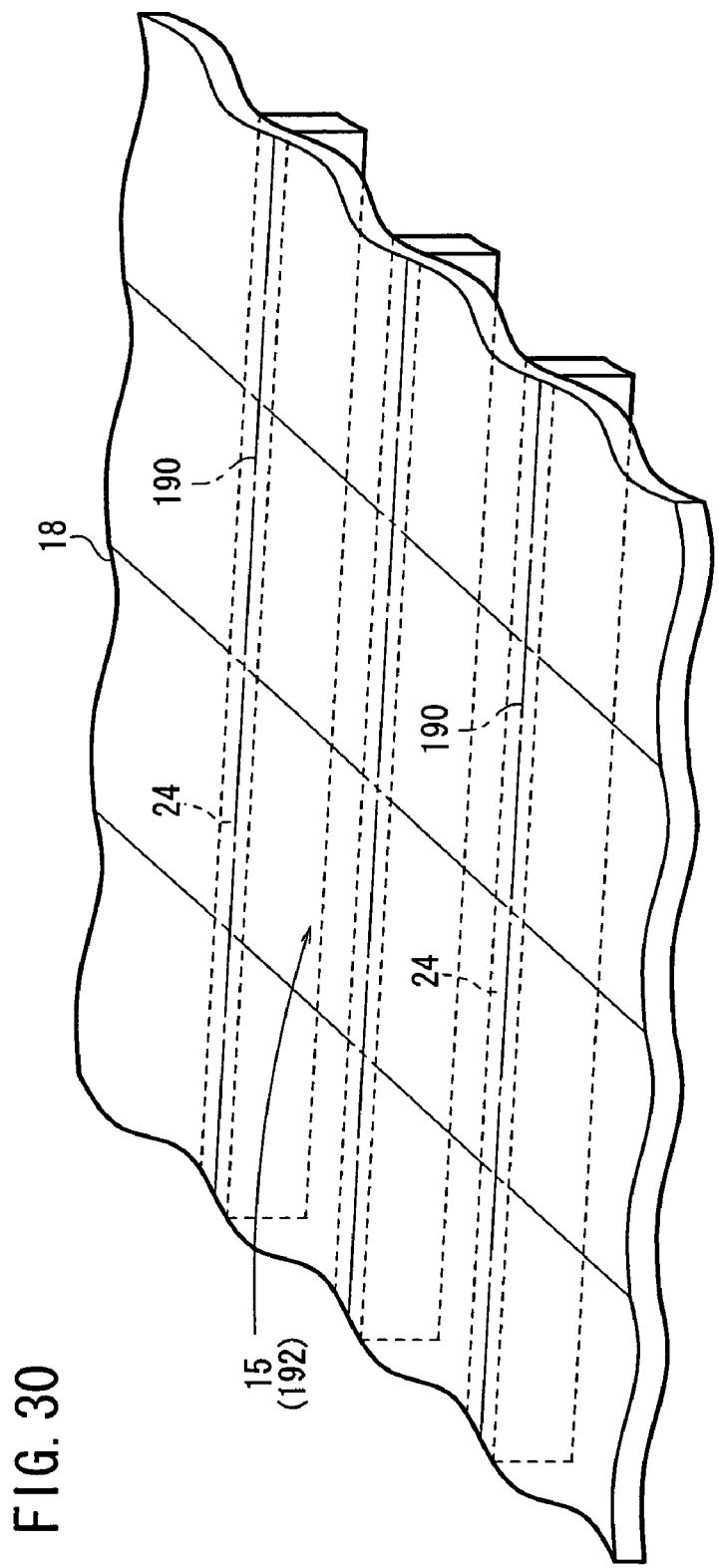
FIG. 30 is a perspective view showing, with parts omitted from illustration, another example (stripe shape No. 1) of a structure of spacers.
Figure 31:
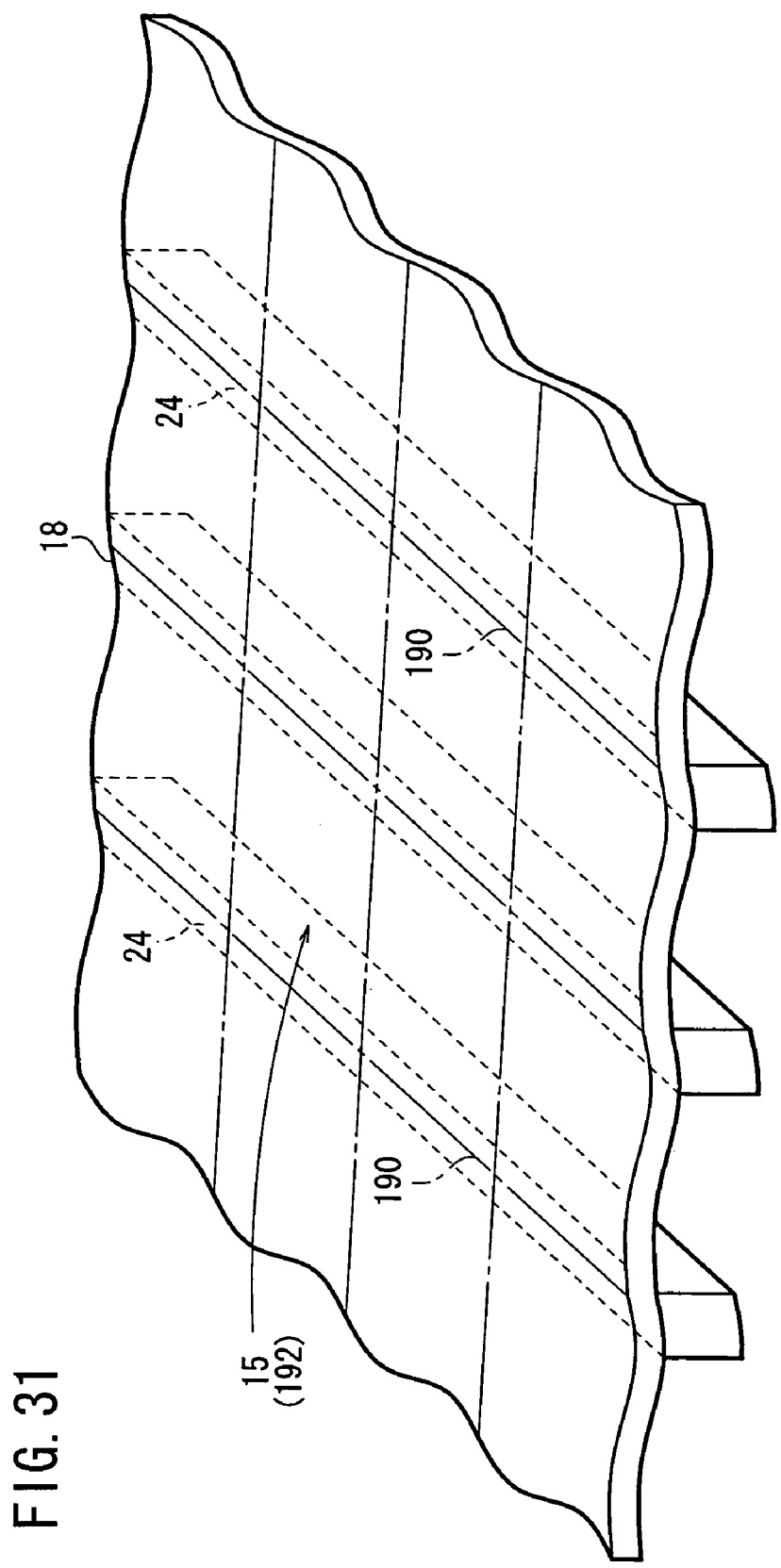
FIG. 31 is a perspective view showing, with parts omitted from illustration, another example (stripe shape No. 2) of a structure of spacers.
Figure 32:
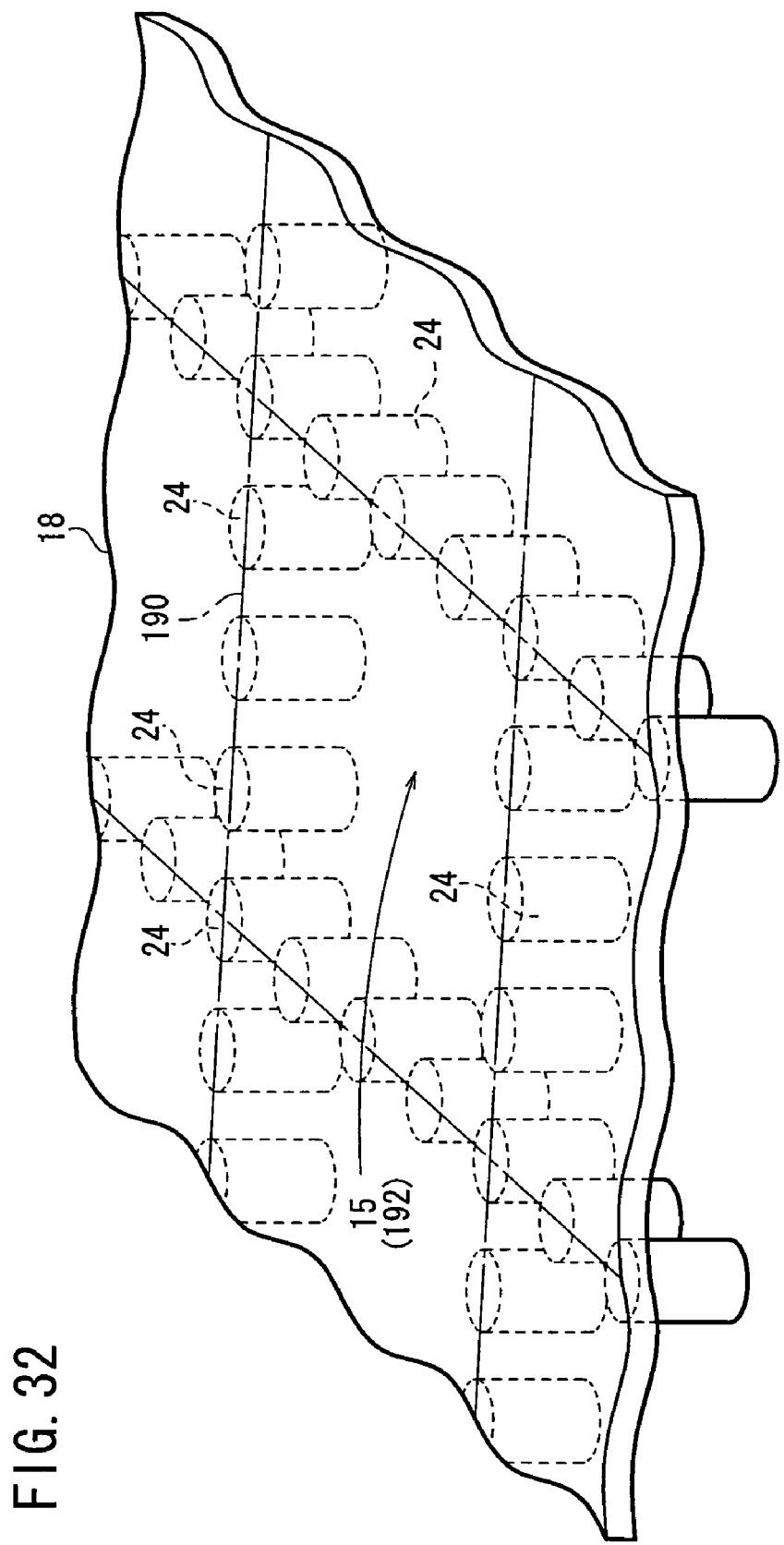
FIG. 32 is a perspective view showing, with parts omitted from illustration, another example (columnar shape) of a structure of spacers.

As shown in FIG. 29, spacers 24 may be formed in a grid pattern so as to surround cells 15. Alternatively, spacers 24 may be formed in a striped pattern along confronting sides of cells 15. As shown in FIG. 24, columnar spacers 24 may be disposed on the four corners of cells 15, or as shown in FIG. 32, columnar spacers 24 may be disposed on the four sides of cells 15.

Figure 33:
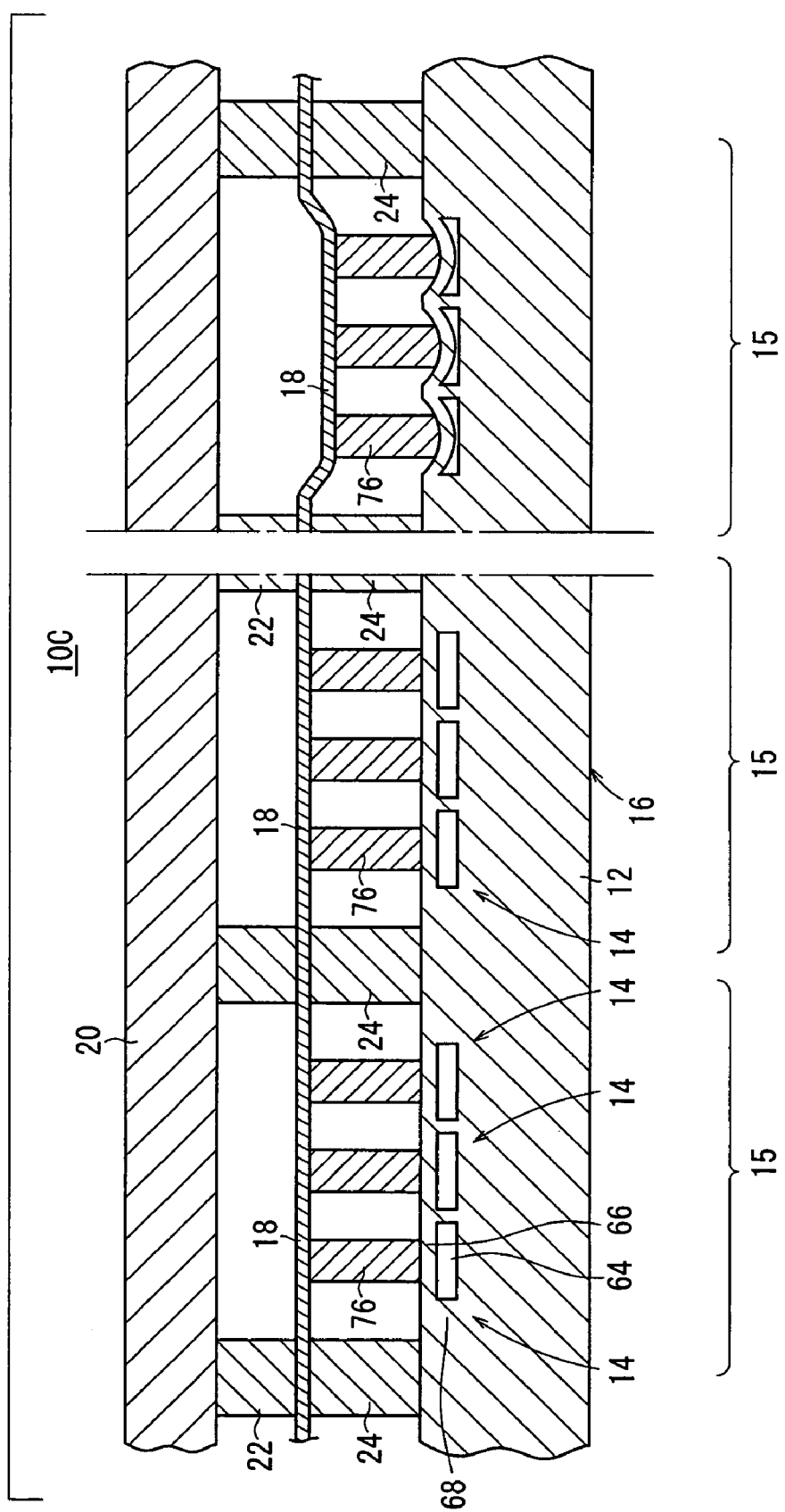
FIG. 33 is a view showing an actuator device according to a third embodiment.

As shown in FIG. 33, an actuator device 10C according to a third embodiment is of substantially the same structure as the actuator device according to the first embodiment, but differs therefrom in that it has a second plate member 20 disposed facing the first plate member 18.

A plurality of spacers 22 are formed between the first plate member 18 and the second plate member 20, forming m cells 15, for example.

Figure 34:
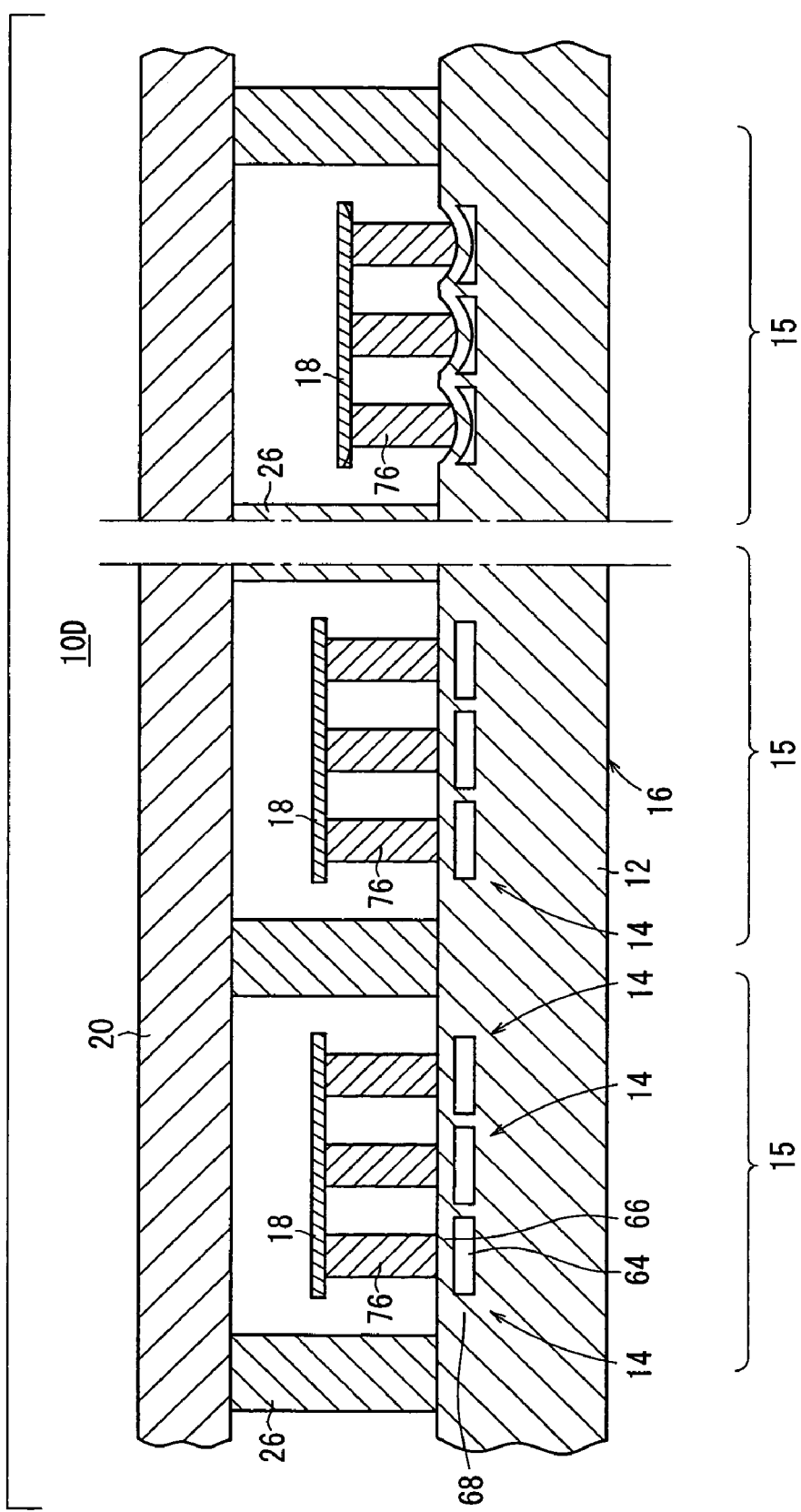
FIG. 34 is a view showing an actuator device according to a fourth embodiment.

As shown in FIG. 34, an actuator device 10D according to a fourth embodiment is of substantially the same structure as the actuator device 10B according to the second embodiment, but differs therefrom in that the first plate member 18 is divided into segments corresponding to the m cells 15. A plurality of spacers 26 are interposed between the second plate member 20 and the substrate 12 in gaps between adjacent ones of the first plate members 18.

The actuator devices 10A through 10D according to the first through fourth embodiments described above are applicable to a display device, and also applicable to a variable capacitor, an optical modulator, or the like.

Display devices 30A, 30B according to first and second specific examples, to which the actuator devices 10C, 10D according to the third and fourth embodiments are applied, will be described below with reference to FIGS. 35 through 44.

Figure 35:
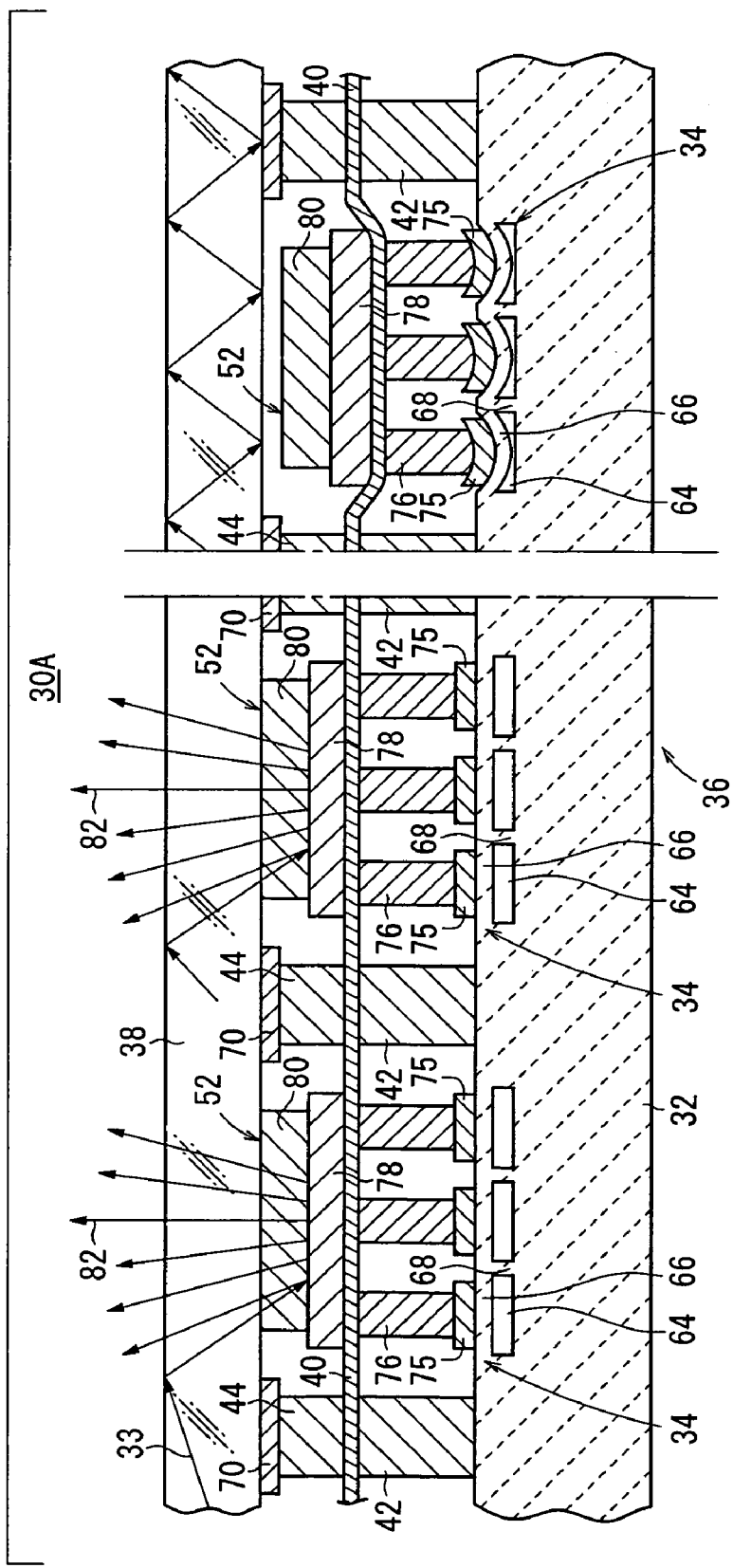
FIG. 35 is a view showing a display device according to a first specific example.

As shown in FIG. 35, the display device 30A according to the first specific example has a drive section 36 including a plurality of actuators 34 arranged in a plane (e.g., a matrix or staggered pattern) on an actuator substrate 32, a single optical waveguide plate 38 which is disposed facing the actuator substrate 32 and into which light 33 from a light source is introduced from an end face thereof, and a single joint plate 40 which is disposed between the actuator substrate 32 and the optical waveguide plate 38 and to which drive forces from the actuators 34 of the drive section 36 are transmitted.

Figure 36:
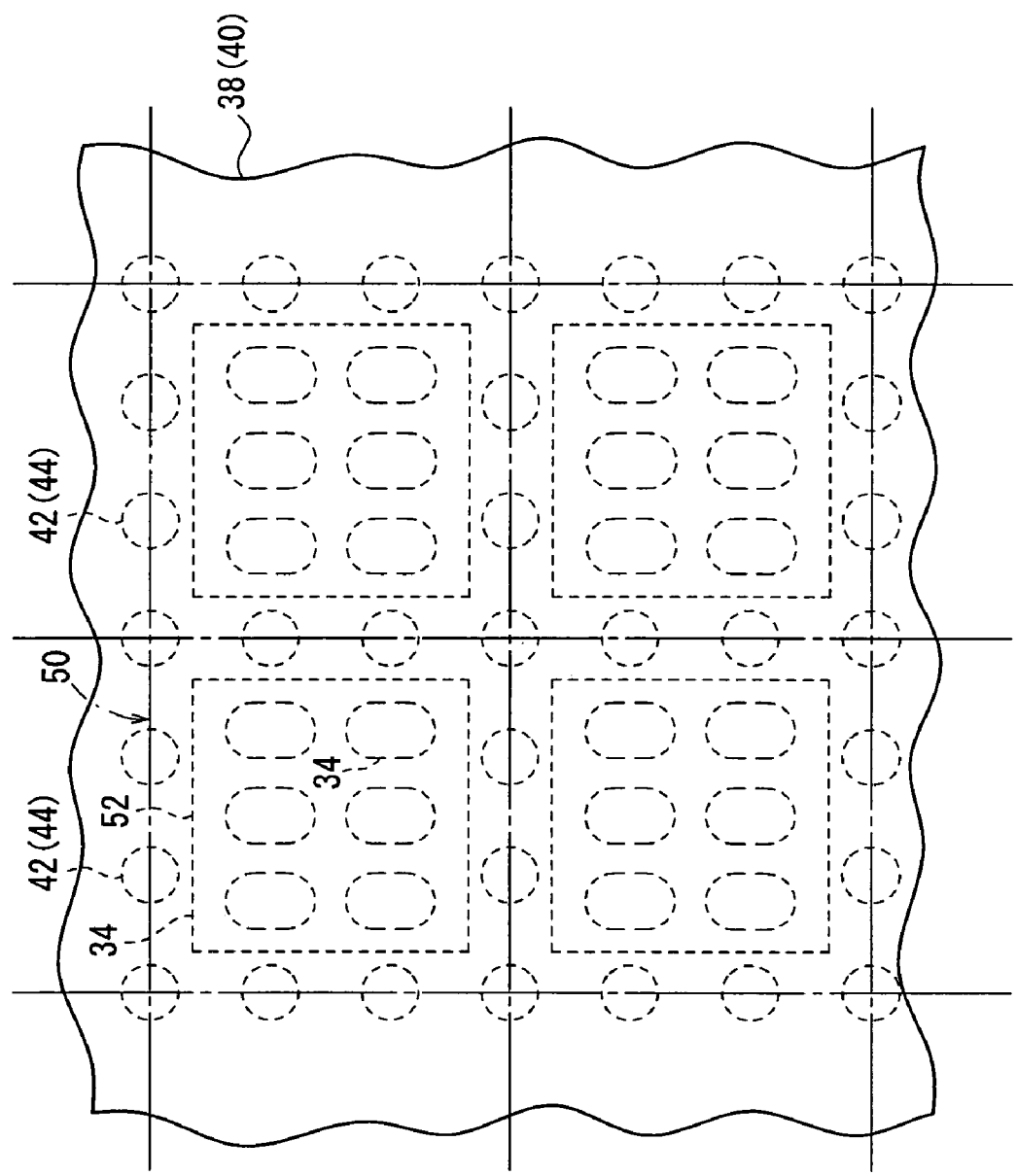
FIG. 36 is an enlarged view showing an essential portion of the display device according to the first specific example, as viewed from an optical waveguide plate.

As shown in FIG. 36, a plurality of spacers 42 are formed between the actuator substrate 32 and the joint plate 40 surrounding cells 50 which form respective pixels (pixel forming zones). A plurality of spacers 44 are also formed between the joint plate 40 and the optical waveguide plate 38 surrounding the cells 50.

Each of the cells 50 is separated in a rectangular shape, for example, by plural spacers 42, 44, and has a region including six actuators 34 (in two rows and three columns), for example. One picture element assembly 52 is formed on the joint plate 40 in association with each cell 50. In the present embodiment, one picture element assembly 52 on the joint plate 40 is assigned to six actuators 34 on the actuator substrate 32.

Figure 37:
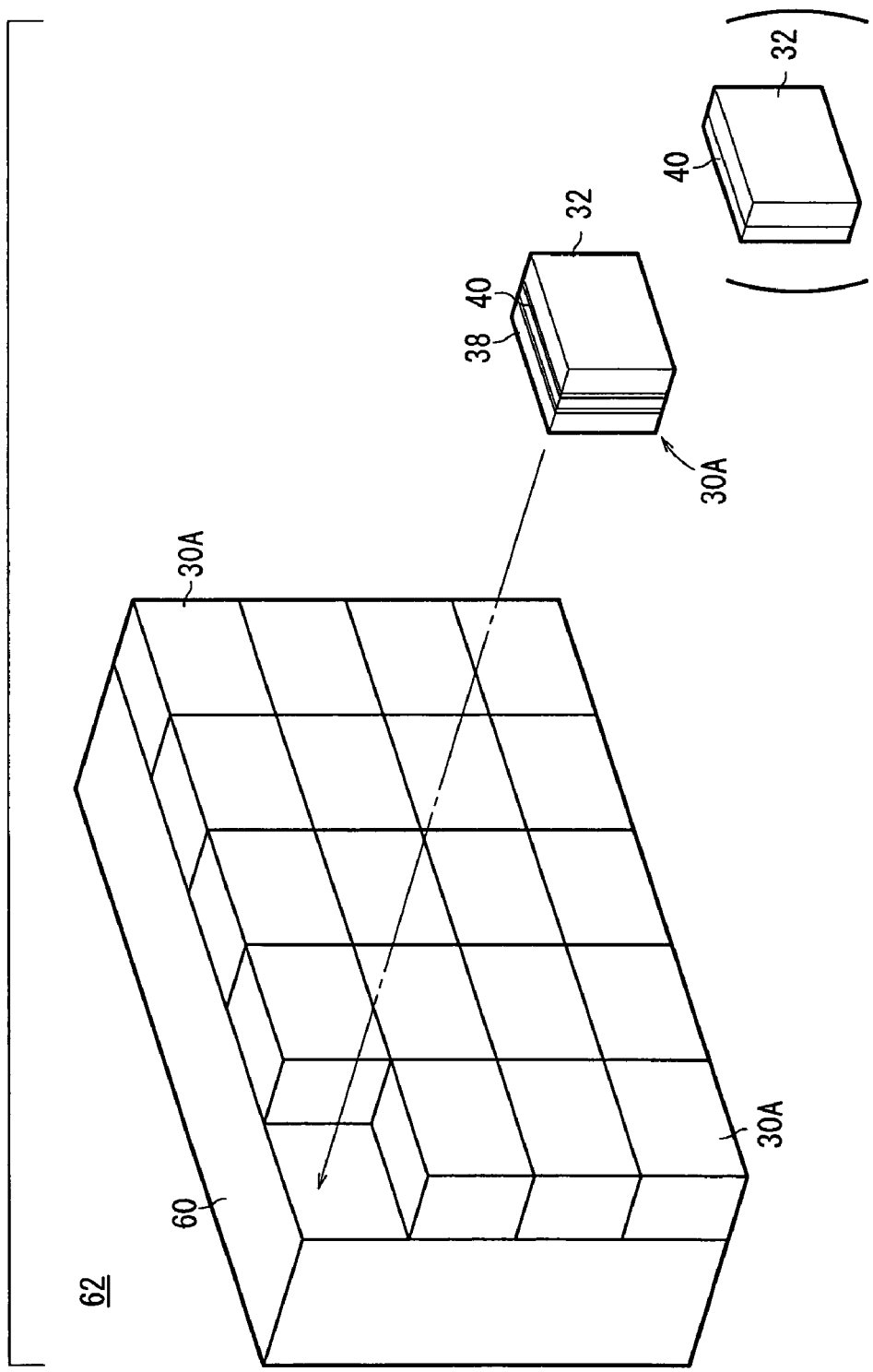
FIG. 37 is a perspective view of a large-screen display device.

A plurality of display devices 30A according to the first specific example are arranged in a matrix on the back of a single light guide plate 60, as shown in FIG. 37, thus providing a single large-screen display device 62.

The large-screen display device 62 has a matrix of display devices 30A, five in a horizontal direction and four in a vertical direction, on the back of the light guide plate 60, such that 640 pixels are arrayed in the horizontal direction and 480 pixels are arrayed in the vertical direction, in order to comply with VGA (Video Graphics Array) standards, for example.

The light guide plate 60 comprises a glass plate, an acrylic plate, or the like whose light transmittance is large and uniform in the visible range. The displace devices 30A are connected by wire bonding, soldering, end-face connectors, reverse-side connectors, etc. for supplying signals therebetween.

The light guide plate 60 and the optical waveguide plates 38 of the display devices 30A should preferably have similar refractive indexes. If the light guide plate 60 and the optical waveguide plates 38 are bonded to each other, then a transparent adhesive or liquid may be used to bond them together. Such a transparent adhesive or liquid should preferably have a uniform and high light transmittance in the visible range, like the light guide plate 60 and the optical waveguide plates 38, and a refractive index close to those of the light guide plate 60 and the optical waveguide plates 38 for achieving screen brightness.

In the above embodiment, the surfaces of the optical waveguide plates 38 of the display devices 30A are bonded to the light guide plate 60, making up the large-screen display device 62. As indicated by the parentheses in FIG. 37, the optical waveguide plates 38 may be dispensed with, the end faces of the spacers 44 (see FIG. 35) may be directly bonded to the light guide plate 60, making up the large-screen display device 62.

The actuator substrate 32 of the display device 30A has cavities 64 defined therein at positions in alignment with the respective actuators 34 and forming vibrating sections 66 to be described later. The cavities 64 communicate with the exterior through small-diameter through holes (not shown) defined in the other end of the actuator substrate 32.

Of the actuator substrate 32, portions where the cavities 64 are defined are thin, and the other portions are thick. The thin portions are of a structure easily vibratable under external stresses and function as the vibrating sections 66. The portions other than the cavities 64 are thick and function as fixed sections 68 supporting the vibrating sections 66.

Figure 38:
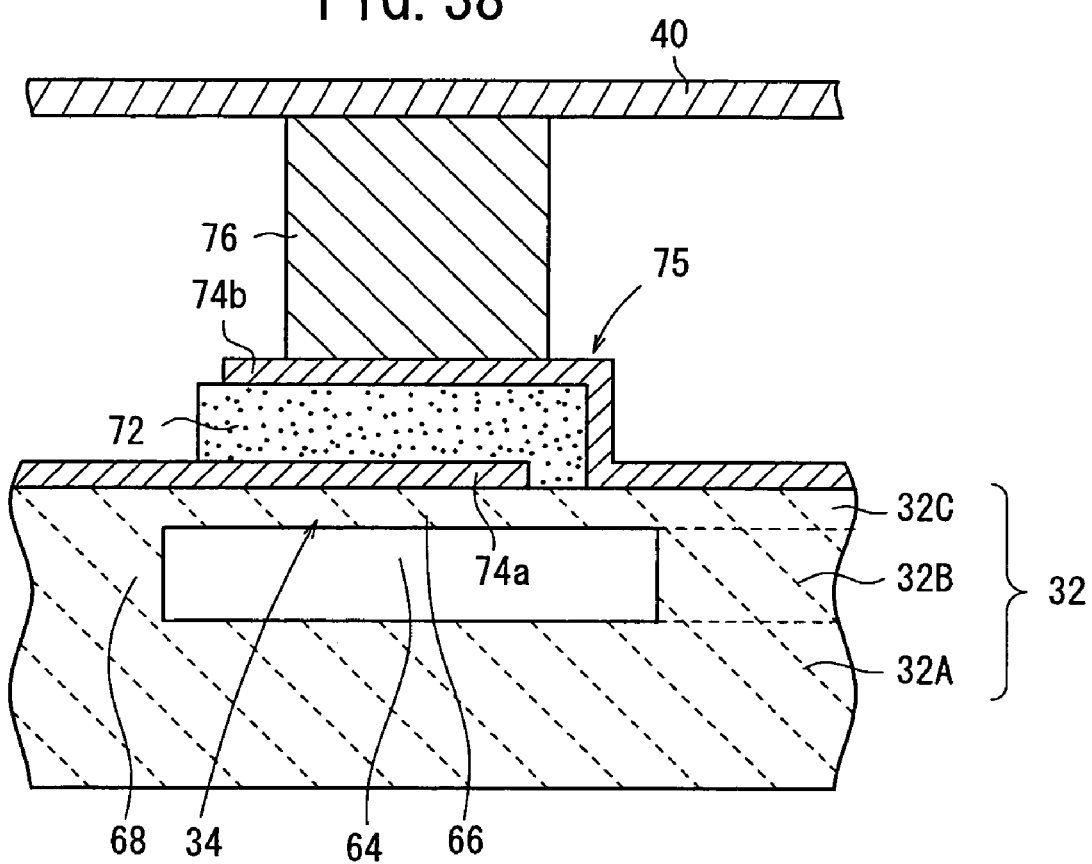
FIG. 38 is a cross-sectional view showing a structure of actuator.

As shown in FIG. 38, the actuator substrate 32 comprises a laminated assembly of a substrate layer 32A as a lower-most layer, a spacer layer 32B as an intermediate layer, and a thin layer 32C as an uppermost layer, and can be recognized as a unitary structural body in which the cavity 64 is defined in the portion of the spacer layer 32B that corresponds to the actuator 34. The substrate layer 32A functions as a stiffening substrate and also as a wiring substrate. The actuator substrate 32 may be integrally sintered or may subsequently be added.

The substrate layer 32A, the spacer layer 32B, and the thin layer 32C may be made of a material which is highly resistant to heat, highly strong, and highly tough, e.g., stabilized zirconium oxide, partially stabilized zirconium oxide, aluminum oxide, magnesium oxide, titanium oxide, spinel, mullite, or the like. The substrate layer 32A, the spacer layer 32B, and the thin layer 32C may be made of one material or different materials.

The thin layer 32C has a thickness of 50 µm or preferably in the range from 3 µm to 20 µm for allowing the actuator 34 to be displaced largely.

The spacer layer 32B may be present as providing the cavities 64 in the actuator substrate 32, and is not limited to any thickness. However, the thickness of the spacer layer 32B may be determined depending on the purpose for which the cavities 64 are used. It is preferable that the spacer layer 32B do not have a thickness greater than necessary for the actuator 34 to function, and should be thin. That is, the thickness of the spacer layer 32B should preferably be as large as the displacement of the actuator 34.

With this arrangement, the flexing of the thin portion (the vibrating section 66) is limited by the substrate layer 32A which is close thereto in the direction in which the thin portion flexes, and the thin portion is prevented from being broken under unintended external forces applied thereto. It is possible to stabilize the displacement of the actuator 34 at a particular value by using the ability of the substrate layer 32A to limit the flexing of the thin portion.

Since the thickness of the actuator substrate 32 itself and its flexural rigidity can be reduced by thinning the spacer layer 32B, when the actuator substrate 32 is bonded and fixed to a separate body, buckling or the like of the actuator substrate 32 with respect to the separate body (e.g., the optical waveguide plate 38 or the joint plate 40) can effectively be corrected for increased bonding and fixing reliability.

In addition, as the entire actuator substrate 32 is thin, the amount of material used to manufacture the actuator substrate 32 is reduced. This structure is therefore advantageous also from the standpoint of manufacturing cost. Specifically, the thickness of the spacer layer 32B should preferably in the range from 3 µm to 50 µm and more preferably in the range from 3 µm to 20 µm.

Because the spacer layer 32B is thin, the thickness of the substrate layer 32A is equal to or greater than 50 µm, preferably in the range from 80 µm to 300 µm, for the purpose of reinforcing the entire actuator substrate 32.

A specific example of the actuator 34 and the picture element assembly 52 will be described below with reference to FIGS. 35 and 38. FIG. 35 shows a structure in which light shield layers 70 are disposed between the spacers 44 interposed between the optical waveguide plate 38 and the joint plate 40 and the optical waveguide plate 38.

As shown in FIG. 38, the actuator 34 has, in addition to the vibrating section 66 and the fixed section 68, an actuator body 75 comprising a piezoelectric/electrostrictive layer 72 directly formed on the vibrating section 66, and a pair of electrodes 74a, 74b formed on upper and lower surfaces of the piezoelectric/electrostrictive layer 72.

The electrodes 74a, 74b may be formed on the upper and lower sides of the piezoelectric/electrostrictive layer 72, as shown in FIG. 38, or on only one side thereof, or on only the upper side of the piezoelectric/electrostrictive layer 72.

If the electrodes 74a, 74b are formed on only the upper side of the piezoelectric/electrostrictive layer 72, then the electrodes 74a, 74b may be of a planar shape having a number of comb teeth complementarily facing each other, or may be of a swirling or branched shape as disclosed in Japanese Laid-Open Patent Publication No. 10-78549 and Japanese Laid-Open Patent Publication No. 2001-324961.

The electrodes 74a, 74b are made of a metal such as aluminum, titanium, chromium, iron, cobalt, nickel, copper, zinc, niobium, molybdenum, ruthenium, palladium, rhodium, silver, tin, tantalum, tungsten, iridium, platinum, gold, lead, or the like, or an alloy of at least two of these metals. Alternatively, the electrodes 74a, 74b may be made of an electrically conductive material such as a cermet containing the above metal or alloy to which there is added aluminum oxide, titanium oxide, zirconium oxide, cerium oxide, copper oxide, or the like, or containing the metal or alloy in which the material of the actuator substrate 32 and/or the same material as a piezoelectric/electrostrictive material to be described below is dispersed.

The electrodes 74a, 74b may be formed on the actuator substrate 32 by a film forming process such as photolithography, screen printing, dipping, coating, electrophoresis, ion beam process, sputtering, vacuum evaporation, ion plating, chemical vapor deposition (CVD), plating, etc.

Preferred materials that can be used for the piezoelectric/electrostrictive material include lead zirconate, lead manganese tungstenate, bismuth sodium titanate, bismuth ferrate, sodium potassium niobate, bismuth strontium tantalate, lead magnesium niobate, lead nickel niobate, lead zinc niobate, lead manganese niobate, lead magnesium tantalate, lead nickel tantalate, lead antimony tinate, lead titanate, barium titanate, barium copper tungstenate, lead magnesium tungstenate, lead cobalt niobate, or a composite oxide comprising at least two of the above compounds. The piezoelectric/electrostrictive material may contain a solid solution of an oxide of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, copper, etc.

An antiferroelectric layer may be used in place of the piezoelectric/electrostrictive layer 72. In this case, lead zirconate, a composite oxide of lead zirconate and lead tinate, or a composite oxide of lead zirconate, lead tinate, and lead niobate may be used. These antiferroelectric materials may contain a solid solution of the above elements.

A material produced by adding lithium bithmuthate, lead germanate, or the like to the above material, e.g., a material produced by adding lithium bithmuthate or lead germanate to a composite oxide of lead zirconate, lead titanate, and lead magnesium niobate, is preferable because it allows the piezoelectric/electrostrictive layer 72 to be sintered at a low temperature and achieve high material characteristics. The piezoelectric/electrostrictive layer 72 can also be sintered at a low temperature by adding glass (e.g., silicate glass, borate glass, phosphate glass, germanate glass, or a mixture thereof). However, since excessively adding the glass would invite deterioration of material characteristics, it is desirable to determine an amount of glass to be added depending on the required characteristics.

As a pair of electrodes 74a and 74b, if the electrode 74a is formed on the lower surface of the piezoelectric/electrostrictive layer 72 and the electrode 74b is formed on the upper surface of the piezoelectric/electrostrictive layer 72, as shown in FIG. 38, then it is possible to flexurally displace the actuators 34 in one direction so as to be convex toward the cavities 64, as shown in FIG. 35, or alternatively it is possible to flexurally displace the actuators 34 in the other direction so as to be convex toward the joint plate 40.

The opening width (area) of the cavity 64 should preferably be larger than the width (area) of the actuator body 75. However, the opening width (area) of the cavity 64 may be equal to or slightly smaller than the width (area) of the actuator body 75.

A displacement transmitter 76 for transmitting displacement of the actuator 34 to the joint plate 40 is disposed above the actuator 34. The displacement transmitter 76 may comprise an adhesive which may be a filler-containing adhesive. The joint plate 40 and the end face of the displacement transmitter 76 may be fixed (joined) to each other, or may simply be held in contact with each other. The term "connect" will be used below as covering "fix" and "contact". Thus, the actuator 34 and the joint plate 40 are connected to each other by the displacement transmitter 76.

The displacement transmitter 76 is not limited to any material, but may preferably be made of thermoplastic resin, thermosetting rein, photosetting resin, moisture-absorption-setting resin, cold-setting resin, or the like.

Specifically, acrylic resin, modified acrylic resin, epoxy resin, modified epoxy resin, silicone resin, modified silicone resin, vinyl acetate resin, ethylene-vinyl acetate copolymer resin, vinyl butyral resin, cyanoacrylate resin, urethane rein, polyimide resin, metacryl resin, modified metacryl resin, polyolefin resin, special silicone modified polymer, polycarbonate resin, natural rubber, synthetic rubber, etc. are given by way of example.

Particularly, vinyl butyral resin, acrylic resin, modified acrylic resin, epoxy resin, modified epoxy resin, or a mixture of two or more of these resins is preferable for their excellent bonding strength. Among others, epoxy resin, modified epoxy resin, or a mixture thereof is preferable.

The joint plate 40 is of a material and thickness for providing an optimum rigidity to compensate for the displacement of an actuator which fails to be displaced (defective actuator) due to the displacement of a normal actuator 34 that is connected to the joint plate 40.

Specifically, the joint plate 40 may be made of a metal, ceramics, glass, or an organic resin, but is not limited to any particular materials insofar as they are capable of the functions thereof as described above. For example, SUS304 (Young's modulus: 193 GPa, coefficient of linear expansion: $17.3 \times 10^{-6}/C.°$), SUS403 (Young's modulus: 200 GPa, coefficient of linear expansion: $10.4 \times 10^{-6}/C.°$), zirconium oxide (Young's modulus: 245.2 GPa, coefficient of linear expansion: $9.2 \times 10^{-6}/C.°$), and glass (e.g., Corning 0211, Young's modulus: 74.4 GPa, coefficient of linear expansion: $7.38 \times 10^{-6}/C.°$) are preferably used. In the present embodiment, the joint plate 40 comprises an SUS plate having a thickness preferably in the range from 10 μm to 300 μm.

The spacers 42, 44 should preferably be made of a material which is not deformable with heat and pressure, e.g., thermosetting resin such as epoxy resin or the like, photosetting resin, moisture-absorption-setting resin, cold-setting resin, or the like.

A filler may be contained in the spacers 42, 44. The spacers 42, 44 with a filler contained therein has higher hardness and greater heat resistance, strength, and dimensional stability than spacers with no filler contained therein. The spacers with a filler contained therein are deformable by a much smaller amount than spacers with no filler contained therein due to an increase in the temperature in the display device 30A. Stated otherwise, the hardness, heat resistance, and strength of the set resin can be increased and the amount by which it thermally expands and shrinks can be greatly reduced by including a filler in the spacers.

As shown in FIG. 35, the picture element assembly 52 may comprise a laminated assembly of a light scattering layer 78 and a transparent layer 80 that are formed on the joint plate 40.

The picture element assembly 52 may comprise, in addition to the laminated assembly, any of various combinations including (1) a color filter or a colored scattering body interposed between the transparent layer 80 and the light scattering layer 78, (2) a light reflecting layer disposed beneath the light scattering layer 78, and (3) a laminated assembly of a colored scattering body and the transparent layer 80.

The formation of films such as the electrodes 74a, 74b, the piezoelectric/electrostrictive layer 72, and the spacer 42 on the actuator substrate 32, and the formation of films such as the picture element assembly 52 and the spacer 44 on the joint plate 40 are not limited to any processes, but may be performed by various known film formation processes.

For example, films may be grown on the surfaces of the actuator substrate 32 and the joint plate 40 by a film applying process which directly applies a chip-like or web-like film, a thick-film forming process such as a screen printing process, a photolithographic process, a spray dipping process, or a coating process, or a thin-film forming process such as an ion beam process, a sputtering process, a vacuum evaporation process, an ion plating process, a chemical vapor deposition (CVD) process, a plating process, or like, which applies a powder, a paste, a liquid, a gas, ions, or the like as a raw material of a film.

Operation of the display device 30A will briefly be described below with reference to FIGS. 35 and 38. First, light 33 is introduced into the optical waveguide plate 38 from an end thereof, for example. With the picture element assemblies 52 held out of contact with the optical waveguide plate 38, all of the light 33 is totally reflected within the optical waveguide plate 38 without passing through front and back surfaces thereof by adjusting the magnitude of the refractive index of the optical waveguide plate 38. The refractive index of the optical waveguide plate 38 is desirably in the range from 1.3 to 1.8, or more desirably in the range from 1.4 to 1.7.

In this example, when the actuators 34 are in a natural state, since the end faces of the picture element assemblies 52 contact the back of the optical waveguide plate 38 by a distance equal to or smaller than the wavelength of the light 33, the light 33 is reflected by the surfaces of the picture element assemblies 52 as scattered light 82. The scattered light 82 is partly reflected within the optical waveguide plate 38, but mostly passes through the front face (surface) of the optical waveguide plate 38 without being reflected by the optical waveguide plate 38. Therefore, all of the actuators 34 are turned on, emitting light whose color corresponds to the color of the color filters and light scattering layers 78 included in the picture element assemblies 52. As the pixels corresponding to all the actuators 34 are turned on, white light is displayed on the screen of the display device 30A.

Furthermore, a low-level voltage (e.g., −10 V) is applied as a drive voltage between the electrodes 74b, 74a of the actuators 34 to press the end faces of the picture element assemblies 52 against the back of the optical waveguide plate 38 for more reliably turning on the actuators 34 for stable display.

When a high-level drive voltage (e.g., 50 V) is then applied between the electrodes 74b, 74a of six actuators 34 corresponding to a certain pixel, those six actuators 34 are flexurally displaced as to be convex toward the cavities 64, i.e., flexurally displaced downwardly, as shown in FIG. 35. Consequently, the drive displacement is transmitted through the displacement transmitters 76 and the joint plate 40 to the picture element assembly 52. The end face of the picture element assembly 52 is now spaced from the optical waveguide plate 38. The pixel corresponding to the picture element assembly 52 is turned off, extinguishing the light emission.

Therefore, the display device 30A can control whether there is light emission (scattered light 82) on the front face of the optical waveguide plate 38 or not based on whether the picture element assemblies 52 contact the optical waveguide plate 38 or not.

One frame (1/60 sec.) of pixel signals is divided into three times zones (first through third fields), and three-color light sources are switched in each field. For example, light from a red-color light source (R light source) is introduced in the first field, light from a green-color light source (G light source) is introduced in the second field, and light from a blue-color light source (B light source) is introduced in the third field to display a color image with the monochromatic pixel array. In this case, since one picture element assembly 52 provides one pixel, a high resolution can be achieved.

The materials of the major structural components of the display device 30A according to the first specific example have been described above. Materials of other structural components (the light 33, the actuator substrate 32, and the optical waveguide plate 38) will be described below.

The light 33 that is applied to the optical waveguide plate 38 may be in either one of ultraviolet, visible, and infrared ranges. The light source thereof may be an incandescent lamp, a heavy-hydrogen discharge lamp, a fluorescent lamp, a mercury lamp, a metal halide lamp, a halogen lamp, a xenon lamp, a tritium lamp, a light-emitting diode, a laser, a plasma light source, a hot-cathode tube, a cold-cathode tube, or the like.

The vibrating section 66 should preferably be made of a highly heat-resistant material. The reason for this is that if the vibrating section 66 is directly supported by the fixed section 68 without using a heat-resistant material such as an organic adhesive or the like, the vibrating section 66 should preferably be made of a highly heat-resistant material in order to prevent itself from being modified when at least the piezoelectric/electrostrictive layer 72 is formed.

The vibrating section 66 should preferably be made of an electrically insulating material in order to electrically isolate an interconnection (e.g., a row selection line) connected to one electrode 74a of the electrodes 74a, 74b formed on the actuator substrate 32 from an interconnection (e.g., a signal line) connected to the other electrode 74b.

Therefore, the vibrating section 66 may thus be made of a material such as an enameled material where a highly heat-resistant metal or its surface is covered with a ceramic material such as glass or the like. However, ceramics is optimum as the material of the vibrating section 66.

The ceramics of the vibrating section 66 may be stabilized zirconium oxide, aluminum oxide, magnesium oxide, titanium oxide, spinel, mullite, aluminum nitride, silicon nitride, glass, or a mixture thereof. Stabilized zirconium oxide is particularly preferable because it has high mechanical strength, high tenacity, and causes a relatively small chemical reaction with the piezoelectric/electrostrictive layer 72 and the electrodes 74a, 74b even if the vibrating section 66 is thin. Stabilized zirconium oxide includes both stabilized zirconium oxide and partially stabilized zirconium oxide. Stabilized zirconium oxide does not cause a phase transition because it has a crystalline structure such as a cubic structure or the like.

Zirconium oxide causes a phase transition between a monoclinic structure and a tetragonal structure at about 1000° C., and may crack upon such a phase transition. Stabilized zirconium oxide contains 1–30 mol % of calcium oxide, magnesium oxide, yttrium oxide, scandium oxide, ytterbium oxide, sodium oxide, or an oxide of a rare earth metal. The stabilizer should preferably contain yttrium oxide for increasing the mechanical strength of the vibrating section 66. The stabilizer should preferably contain 1.5 to 6 mol % of yttrium oxide, or more preferably 2 to 4 mol % of yttrium oxide, and furthermore should preferably contain 0.1 to 5 mol % of aluminum oxide.

The crystalline phase may be a mixture of cubic and monoclinic systems, a mixture of tetragonal and monoclinic systems, or a mixture of cubic, tetragonal and monoclinic systems. Particularly, a mixture of cubic and monoclinic systems or a mixture of tetragonal and monoclinic systems as a major crystalline phase is most preferable from the standpoint of strength, tenacity, and durability.

If the vibrating section 66 is made of ceramics, then it is constructed of relatively many crystal grains. In order to increase the mechanical strength of the vibrating section 66, the average diameter of the crystal grains should preferably be in the range from 0.05 μm to 2 μm and more preferably in the range from 0.1 μm to 1 μm.

The fixed section 68 should preferably be made of ceramics. The fixed section 68 may be made of ceramics which is the same as or different from the ceramics of the vibrating section 66. As with the material of the vibrating section 66, the ceramics of the fixed section 68 may be stabilized zirconium oxide, aluminum oxide, magnesium oxide, titanium oxide, spinel, mullite, aluminum nitride, silicon nitride, glass, or a mixture thereof.

The actuator substrate 32 used in the display device 30A according to the first specific example is made of a material containing zirconium oxide as a chief component, a material containing aluminum oxide as a chief component, or a material containing a mixture of zirconium oxide and aluminum oxide as a chief component. Particularly preferable is a material chiefly containing zirconium oxide.

Clay or the like may be added as a sintering additive. Components of such a sintering additive need to be adjusted so that the sintering additive does not contain excessive amounts of materials which can easily be vitrified, e.g., silicon oxide, boron oxide, etc. This is because while these easily vitrifiable materials are advantageous in joining the actuator substrate 32 to the piezoelectric/electrostrictive layer 72, they promote a reaction between the actuator substrate 32 and the piezoelectric/electrostrictive layer 72, making it difficult to keep the desired composition of the piezoelectric/electrostrictive layer 72 and resulting in a reduction in the device characteristics.

Specifically, silicon oxide, etc. in the actuator substrate 32 should preferably be limited to 3% by weight or less or more preferably to 1% by weight or less. The chief component referred to above is a component which occurs at 50% by weight or more.

The optical waveguide plate 38 has such a refractive index that the light 33 introduced therein is totally reflected within the optical waveguide plate 38 without passing through front and back surfaces thereof. The optical waveguide plate 38 is required to have a uniform and high transmittance in the wavelength range of the introduced light 33. The optical waveguide plate 38 is not limited to any materials insofar as they have the above characteristics. Specific materials thereof include glass, quartz, light-transmissive plastics such as acrylic resin or the like, light-transmissive ceramics, or a plural-layer structural body of materials having different refractive indexes, or a material having a coating layer on its surface.

Operation and advantages of the display device 30A according to the first specific example will be described with respect to comparison between an inventive example and a comparative example with reference to FIGS. 39A through 42.

Figure 52:
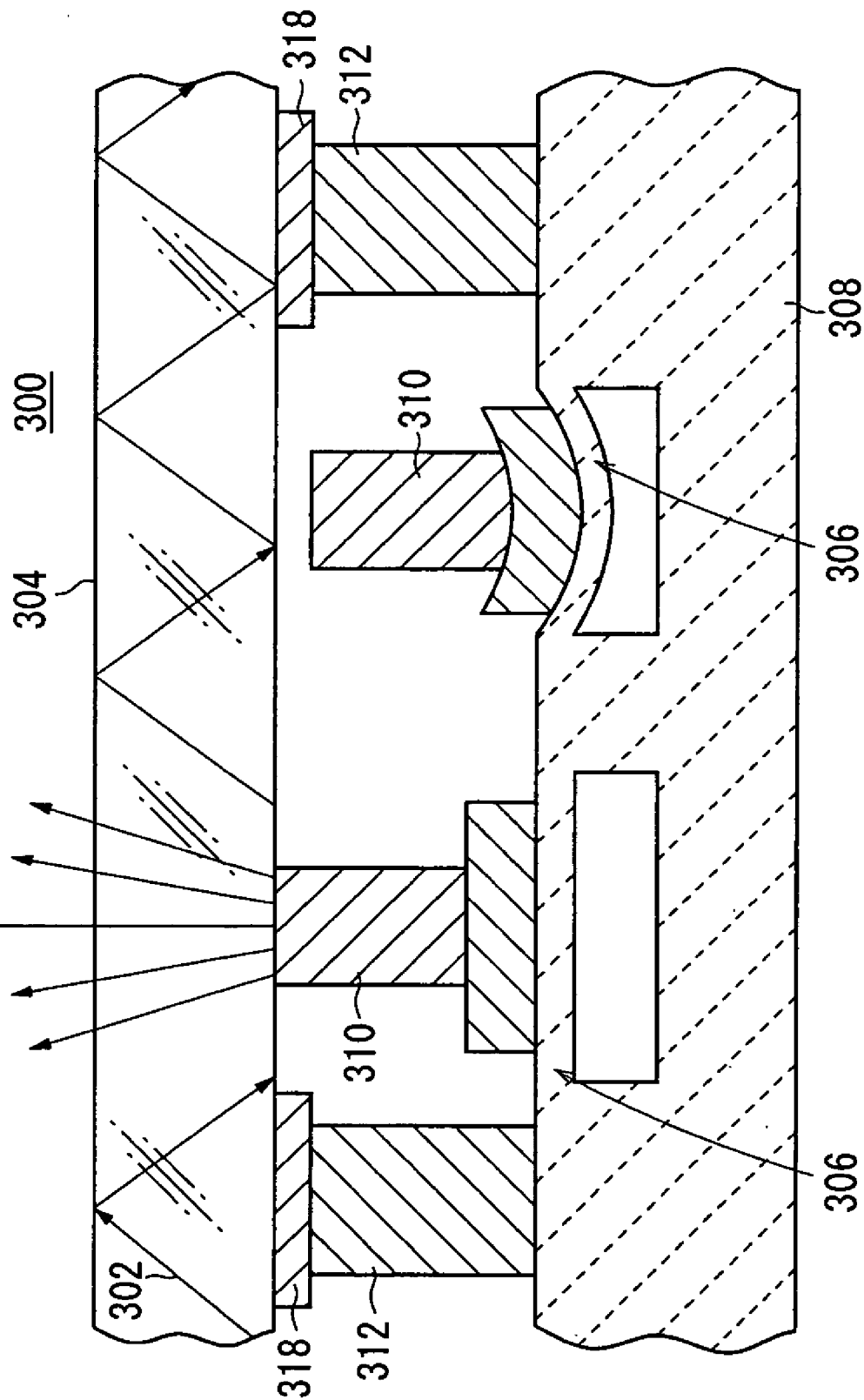
FIG. 52 is a view showing a conventional display device.
Figure 53:
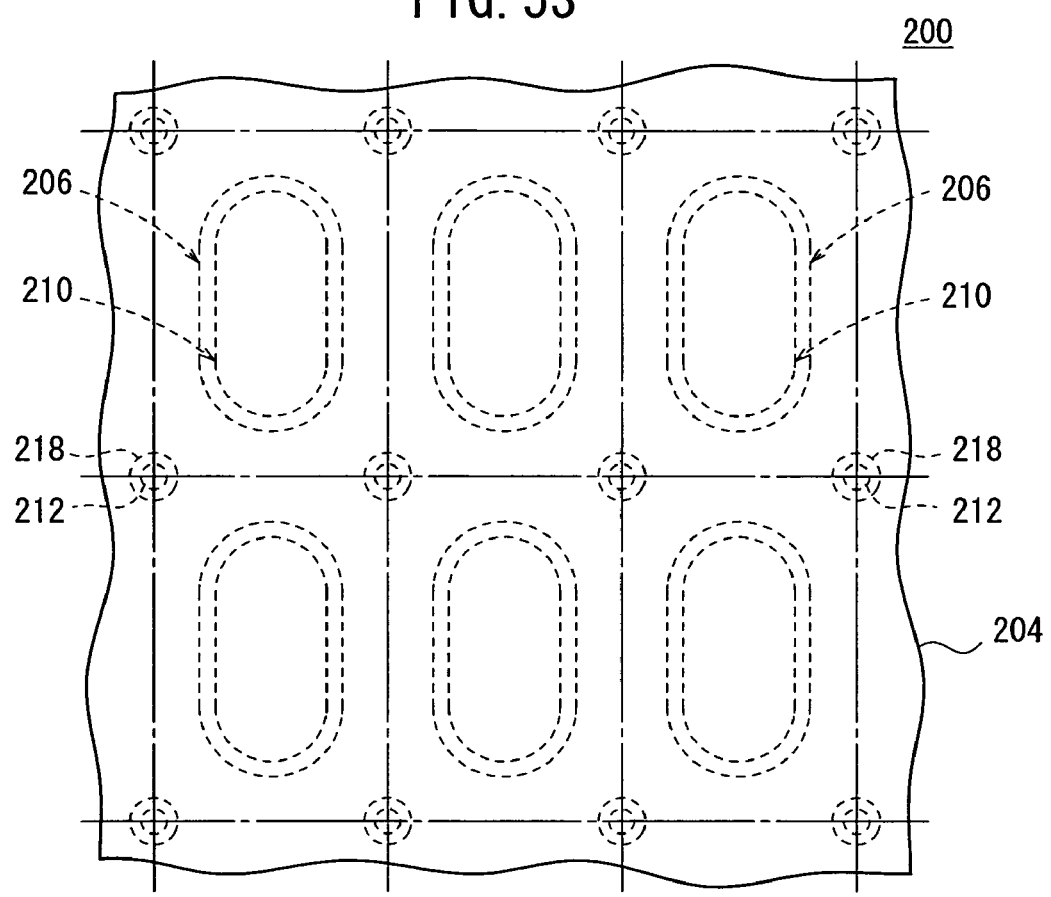
FIG. 53 is a plan view of the conventional display device as viewed from an optical waveguide plate thereof.

The inventive example has the same structure as the display device 30A according to the first specific example, and the comparative example has the same structure as a conventional display device 300 shown in FIG. 52.

First, the difference between aperture ratios per pixel will be described below. According to the comparative example, in terms of one cell 50, as shown in FIG. 39B, the aperture ratio is determined by a contact area of six picture element assemblies 310, for example, formed on respective actuators 306 on an actuator substrate 308 shown in FIG. 52. Since the area of each of the picture element assemblies 310 is limited by the area of the corresponding actuator 306 and there is a gap between adjacent picture element assemblies 310, the end faces of the picture element assemblies 310 serve as an emission region 90 (shown shaded in FIG. 39B), and the gap between the picture element assemblies 310 serves as a non-emission region 92. Therefore, the emission region 90 is defined by six dot-shaped regions surrounded by the non-emission region 92.

Figure 39A:
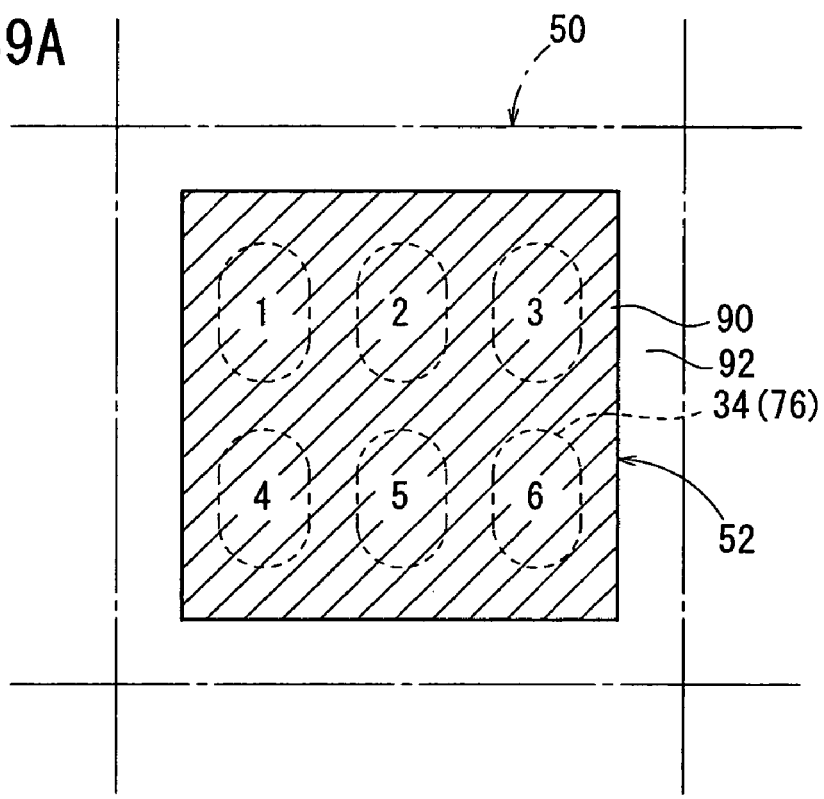
FIG. 39A is a view showing a planar shape of a picture element assembly according to an inventive example.
Figure 39B:
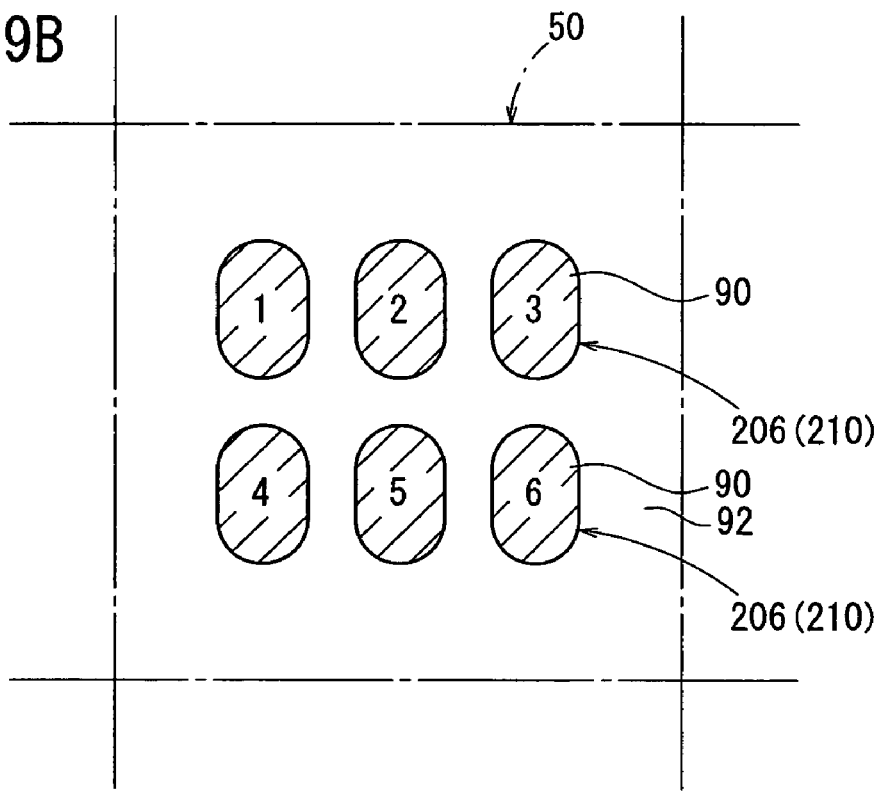
FIG. 39B is a view showing a planar shape of a picture element assembly according to a comparative example.

According to the inventive example, in terms of one cell 50, as shown in FIG. 39A, the aperture ratio is determined by a contact area of one picture element assembly 52 formed on the joint plate 40 shown in FIG. 35. In this case, the end face of the picture element assembly 52 serves as an emission region 90, and the other portion serves as a non-emission region 92. The emission region 90 can freely be established irrespective of the areas of the actuator 34 on the actuator substrate 32 and the displacement transmitter 76, and can include the non-emission region 92 in the comparative example. The emission region 90 can be widened to a range close to the cell 50.

According to the inventive example, the aperture ratio can be made much greater than the aperture ratio according to the comparative example.

Figure 40:
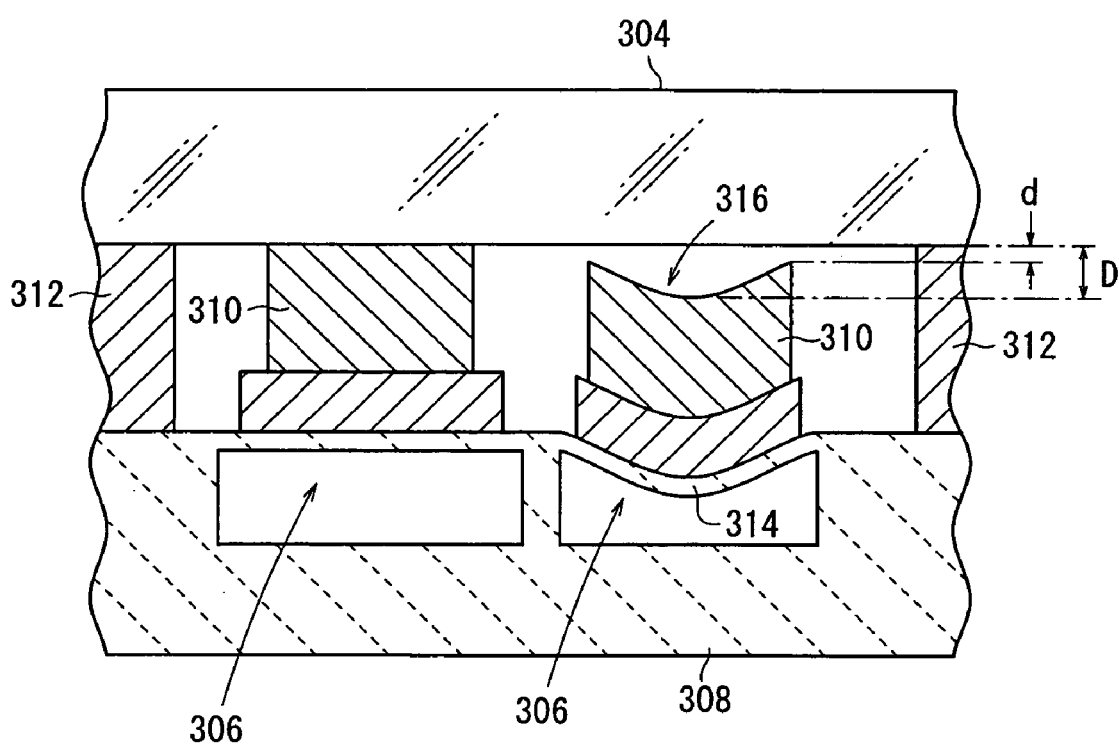
FIG. 40 is a view illustrative of the difference between the displacements of actuators per pixel according to the comparative example.

The difference between the amounts of displacement of actuators per pixel will be described below. According to the comparative example, as shown in FIG. 40, the voltage applied to the actuator 306 is controlled to change the amount of displacement of the picture element assembly 310 to provide a state (emitted state) in which the picture element assembly 310 contacts an optical waveguide plate 304 and a state (extinguished state) in which the picture element assembly 310 is spaced from the optical waveguide plate 304.

According to the comparative example, because the picture element assembly 310 directly formed on the actuator 306 is brought into and out of contact with the optical waveguide plate 304, the shape of a vibrating section 314 of the actuator 306 is reflected to a certain extent on the upper surface of the picture element assembly 310. Therefore, when the picture element assembly 310 is spaced from the optical waveguide plate 304, the upper surface of the picture element assembly 310 is made concave toward the optical waveguide plate 304, i.e., forms a concavity 316. Therefore, when a voltage is applied to the actuator 306 to displace the picture element assembly 310 away from the optical waveguide plate 304, if the amount of displacement is not sufficient, then the upper end of the picture element assembly 310 remains in contact with the optical waveguide plate 304, failing to achieve a fully extinguished state.

Specifically, when the picture element assembly 310 is displaced away from the optical waveguide plate 304, the central area of the end face of the picture element assembly 310 is largely displaced as it corresponds to a region of the actuator 306 where the maximum amount of displacement is obtained. However, the displacement of the peripheral edge area of the picture element assembly 310 is small as it corresponds to a region of the actuator 306 where the amount of displacement is small. For example, if a voltage applied to achieve a certain amount of displacement at the central area of the picture element assembly 310 is represented by V1 and a voltage applied to achieve the same amount of displacement at the peripheral edge area of the picture element assembly 310 by V2, then V2>V1. The difference between the amounts of displacement at the above areas manifests itself if the area of the end face of the picture element assembly 310 is increased for the purpose of increasing the aperture ratio of the pixel.

If the distance between the optical waveguide plate 304 and the upper end of the picture element assembly 310 has to be equal to or greater than a distance d in order to space the picture element assembly 310 fully from the optical waveguide plate 304, then the amount of displacement of the peripheral edge area of the picture element assembly 310 needs to be equal to or greater than the distance d. Therefore, the voltage to be applied to the actuator 306 has to be determined in view of the region of the actuator 306 which corresponds to the peripheral edge area of the picture element assembly 310.

When the distance between the upper end of the picture element assembly 310 and the optical waveguide plate 304 is equal to or greater than d, the amount of displacement of the central area of the end face of the picture element assembly 310 reaches a distance D which is greater than the distance d. For bringing the picture element assembly 310 into contact with the optical waveguide plate 304, it takes time until the bottom of the concavity 316 contacts the optical waveguide plate 304, posing a limitation on efforts to increase the response.

Figure 41:
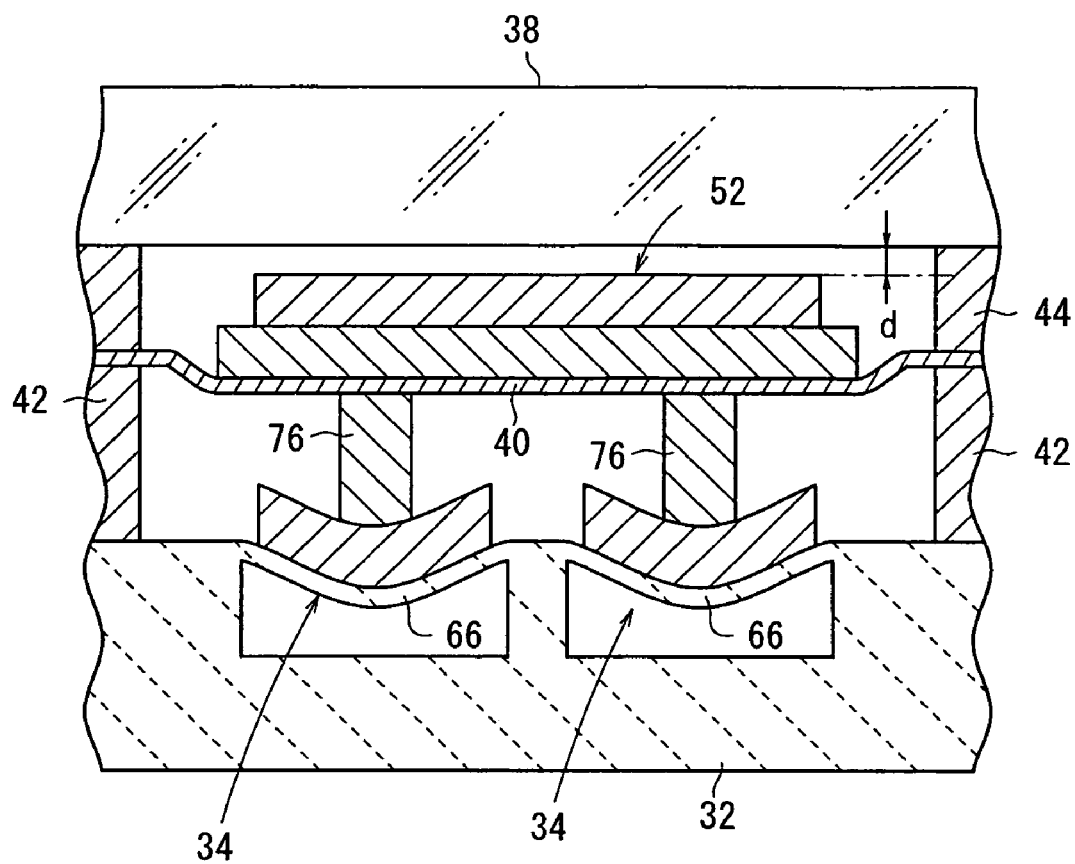
FIG. 41 is a view illustrative of the difference between the displacements of actuators per pixel according to the inventive example.

According to the inventive example, as shown in FIG. 41, the voltage applied to the actuator 34 is controlled, and the displacement thereof is transmitted to the displacement transmitter 76 and the joint plate 40 to change the amount of displacement of the picture element assembly 52 to provide a state (emitted state) in which the picture element assembly 52 contacts the optical waveguide plate 38 and a state (extinguished state) in which the picture element assembly 52 is spaced from the optical waveguide plate 38.

In this case, the picture element assembly 52 formed on the joint plate 40 has a flat end face regardless of the shape of the vibrating section 66 of the actuator 34. Moreover, since the aperture ratio of the pixel is determined by the picture element assembly 52 formed on the joint plate 40 irrespective of the cross-sectional area of the displacement transmitter 76 formed on the actuator 34, the displacement transmitter 76 can be of a narrow configuration. Thus, the displacement transmitter 76 can be installed in a central region of the actuator 34 where the maximum amount of displacement is obtained, and the amount of displacement of the displacement transmitter 76 can be set to a value close to the maximum amount of displacement of the actuator 34.

If the distance between the optical waveguide plate 38 and the upper end of the picture element assembly 52 is equal to or greater than the distance d in order to space the picture element assembly 52 fully from the optical waveguide plate 38, then the voltage to be applied to the actuator 34 may be determined in view of the displacement of the region of the actuator 34 where the maximum amount of displacement is obtained. The voltage can thus be much lower than the voltage in the comparative example. As a result, the power consumption can be reduced, the voltage and cost of the driver circuit can be lowered, and the reliability can be increased.

Changes in brightness due to defective actuators will be described below with reference to FIGS. 39A through 42.

According to the comparative example, in terms of one cell 50, as shown in FIG. 39B, one pixel is made up of six picture element assemblies 210, for example, formed on the respective actuators 306 on the actuator substrate 308 (see FIG. 32).

According to the inventive example, in terms of one cell 50, as shown in FIG. 39A, one pixel is made up of one picture element assembly 52 formed on the joint plate 40 (see FIG. 41). Six actuators 34 are present below the joint plate 40.

Numbers 1, 2, 3, . . . 6 shown in FIGS. 39A and 39B represent defective actuators as they increase in the sequence of the numbers.

Figure 42:
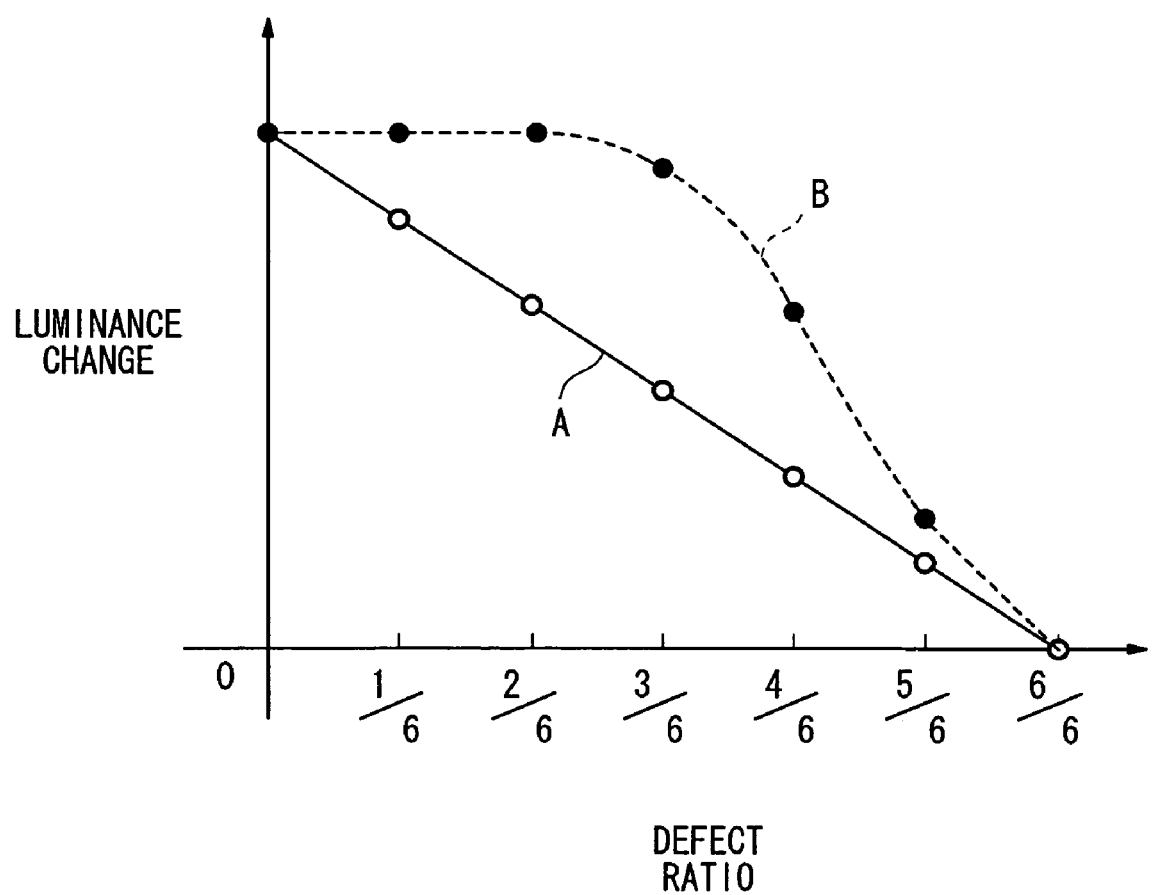
FIG. 42 is a characteristic diagram showing luminance changes when a pixel is turned on and off, with respect to actuator defect ratios (the number of defective actuators/the number of actuators making up one pixel)

FIG. 42 shows a luminance change when the pixel is turned on and off with respect to the defect ratio (the number of defective actuators/the number of actuators that make up one pixel) of the actuators 206 or 34.

According to the comparative example, as the number of defective actuators increase in the sequence shown in FIG. 39, the luminance change of the comparative example falls in proportion to the increase in the number of defective actuators as indicated by the solid-line curve A in FIG. 42.

According to the inventive example, as indicated by the broken-line curve B in FIG. 42, the luminance change does not substantially fall if the defect ratio of the actuators 34 is equal to or smaller than 2/6, and the luminance change falls by about 5% if the defect ratio is 3/6. According to the inventive example, therefore, it is possible to keep the luminance change at a larger level in the presence of defective actuators than according to the comparative example.

If one pixel is made up of four actuators 34 in an arrangement similar to the inventive example, then the luminance change does not fall at a defect ratio of 1/4 or less. If one pixel is made up of three actuators 34, then the luminance change does not fall at a defect ratio of 1/3 or less.

If one pixel is made up of two actuators in an arrangement similar to the comparative example, then the luminance change falls by 50% at a defect ratio of 1/2 or less. If one pixel is made up of two actuators in an arrangement similar to the inventive example, then the reduction of the luminance change is kept within 25% at a defect ratio of 1/2 or less.

As described above, even if some actuators 34 are defective, the percentage of defective products is reduced, but the percentage of good-quality products is increased, resulting in an increased yield and a reduction in the product cost.

When forces act to displace the joint plate 40 downwardly due to the displacement of a normal actuator 34, the vibrating section 66 of a defective actuator 34 flexes downwardly. Therefore, even in the presence of such a defective actuator 34, the joint plate 40 is displaced according to the displacement of the normal actuator 34 (the region corresponding to the defective actuator 34 is also displaced), causing the picture element assembly 52 to operate normally.

Figure 43:
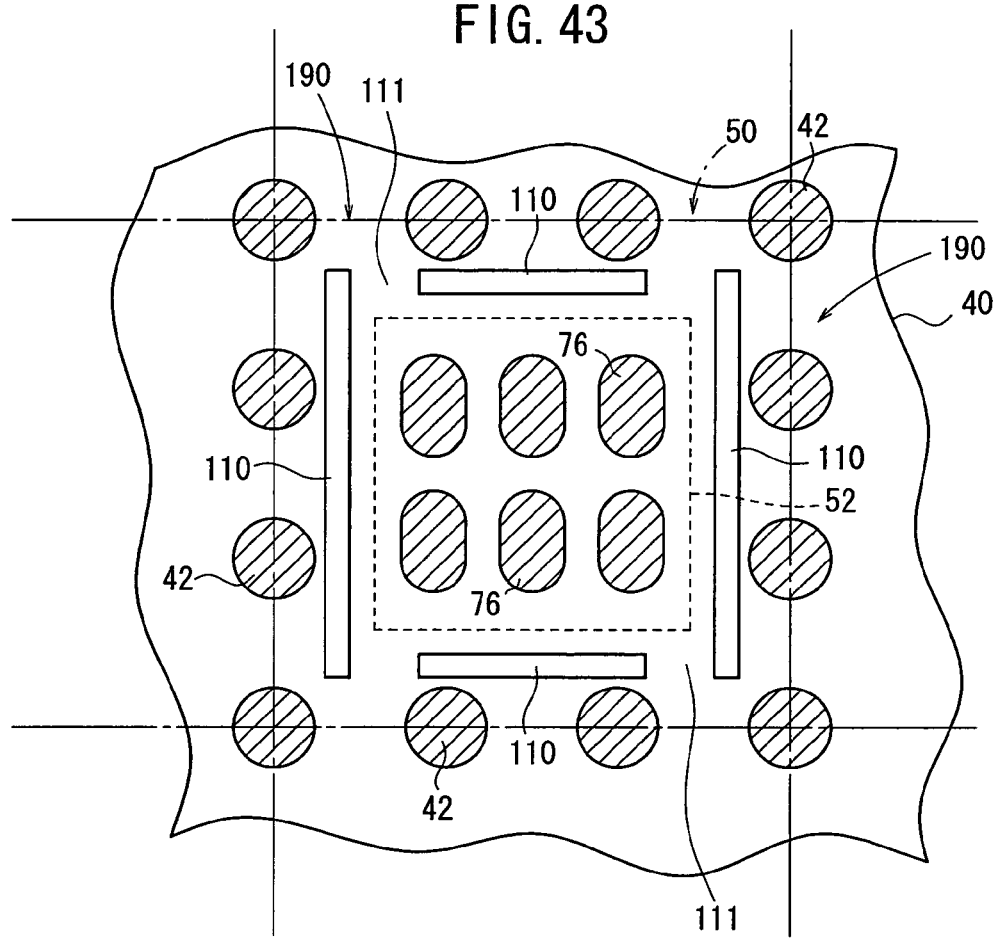
FIG. 43 is a view of a joint plate with slits defined therein closely to spacers, as viewed from a reverse side of the joint plate.

With the display device 30A according to the first specific example as described above, the single joint plate 40 is disposed between the optical waveguide plate 38 and the actuator substrate 32, and the spacers 44 are disposed between the actuator substrate 32 and the joint plate 40 and between the optical waveguide plate 38 and the joint plate 40 in alignment with the respective cells 50. Consequently, in regions of the joint plate 40 close to the spacers 42, 44, the displacement of the joint plate 40 itself tends to be reduced due to the tension of the joint plate 40 (its rigidity is increased). However, as shown in FIG. 43, if slits 110 are formed in portions of the joints 190 between the cells 50 on the joint plate 40 closely to the spacers 42, then the rigidity of the above portions (part of the joints 190) is lowered to avoid the above displacement and lessen thermal stresses and mechanical stresses.

With the slits 110 formed in the joint plate 40, there are formed portions of the joint plate 40 that are narrowed by the slits 110, i.e., portions (hereinafter simply referred to as arms 111) interconnecting the boundary regions (fixed regions) of the cells 50 and regions (movable regions) corresponding to the picture element assemblies 52.

In order to keep the displacement of the regions of the joint plate 40 which correspond to the picture element assemblies 52 and allow the joint plate 40 to be handled in the fabrication process, it is of course suitable to give the arms 111 appropriate rigidity, and it is preferable to optimize the shape, thickness, and structure of the arms 111. More preferably, the movable regions should be of increased flexural rigidity to compensate for the displacement of defective actuators, and the arms 111 should be of reduced flexural rigidity.

The slits 110 can be formed in the joint plate 40 and the thickness of the arms 111 can be made larger than the surrounding regions by a half-etching process, a sand blasting process, or the like. The fixed regions may be clamped and the movable regions may then be lowered in the direction of the thickness thereof to elongate the arms 11, and thereafter the movable regions may be raised in the opposite direction to turn the side elevational shape of the arms 111 into an arch shape, which is effective to reduce the reduction in the displacement under the tension of the arms 111. The planar shape of the arms 111 may be an L shape, a swirling shape, a bellows shape, or the like, as well as the straight shape shown in FIG. 43, thus increasing the length of the arms 111.

A display device 30B according to a second specific example will be described below with reference to FIG. 44. Those parts of the display device 30B which correspond to those of the display device shown in FIG. 35 are denoted by identical reference characters, and will not be described in detail below.

Figure 44:
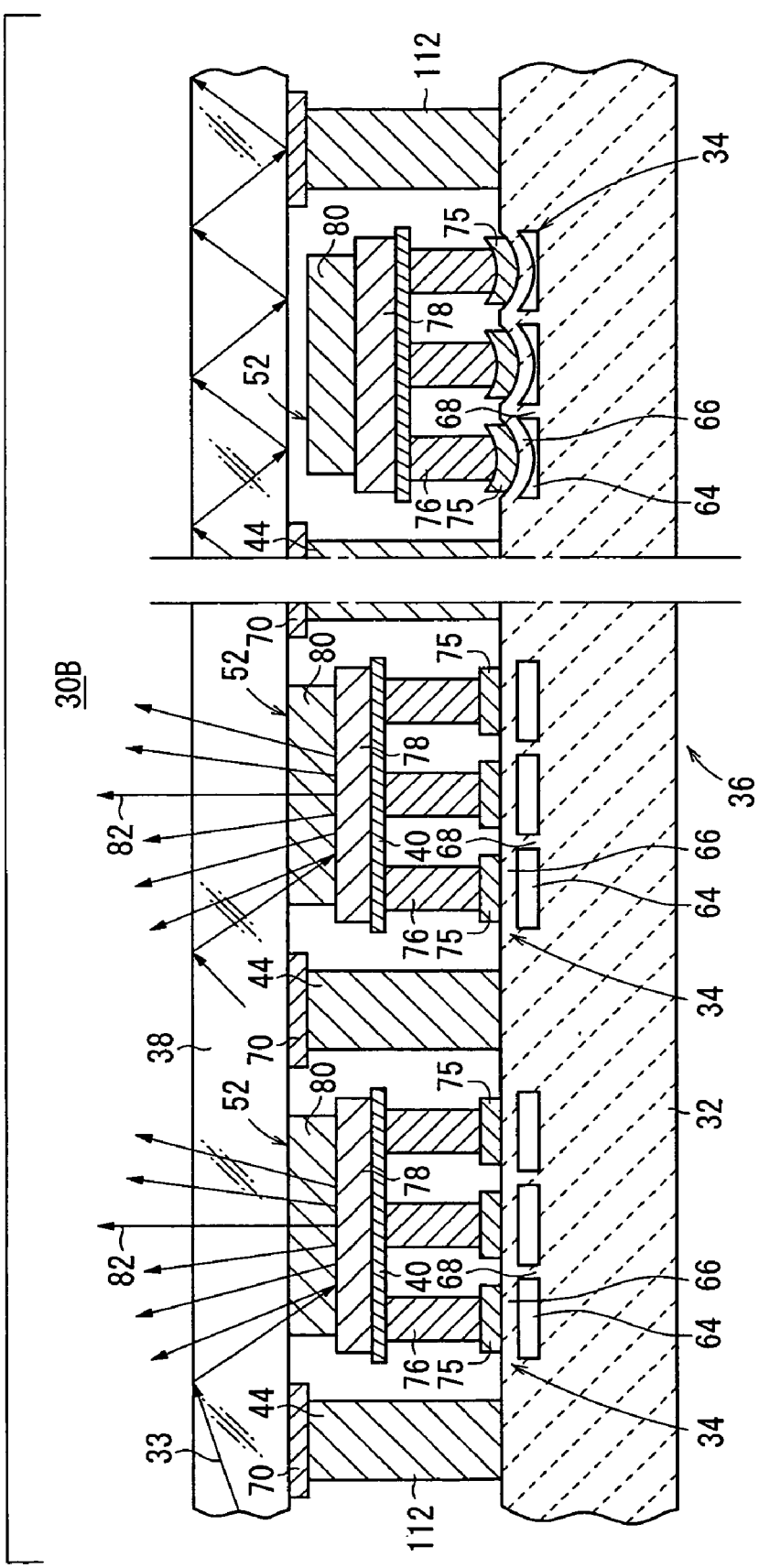
FIG. 44 is a view showing a display device according to a second specific example.

As shown in FIG. 44, the display device 30B according to the second specific example is of substantially the same structure of the display device 30A according to the first specific example, but differs therefrom in that the joint plate 40 is divided into segments corresponding to the cells 50. That is, a plurality of joint plates 40 are arranged in a plane between the optical waveguide plate 38 and the actuator substrate 32.

Therefore, a plurality of spacers 112 are formed between the optical waveguide plate 38 and the actuator substrate 32, and are interposed between the optical waveguide plate 38 and the actuator substrate 32 through gaps between adjacent joint plates 40.

In the display device 30B according to the second specific example, as the joint plate 40 is divided into segments corresponding to the cells 50, the joint plates 40 are free of interference with the tension of adjacent joint plates 40 and the spacers 112 when they are displaced.

If there is a defective actuator, then the joint plate 40 is somewhat affected by a reduction in the displacement due to the defective actuator. If six actuators 34, for example, are assigned to one picture element assembly 52, then a luminance change is 0% when the defect ratio of actuators 34 is 1/6, about 3% when the defect ratio of actuators 34 is 2/6, and about 5% when the defect ratio of actuators 34 is 3/6. Therefore, the display device 30B according to the second specific example has substantially the same performance as the display device 30A according to the first specific example.

Examples in which the actuator device 10D according to the fourth embodiment is applied to other uses than the display device will be described below with reference to FIGS. 45 through 38C.

Figure 45:
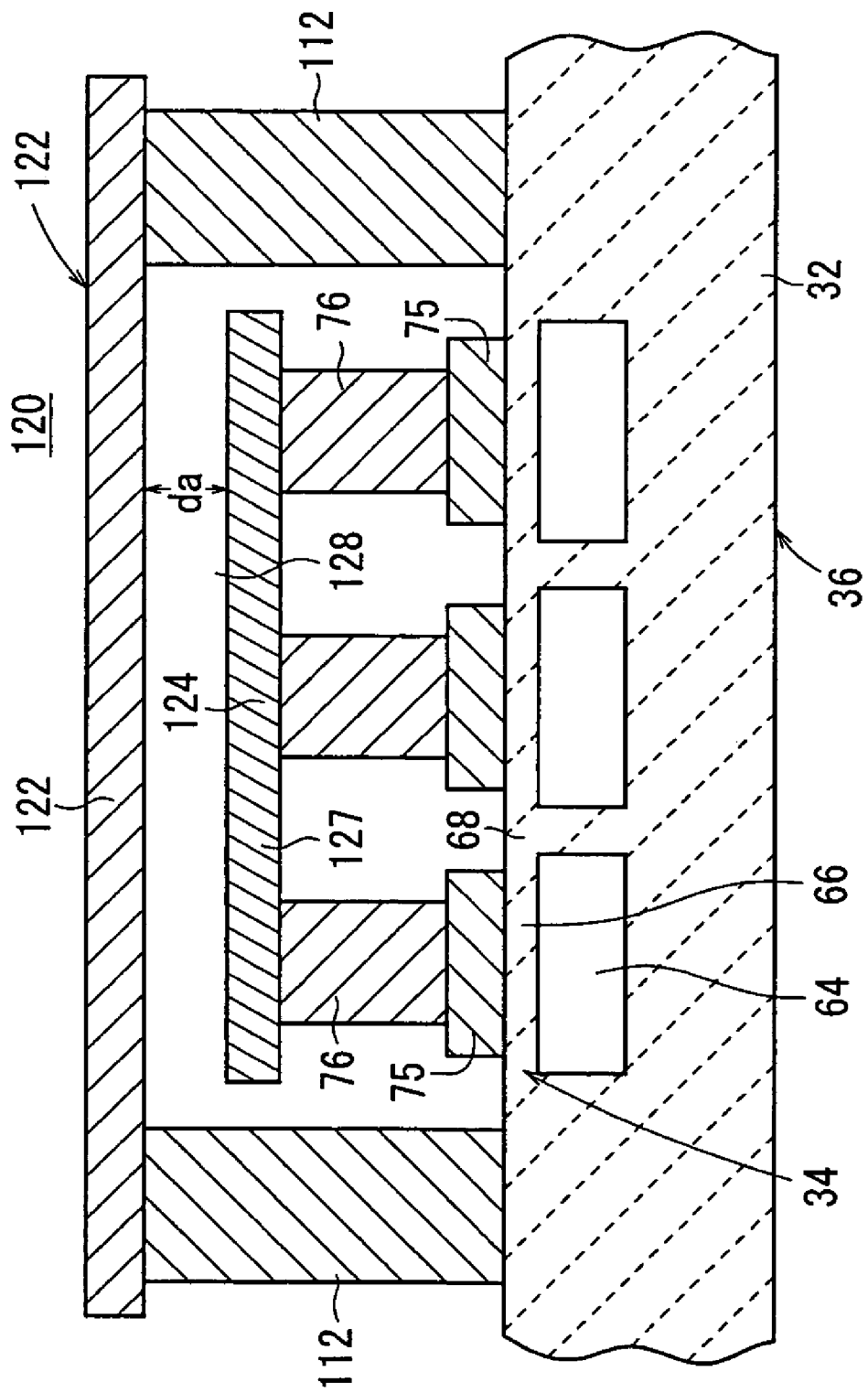
FIG. 45 is a view showing a variable capacitor according to a specific example.

A variable capacitor 120 according to a specific example shown in FIG. 45 has a drive section 36 including a plurality of actuators 34 arranged in a plane on an actuator substrate 32, a fixed electrode 122 comprising a single metal plate disposed facing the drive section 36, and a movable electrode 124 comprising a single metal plate which is disposed between the actuator substrate 32 and the fixed electrode 122 and to which drive forces from the actuators 34 of the drive section 36 are transmitted through displacement transmitters 76. The fixed electrodes 122 are fixed to the actuator substrate 32 by spacers 112 that are interposed between the fixed electrode 122 and the actuator substrate 32.

With the variable capacitor 120, the movable electrode 124 is moved toward and away from the fixed electrode 122 when the actuators 34 are operated. That is, a distance da between the movable electrode 124 and the fixed electrode 122 is changed accurately by the actuators 34, changing the electrostatic capacitance between the electrodes 122, 124.

The dynamic range of the electrostatic capacitance can be increased by increasing the confronting areas of the fixed electrode 122 and the movable electrode 124. Since a plurality of actuators 34 are assigned to a single movable electrode 124, the distance between the fixed electrode 122 and the movable electrode 124 can accurately be controlled.

Even if there is a defective actuator, the characteristics of the variable capacitor 120, i.e., the changing characteristics of the electrostatic capacitance with respect to the level of a control signal supplied to the variable capacitor 120, remain almost unchanged. Therefore, the yield of variable capacitors 120 of stable characteristics is increased.

Figure 46:
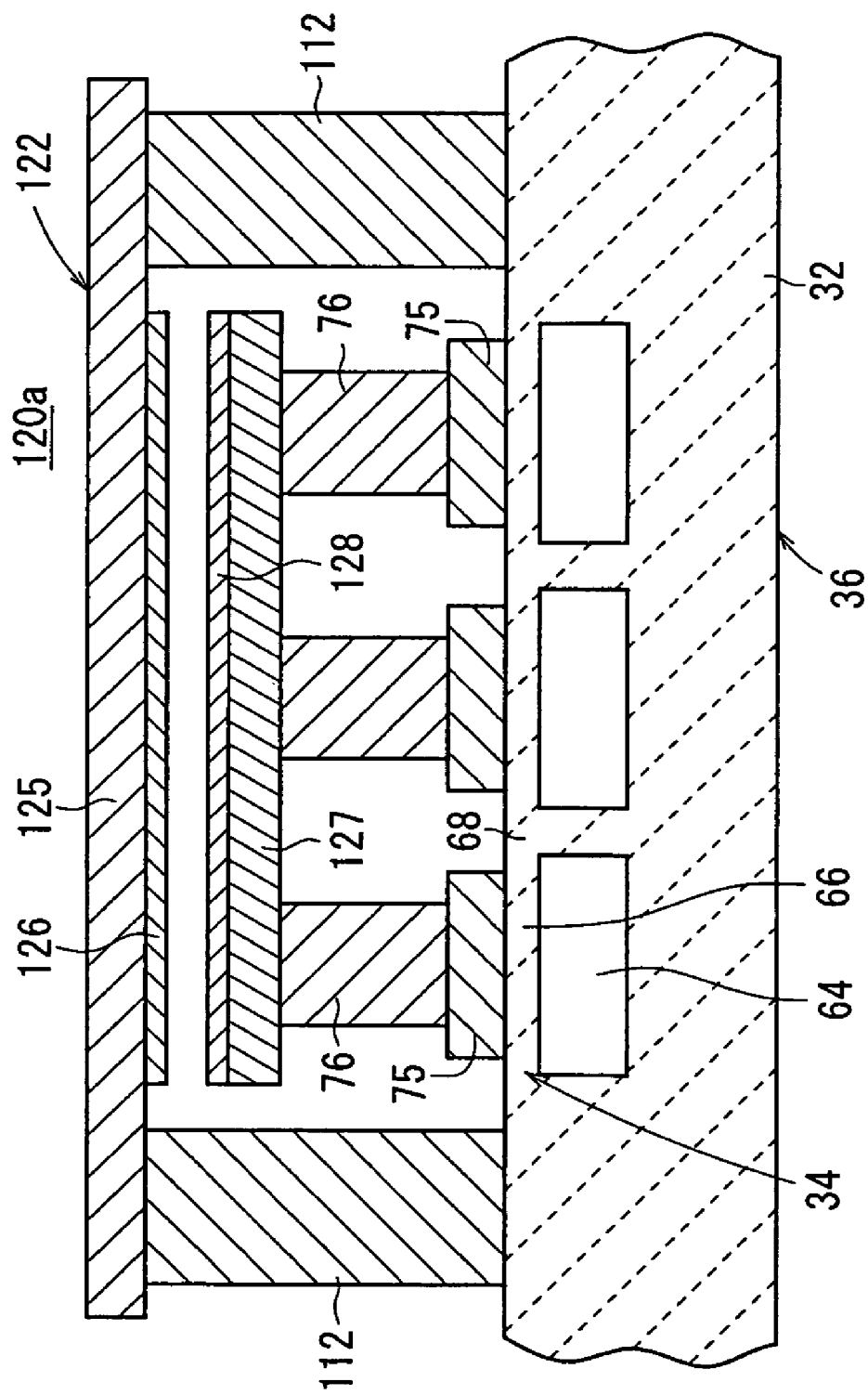
FIG. 46 is a view showing a modification of the variable capacitor according to the specific example.

In the above example, each of the fixed electrode 122 and the movable electrode 124 comprises a metal plate. FIG. 46 shows a variable capacitor 120a according to a modification in which a fixed electrode 122 comprises a plate member 125 made of a desired material such as glass, ceramics, resin film, or the like and an electrically conductive film 126 formed on the plate member 125, and a movable electrode 124 comprises a plate member 127 made of a desired material such as glass, ceramics, resin film, or the like and an electrically conductive film 128 formed on the plate member 127.

An interference optical modulator 130 according to a specific example shown in FIG. 47 has a drive section 36 including a plurality of actuators 34 arranged in a plane on an actuator substrate 32, a single transparent plate 132 facing the drive section 36, and a single mirror member 134 which is disposed between the actuator substrate 32 and the transparent plate 132 and to which drive forces from the actuators 34 of the drive section 36 are transmitted through displacement transmitters 76. The transparent plate 132 is fixed to the actuator substrate 32 by spacers 112 that are interposed between the transparent plate 132 and the actuator substrate 32.

With the interference optical modulator 130, when input light Li is applied through the transparent plate 132 to the mirror member 134, light (first reflected light L1) reflected by the boundary between the reverse side of the transparent plate 132 (which faces the mirror member 134) and light (second reflected light L2) reflected by the surface of the mirror member 134 are emitted as output light Lo. The first reflected light L1 and the second reflected light L2 interfere with each other, and the spectral distribution of the output light Lo is determined by the distance db between the transparent plate 132 and the mirror member 134. Therefore, when the actuators 34 operate to bring the mirror member 134 toward and away from the transparent plate 132, the distance db between the transparent plate 132 and the mirror member 134 is changed to control the spectral distribution of the output light Lo as desired. The interference optical modulator 130 can be used as a color display device, a color filter, a light switch, or the like. Particularly, inasmuch as a joint plate is used in the interference section (the mirror member 134), the surface to which light is applied may be made flat, and the interference section may be provided in a wide area. Even if some of the actuators are defective, they have substantially no effect on the displacement of the interference section. In the above example, the upper surface of the interference section is flat. However, the upper surface of the interference section may be slanted or may have surface irregularities as required.

Figure 48A:
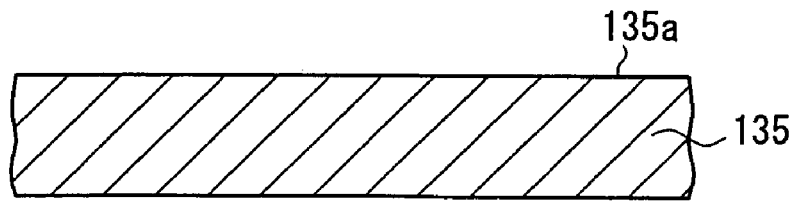
FIGS. 48A through 48C are cross-sectional views showing, with parts omitted from illustration, structural examples of mirror members.
Figure 48B:
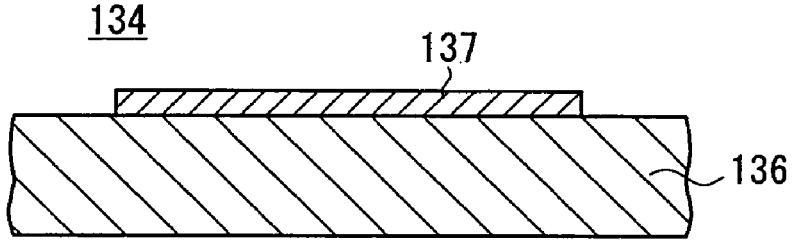
Figure 48C:
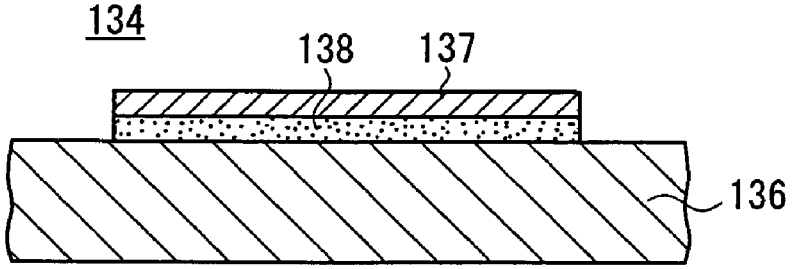

As shown in FIG. 48A, a mirror member 134 may comprise a metal plate 135 having a mirror surface 135a which faces the transparent plate 132 (see FIG. 47). As shown in FIG. 48B, a mirror member 134 may comprise a plate member 136 and a light reflecting film 137 directly formed on a portion of the surface of the plate member 136 which faces the transparent plate 132. Alternatively, as shown in FIG. 48C, a mirror member 134 may comprise a plate member 136, and a light reflecting film 137 formed on a portion of the surface of the plate member 136 which faces the transparent plate 132, with a base layer 138 interposed between the plate member 136 and the light reflecting film 137. In the examples shown in FIGS. 48B and 48C, the surface of the plate member 136 should preferably be a light absorbing surface to prevent unwanted scattered light from being produced.

Each of the actuator devices 10A through 10D according to the first through fourth embodiments employs the substrate 12. However, a structure free of the substrate 12 may also be employed.

An actuator device 10E according to a fifth embodiment which is free of the substrate 12 will be described below with reference to FIG. 49.

Figure 49:
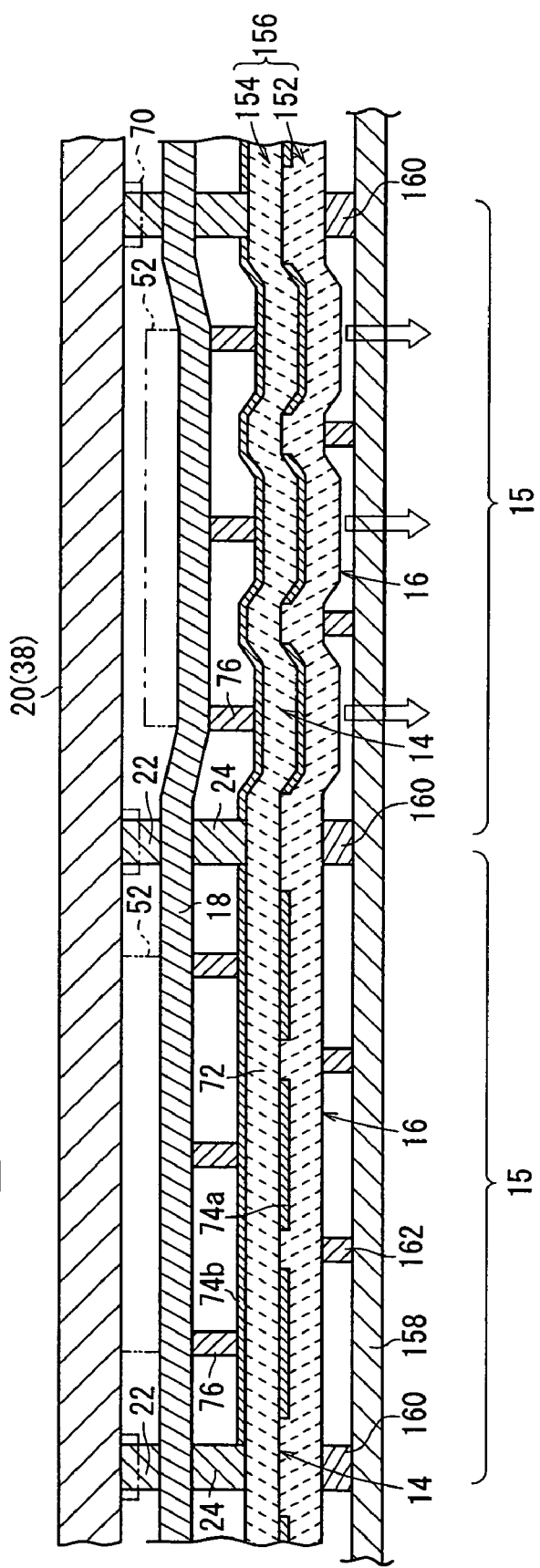
FIG. 49 is a view showing an actuator device according to a fifth embodiment.

As shown in FIG. 49, the actuator device 10E according to the fifth embodiment employs a laminated assembly 156 of a vibrating plate layer 152 and a piezoelectric function layer 154, instead of the substrate 12.

The piezoelectric function layer 154 has a plurality of lower electrodes 74a formed on the vibrating plate layer 152, a piezoelectric/electrostrictive layer 72 formed on the entire surface of the vibrating plate layer 152 including the lower electrodes 74a, and a plurality of upper electrodes 74b formed on the piezoelectric/electrostrictive layer 72. The vibrating plate layer 152 amplifies the displacement amount of the piezoelectric/electrostrictive layer 72. The laminated assembly 156 has a structure including an array of actuators 14, and serves as a drive section 16. The vibrating plate layer 152 may be made of the same material as or may be made of a different material from the piezoelectric/electrostrictive layer 72 of the piezoelectric function layer 154. The laminated assembly 156 may be produced by laminating ceramic green sheets, and the upper electrodes 74b and the lower electrodes 74a may easily be formed by a screen printing process or the like.

The actuator device 10E according to the fifth embodiment has the drive section 16, a single first plate member 18 to which drive forces from the actuators 14 of the drive section 16 are transmitted, and a single second plate member 20 confronting the first plate member 18.

A plurality of spacers 22 are disposed between the first plate member 18 and the second plate member 20, forming m cells 15, for example. A plurality of spacers 24 are also disposed between the first plate member 18 and the laminated assembly 156 forming the m cells 15. N actuators 14 are assigned to each of the cells 15. Displacement transmitters 76 for transmitting drive forces from the actuators 14 to the first plate member 18 are formed on the respective actuators 14.

The upper electrodes 74b of the laminated assembly 156 have electrode patterns divided in the respective cells 15 or electrode patterns divided in respective rows, and the lower electrodes 74a have electrode patterns divided in the respective actuators 14. The electrodes 74a, 74d may be vertically switched around.

The laminated assembly 156 is disposed on a fixed plate 158 by a plurality of spacers 160, 162. The spacers 160, 162 on the fixed plate 158 include, for example, a plurality of first spacers 160 positionally aligned with the spacers 24 disposed between the first plate member 18 and the laminated assembly 156, and a plurality of second spacers 162 disposed in the cells 15 in regions except for the actuators 14.

With the actuator device 10E according to the fifth embodiment, since portions (which are not positionally aligned with the actuators 14) of the vibrating plate layer 152 are fixed by the first and second spacers 160, 162 disposed on the fixed plate 158, spaces surrounded by the fixed plate 158, the first and second spacers 160, 162, and the vibrating plate layer 152 have the same functions as the cavities 64 in the actuator substrate 32 shown in FIG. 35, making it easy to determine the direction in which the actuators 14 are displaced.

As the laminated assembly 156 is supported on the fixed plate 158 by the first and second spacers 160, 162, crosstalk (the effect of displacement) between the actuators 14 and the cells 15 can be reduced. In addition, the response of switching (the displacement of the first plate member 18) is also increased. The fixed plate 158 is effective to increase the mechanical strength of the actuator device 10E itself, which can easily be handled while being delivered or manufactured.

A plurality of piezoelectric function layers 154 may be laminated to increase the amount of displacement and generated forces of the actuators 14. Any arbitrary displacement modes can be achieved by changing the installed positions of the spacers 22, 24, 160, and 162. Desired displacements can be obtained by changing the electrode patterns of the upper electrodes 74b and the lower electrodes 74a.

If the actuator device 10E according to the fifth embodiment is to be applied to a display device, then the second plate member 20 is used as the optical waveguide plate 38, light shield layers 70 (indicated by the two-dot-and-dash lines) are disposed between the second plate member 20 and the spacers 22, and picture element assemblies 52 (indicated by the two-dot-and-dash lines) are disposed on the first plate member 18.

Figure 50:
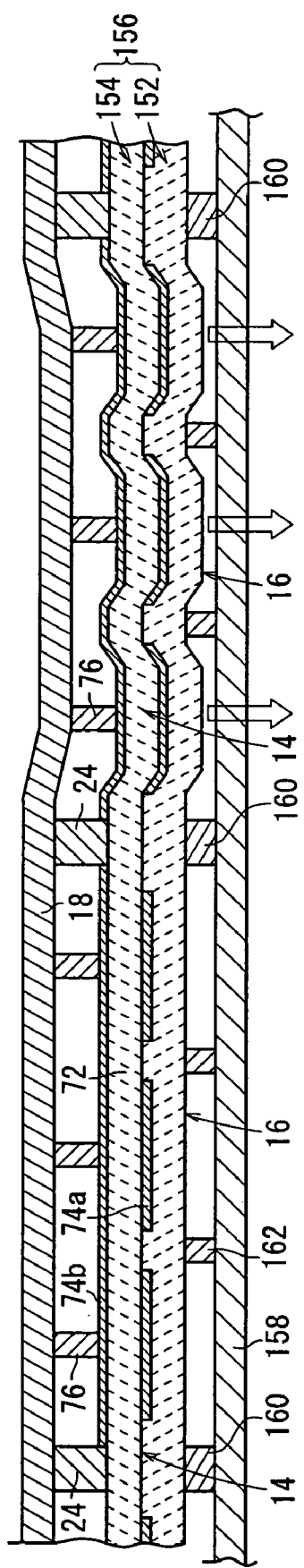
FIG. 50 is a view showing a first modification of the actuator device according to the fifth embodiment.
Figure 51:
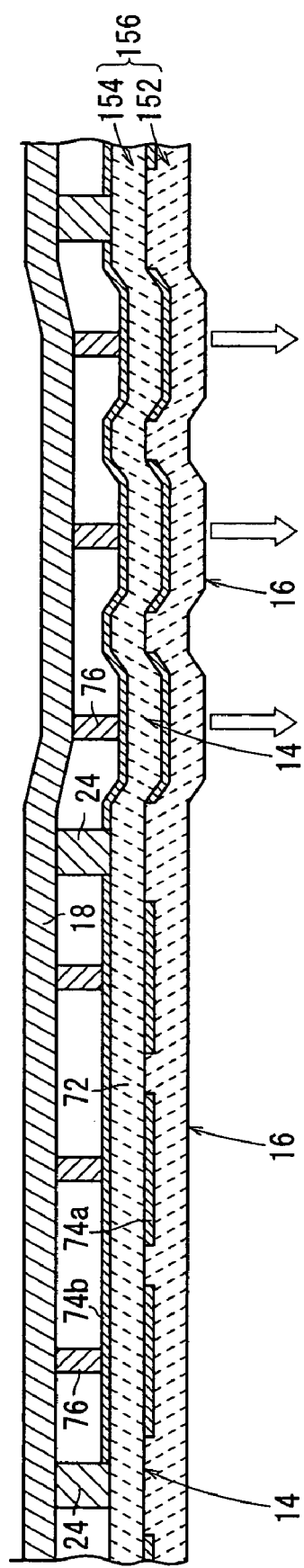
FIG. 51 is a view showing a second modification of the actuator device according to the fifth embodiment.

FIG. 50 shows an actuator device 10Ea according to a first modification of the actuator device 10E according to the fifth embodiment. The actuator device 10Ea according to the first modification is free of the second plate member 20. FIG. 51 shows an actuator device 10Eb according to a second modification which is free of the second plate member 20 and the fixed plate 158. Even in the absence of the fixed plate 158, since the lower electrodes 74a have electrode patterns divided in the respective actuators 14, those regions which are free of the lower electrodes 74a are not flexurally displaced and are joined to the regions where the spacers 24 are present. Therefore, the actuators 14 are flexurally displaced while the regions which are free of the lower electrodes 74a are joined to the regions where the spacers 24 are present at the same height.

The actuator device (including the various modifications) according to the fifth embodiment which has the piezoelectric function layer can more flexibly and easily be changed in design than the structure having the substrate 12 because the magnitude of the flexural displacement and the pattern of the displacement can be changed as desired by the electrode patterns of the upper and lower electrodes. The occurrence of defective actuators is also reduced. These advantages are produced because the piezoelectric function layer is uniformly formed of a ceramic green sheet.

The actuator device according to the present invention is not limited to the above embodiments, but may incorporate various structures without departing from the essential features of the present invention.

What is claimed is:

1. An actuator device comprising:
   a plurality of actuators arranged in a plane; and
   a plate member to which drive forces from said actuators are transmitted and to which said actuators are connected,
   wherein each of said actuators has a vibrating section and a fixed section and said actuators jointly move in a same direction.

2. An actuator device according to claim 1, wherein the rigidity of said plate member is greater than the rigidity of said vibrating section.

3. An actuator device according to claim 2, wherein said plate member has concavities and convexities.

4. An actuator device according to claim 3, wherein said actuators and said plate member are connected to each other by displacement transmitters, and said actuators have portions connected to the displacement transmitter and having a width smaller than a width of said vibrating section.

5. An actuator device according to claim 3, wherein said actuators and said plate member are connected to each other by displacement transmitters, and said plate member has portions connected to the displacement transmitter and having a width smaller than a width of said vibrating section.

6. An actuator device according to claim 1, wherein said vibrating sections are of a shape which is convex toward said plate member or concave toward said plate member.

7. An actuator device according to claim 6, wherein said vibrating sections are of an arch shape or a wavy shape.

8. An actuator device according to claim 1, further comprising:
   a second plate member;

said second plate member having a plate surface facing a plate surface of said plate member.

9. An actuator device according to claim 8, wherein said second plate member comprises an optical waveguide plate into which light from a light source is introduced, and picture element assemblies are disposed on a surface of said plate member which faces said optical waveguide plate, wherein said actuator device serves as a display device for controlling light leaking from said optical waveguide plate with said picture element assemblies brought into and out of contact with said optical waveguide plate.

10. An actuator device according to claim 8, wherein said second plate member serves as a fixed electrode of a variable capacitor or the fixed electrode of said variable capacitor is disposed on said second plate member, and said plate member serves as a movable electrode of said variable capacitor or the movable electrode of said variable capacitor is disposed on said plate member.

11. An actuator device according to claim 8, wherein said second plate member comprises a transparent plate, and said plate member has a light reflecting surface in a region facing said second plate member.

12. An actuator device comprising:
a plurality of cells arranged in a plane;
each of said cells having a plurality of actuators arranged in a plane and a plate member to which drive forces from said actuators are transmitted;
each of said actuators having a vibrating section and a fixed section.

13. An actuator device according to claim 12, wherein the plate members of said cells are connected to each other.

14. An actuator device according to claim 12, wherein the plate members are connected to each other by joints, the rigidity of all of or part of said joints being smaller than the rigidity of said plate member.

15. An actuator device according to claim 14, further comprising:
gap forming members for forming gaps between said fixed sections and said plate members in said actuators;
said joints interconnecting said plate members and said fixed sections being joined to each other by said gap forming members.

16. An actuator device according to claim 12, further comprising:
a second plate member;
said second plate member having a plate surface facing a plate surface of said plate member.

17. An actuator device according to claim 16, wherein said second plate member comprises an optical waveguide plate into which light from a light source is introduced, and picture element assemblies are disposed on a surface of said plate member which faces said optical waveguide plate, wherein said actuator device serves as a display device for controlling light leaking from said optical waveguide plate with said picture element assemblies brought into and out of contact with said optical waveguide plate.

18. An actuator device according to claim 16, wherein said second plate member serves as a fixed electrode of a variable capacitor or the fixed electrode of said variable capacitor is disposed on said second plate member, and said plate member serves as a movable electrode of said variable capacitor or the movable electrode of said variable capacitor is disposed on said plate member.

19. An actuator device according to claim 16, wherein said second plate member comprises a transparent plate, and said plate member has a light reflecting surface in a region facing said second plate member.

* * * * *